United States Patent
Kim et al.

(10) Patent No.: US 11,805,678 B2
(45) Date of Patent: Oct. 31, 2023

(54) DISPLAY DEVICE, MASK ASSEMBLY, METHOD OF MANUFACTURING THE MASK ASSEMBLY, APPARATUS FOR MANUFACTURING THE DISPLAY DEVICE, AND METHOD OF MANUFACTURING THE DISPLAY DEVICE

(71) Applicant: Samsung Display Co., Ltd., Yongin-si (KR)

(72) Inventors: Seil Kim, Yongin-si (KR); Daewon Baek, Yongin-si (KR); Sangmin Yi, Yongin-si (KR); Jungwoo Ko, Yongin-si (KR); Hongkyun Ahn, Yongin-si (KR); Jongdae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 17/074,427

(22) Filed: Oct. 19, 2020

(65) Prior Publication Data

US 2021/0159281 A1    May 27, 2021

(30) Foreign Application Priority Data

Nov. 21, 2019  (KR) .......................... 10-2019-0150484
Apr. 29, 2020  (KR) .......................... 10-2020-0052893
Aug. 14, 2020  (KR) .......................... 10-2020-0102708

(51) Int. Cl.
*H01L 27/32* (2006.01)
*C23C 14/04* (2006.01)
(Continued)

(52) U.S. Cl.
CPC ......... *H10K 59/121* (2023.02); *C23C 14/042* (2013.01); *H10K 50/11* (2023.02);
(Continued)

(58) Field of Classification Search
CPC .......... H01L 51/5012; H01L 2251/558; H01L 51/00–56; H01L 2251/00–568;
(Continued)

(56) References Cited

U.S. PATENT DOCUMENTS 8,404,125 B2   3/2013   Matsudate et al.
9,806,257 B2   10/2017  Takeda et al.
(Continued)

FOREIGN PATENT DOCUMENTS

CN    109207920 A    1/2019
CN    109801950 A    5/2019
(Continued)

OTHER PUBLICATIONS

Machine translation, Ukigaya, Japanese Pat. Pub. No. 2007200735A, translation date: Mar. 19, 2023, Espacenet, all pages. (Year: 2023).*

(Continued)

*Primary Examiner* — Victoria K. Hall
(74) *Attorney, Agent, or Firm* — Lewis Roca Rothgerber Christie LLP

(57) ABSTRACT

A display device includes: a substrate comprising a first display area and a second display area, the first display area comprising a transparent area and the second display area being arranged to surround at least a portion of the first display area; a first pixel in the first display area and comprising a first pixel electrode, a first intermediate layer, and a first opposite electrode; and a second pixel in the second display area and comprising a second pixel electrode, a second intermediate layer, and a second opposite electrode, wherein each of the first intermediate layer and the second intermediate layer comprises a first section having a portion where a thickness thereof is constant and a second section where the thickness thereof is variable.

13 Claims, 51 Drawing Sheets

(51) Int. Cl.
  *H01L 51/56* (2006.01)
  *H01L 51/50* (2006.01)
  *H10K 59/121* (2023.01)
  *H10K 50/11* (2023.01)
  *H10K 71/00* (2023.01)
  *H10K 71/16* (2023.01)
  *H10K 59/35* (2023.01)
  *H10K 102/00* (2023.01)

(52) U.S. Cl.
  CPC .......... *H10K 71/00* (2023.02); *H10K 71/166* (2023.02); *H10K 59/352* (2023.02); *H10K 59/353* (2023.02); *H10K 2102/351* (2023.02)

(58) Field of Classification Search
  CPC ....... H01L 27/32–3293; H01L 27/3216; H01L 27/3218; H10K 50/11; H10K 2102/351
  See application file for complete search history.

(56) References Cited

U.S. PATENT DOCUMENTS

| | | | | |
|---|---|---|---|---|
| 10,014,471 | B2* | 7/2018 | Baek | .................. H10K 71/166 |
| 10,428,415 | B2 | 10/2019 | Park et al. | |
| 10,686,018 | B2* | 6/2020 | Kim | ...................... H10K 59/131 |
| 2004/0115339 | A1* | 6/2004 | Ito | ........................ H10K 71/135 |
| | | | | 427/66 |
| 2004/0207577 | A1* | 10/2004 | Ito | ........................ G09G 3/3225 |
| | | | | 345/76 |
| 2008/0019166 | A1 | 1/2008 | Jung et al. | |
| 2012/0012834 | A1* | 1/2012 | Sonoda | ................ H10K 59/173 |
| | | | | 257/40 |
| 2015/0037928 | A1 | 2/2015 | Hirobe et al. | |
| 2017/0148990 | A1 | 5/2017 | Ha | |
| 2017/0179390 | A1 | 6/2017 | Baek | |
| 2018/0254303 | A1* | 9/2018 | Mishima | .............. H10K 50/852 |
| 2019/0189941 | A1 | 6/2019 | Kim et al. | |
| 2019/0345597 | A1 | 11/2019 | Uchida et al. | |
| 2019/0371874 | A1* | 12/2019 | Lee | ....................... H10K 59/352 |
| 2020/0013836 | A1 | 1/2020 | Li | |
| 2020/0016696 | A1 | 1/2020 | Ostholt et al. | |
| 2020/0119106 | A1* | 4/2020 | Kim | ..................... H01L 27/3218 |
| 2020/0227488 | A1* | 7/2020 | Xin | ...................... H01L 27/3216 |
| 2020/0243617 | A1* | 7/2020 | Saito | ...................... H10K 71/00 |
| 2020/0251539 | A1 | 8/2020 | Fu | |
| 2020/0291510 | A1 | 9/2020 | Okamoto | |
| 2020/0312832 | A1 | 10/2020 | Chi et al. | |
| 2022/0029125 | A1* | 1/2022 | Liu | ....................... H01L 27/326 |

FOREIGN PATENT DOCUMENTS

| | | | | |
|---|---|---|---|---|
| CN | 109962092 A | 7/2019 | | |
| CN | 110391254 A | 10/2019 | | |
| EP | 3506382 A1 | 7/2019 | | |
| EP | 3524710 A1 | 8/2019 | | |
| JP | 2007200735 A | * 8/2007 | ............. | C23C 14/24 |
| JP | 5780350 B2 | 9/2015 | | |
| KR | 10-2007-0120266 A | 12/2007 | | |
| KR | 10-1191557 B1 | 10/2012 | | |
| KR | 10-1674499 B1 | 11/2016 | | |
| KR | 10-1900281 B1 | 9/2018 | | |
| KR | 10-2019-0027690 A | 3/2019 | | |
| KR | 10-1984112 B1 | 5/2019 | | |
| KR | 10-2020-0006351 A | 1/2020 | | |
| WO | 2018/196091 A1 | 11/2018 | | |
| WO | 2019/087749 A1 | 5/2019 | | |

OTHER PUBLICATIONS

EPO Partial European Search Report dated Apr. 16, 2021, issued in corresponding European Patent Application No. 20208519.7 (16 pages).

* cited by examiner

DISPLAY DEVICE, MASK ASSEMBLY, METHOD OF MANUFACTURING THE MASK ASSEMBLY, APPARATUS FOR MANUFACTURING THE DISPLAY DEVICE, AND METHOD OF MANUFACTURING THE DISPLAY DEVICE

CROSS-REFERENCE TO RELATED APPLICATIONS

The present application claims priority to and the benefit of Korean Patent Application Nos. 10-2019-0150484, filed on Nov. 21, 2019, 10-2020-0052893, filed on Apr. 29, 2020, and 10-2020-0102708, filed on Aug. 14, 2020, in the Korean Intellectual Property Office, the disclosure of each of which is incorporated by reference herein in its entirety.

BACKGROUND

1. Field

Aspects of one or more example embodiments relate to a display device, a mask assembly, a method of manufacturing the mask assembly, an apparatus for manufacturing the display device, and a method of manufacturing the display device.

2. Description of Related Art

Mobile electronic devices are widely used. Recently, tablet personal computers (PCs), in addition to small-sized electronic devices such as mobile phones, have been widely used as mobile electronic devices.

In order to support various functions, such mobile electronic devices generally include a display device for providing a user with visual information such as images or videos. Recently, as components for driving such display devices have been miniaturized, the area occupied by display devices in electronic devices has gradually increased. Moreover, a structure that may be curved to have a preset angle with respect to a plane has been developed.

Such a display device includes pixels, with various portions having different resolutions. The performance of the display device may depend on the type of a mask assembly used to deposit organic materials on these pixels.

The above information disclosed in this Background section is only for enhancement of understanding of the background and therefore the information discussed in this Background section does not necessarily constitute prior art.

SUMMARY

In general, in order to manufacture a display device including display areas having different resolutions, a mask assembly corresponding to each display area may be separately manufactured and used. When the mask assembly is manufactured separately as described above, the manufacturing cost may be relatively higher and the precise alignment between each mask assembly and the substrate may be difficult, and thus, it may be difficult to manufacture a display device of a desired quality. Aspects of one or more example embodiments include a display device having a precise pixel pattern, a mask assembly having a precise pattern to manufacture a display device by using one mask assembly, a method of manufacturing the mask assembly, an apparatus for manufacturing the display device, and a method of manufacturing the display device.

Additional aspects and characteristics will be set forth in part in the description which follows and, in part, will be more apparent from the description, or may be learned by practice of the presented example embodiments of the disclosure.

According to one or more example embodiments, a display device includes a substrate including a first display area and a second display area, the first display area including a transparent area and the second display area being arranged to surround at least a portion of the first display area, a first pixel arranged in the first display area and including a first pixel electrode, a first intermediate layer, and a first opposite electrode, and a second pixel arranged in the second display area and including a second pixel electrode, a second intermediate layer, and a second opposite electrode, wherein each of the first intermediate layer and the second intermediate layer includes a section having a portion where a thickness is constant and a section where a thickness is variable, and a first length of a section where a thickness of the first intermediate layer is variable or a section where a thickness of the second intermediate layer is variable is different from a second length of the section where the thickness of the first intermediate layer is variable or the section where the thickness of the second intermediate layer is variable.

According to some example embodiments, one of the first length or the second length may be less than the other one of the first length or the second length.

According to some example embodiments, a resolution of an image provided by the first display area may be different from a resolution of an image provided by the second display area.

According to some example embodiments, the display device may further include a component arranged on one surface of the substrate to correspond to the first display area and including an electronic element that emits or receives light.

According to some example embodiments, a light transmittance of the first display area may be different from a light transmittance of the second display area.

According to some example embodiments, a size of a plane shape of the first intermediate layer may be greater than or equal to a size of a plane shape of the second intermediate layer.

According to one or more example embodiments, a mask assembly includes a mask sheet, wherein the mask sheet includes a first area including at least one first pattern hole, a second area including at least one second pattern hole, and a protruding portion arranged on an inner surface of the first pattern hole or the second pattern hole and protruding into one of the first pattern hole or the second pattern hole, wherein an inner surface of the first pattern hole is different from an inner surface of the second pattern hole.

According to some example embodiments, the protruding portion may include a first protruding portion protruding into the first pattern hole from an inner surface of the first pattern hole.

According to some example embodiments, a thickness of the first area and a thickness of the second area may equal to or different from each other.

According to some example embodiments, a plane size of the second pattern hole formed on one surface of the second area may be greater than or equal to a plane size of the first pattern hole formed on one surface of the first area extending from the one surface of the second area.

According to some example embodiments, a plurality of reference holes are formed in the mask sheet at an edge of the second area.

According to some example embodiments, shapes of the first pattern hole and the second pattern hole on a plane parallel to one surface of the mask sheet may be different from each other.

According to one or more example embodiments, a method of manufacturing a mask assembly includes arranging a first photoresist to have a first opening on a first surface of a base material, arranging a second photoresist to have a second opening and a third opening on a second surface of the base material, etching a portion of the first surface of the base material by spraying an etching solution into the first opening, and forming a first pattern hole and a second pattern hole penetrating through the base material by etching a portion of the second surface of the base material by spraying an etching solution into the first opening portion and the second opening portion.

According to some example embodiments, a width of the second opening may be greater than a width of the first opening.

According to some example embodiments, a protruding portion protruding from an inner surface of the second pattern hole inside the second pattern hole may be arranged inside the first pattern hole.

According to some example embodiments, a distance from the first surface to the protruding portion may be different from a distance from the second surface to the protruding portion.

According to some example embodiments, the method may further include removing the first photoresist.

According to some example embodiments, the method may further include removing the second photoresist.

According to one or more example embodiments, a method of manufacturing a mask assembly includes arranging a first photoresist having a first opening located in a first area of a base material on a first surface of the base material, arranging a second photoresist having a second opening corresponding to the first opening on a second surface of the base material, etching a portion of the first surface of the base material by spraying an etching solution into the first opening, forming a first pattern hole penetrating through the base material by spraying an etching solution into the second opening, and forming a second pattern hole penetrating through the base material by irradiating a laser beam to a second area adjacent to the first area in the second surface of the base material.

According to some example embodiments, shapes of the first pattern hole and the second pattern hole on a plane parallel to the first surface or the second surface may be different from each other.

According to some example embodiments, an area of the first pattern hole and an area of the second pattern hole on a plane parallel to the first surface or the second surface may be different from each other.

According to some example embodiments, the number of first pattern holes and the number of second pattern holes may be different from each other per equal area.

According to some example embodiments, the method may further include removing the first photoresist.

According to some example embodiments, the method may further include removing the second photoresist.

According to some example embodiments, the forming of the second pattern hole may include forming the second pattern hole such that a width of the second pattern hole in a direction perpendicular to a thickness direction of the base material is gradually increased from the first surface to the second surface.

According to some example embodiments, the second photoresist may further include a third opening formed to correspond to the entire second area, wherein the method further includes etching a portion of the second surface of the base material by spraying an etching solution into the third opening.

According to some example embodiments, the method may further include forming a second pattern hole penetrating through the base material by irradiating a laser beam onto an etched surface formed to correspond to the third opening in the second surface of the base material.

According to some example embodiments, the second photoresist may be located in the second area and may further include a plurality of fourth openings spaced apart from each other, and the method further includes etching a portion of the second surface of the base material by spraying an etching solution into the fourth openings.

According to some example embodiments, the forming of the second pattern hole may include forming the second pattern hole that penetrates through the base material by irradiating a laser beam onto an etched surface formed to correspond to the at least one fourth opening on the second surface of the base material.

According to some example embodiments, the second photoresist may further include a plurality of fifth openings located at edges of the second area, and the method further includes forming at least two reference holes by etching a portion of the second surface of the base material by spraying an etching solution into the fifth openings.

According to some example embodiments, the method may further include, before irradiating the laser beam, aligning the base material by using the reference holes.

According to one or more example embodiments, an apparatus for manufacturing a display device includes a chamber, a mask assembly arranged inside the chamber, and a deposition source for supplying a deposition material to a display substrate arranged opposite the mask assembly, wherein the mask assembly includes a mask sheet through which a deposition material supplied from the deposition source passes, wherein the mask sheet includes a first area including at least one first pattern hole, a second area including at least one second pattern hole, and a protruding portion arranged on an inner surface of one of the first pattern hole or the second pattern hole and protruding into one of the first pattern hole or the second pattern hole, and an inner surface of the first pattern hole and an inner surface of the second pattern hole are different from each other.

According to some example embodiments, the protruding portion may include a first protruding portion protruding into the first pattern hole from an inner surface of the first pattern hole.

According to some example embodiments, a thickness of the first area and a thickness of the second area may be equal to or different from each other.

According to some example embodiments, a plane size of the second pattern hole formed on one surface of the second area may be greater than or equal to a plane size of the first pattern hole formed on one surface of the first area extending from the one surface of the second area.

According to some example embodiments, the method may further include a plurality of reference holes located at an edge of the first area or an edge of the second area.

According to some example embodiments, a thickness in an area around the second pattern hole of thicknesses in the second area of the mask sheet may be less than a thickness in the first area, and a thickness in an area between the second pattern holes adjacent to each other may be equal to a thickness in the first area.

According to some example embodiments, a width of the second pattern hole along a direction perpendicular to a thickness direction of the mask sheet may be formed to gradually increase from one surface of the mask sheet to another surface.

According to some example embodiments, shapes of the first pattern hole and the second pattern hole on a plane parallel to one surface of the mask sheet may be different from each other.

According to some example embodiments, areas of the first pattern hole and the second pattern hole on a plane parallel to one surface of the mask sheet may be different from each other.

According to some example embodiments, the number of the first pattern holes and the number of the second pattern holes may be different from each other per equal area.

According to some example embodiments, in the mask sheet, a plurality of reference holes are formed at an edge of the second area.

According to one or more example embodiments, a method of manufacturing a display device includes arranging and aligning a display substrate and a mask assembly inside a chamber, and supplying a deposition material by passing the mask assembly through from a deposition source to the display substrate, wherein the mask assembly includes a mask sheet through which a deposition material supplied from the deposition source passes, wherein the mask sheet includes a first area including at least one first pattern hole, a second area including at least one second pattern hole, and a protruding portion arranged on an inner surface of the first pattern hole or the second pattern hole and protruding into one of the first pattern hole or the second pattern hole, wherein an inner surface of the first pattern hole is different from an inner surface of the second pattern hole.

According to some example embodiments, the protruding portion may include a first protruding portion protruding into the first pattern hole from an inner surface of the first pattern hole.

According to some example embodiments, a thickness of the first area and a thickness of the second area may be equal to or different from each other.

According to some example embodiments, a plane size of the second pattern hole formed on one surface of the second area may be greater than or equal to a plane size of an inlet portion of the first pattern hole formed on one surface of the first area extending from the one surface of the second area.

According to some example embodiments, in the mask sheet, a plurality of reference holes are formed at an edge of the second area.

According to one or more example embodiments, a method of manufacturing a display device includes forming a first intermediate layer on a first display area of a display substrate, and forming a second intermediate layer on a second display area of the display substrate, wherein each of the first intermediate layer and the second intermediate layer includes a section having a portion where a thickness thereof is constant and a section where the thickness thereof is variable, and a first length of a section where the thickness of the first intermediate layer is variable or a section where a thickness of the second intermediate layer is variable is different from a second length of the section where the thickness of the first intermediate layer is variable or the section where the thickness of the second intermediate layer is variable.

According to some example embodiments, one of the first length or the second length may be less than the other one of the first length or the second length.

According to some example embodiments, a resolution of an image provided by the first display area may be different from a resolution of an image provided by the second display area.

According to some example embodiments, the method may further include placing a component arranged on one surface of the substrate to correspond to the first display area and including an electronic element that emits or receives light.

According to some example embodiments, a light transmittance of the first display area may be different from a light transmittance of the second display area.

According to some example embodiments, a size of a plane shape of the first intermediate layer may be greater than or equal to a size of a plane shape of the second intermediate layer.

According to some example embodiments, a thickness of a section having a constant thickness of the first intermediate layer and a thickness of a section having a constant thickness of the second intermediate layer may be equal to each other.

Other aspects, features, and characteristics than those described above will become more apparent from the following drawings, claims, and detailed description of the disclosure.

This general and specific aspect may be implemented by using a system, method, computer program, or any combination of systems, methods, and computer programs.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
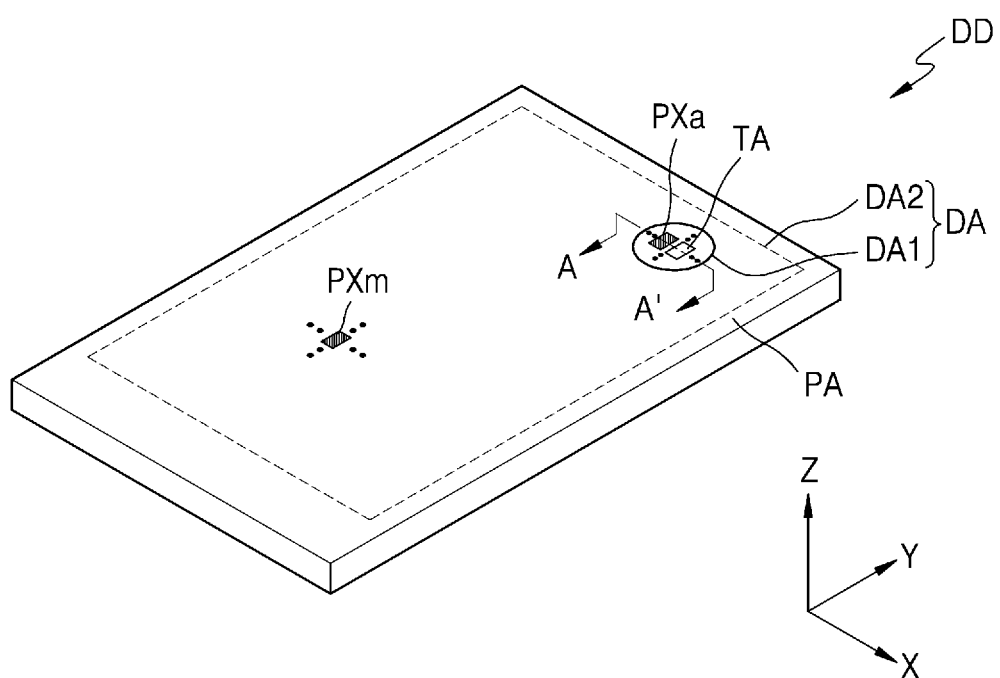
FIG. 1 is a perspective view illustrating a display device, according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As embodiments allow for various changes and numerous embodiments, example embodiments will be illustrated in the drawings and described in more detail in the written description. Effects and features of the present disclosure and methods of achieving the same will be apparent with reference to embodiments and drawings described below in more detail. The present disclosure may, however, be embodied in many different forms and should not be construed as limited to the example embodiments set forth herein.

Hereinafter, the example embodiments of the present disclosure will now be described more fully with reference to the accompanying drawings. Like reference symbols in the drawings denote like elements, and thus, descriptions thereof will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, area, or element, it can be directly or indirectly formed on the other layer, region, or component. That is, for example, intervening layers, regions, or components may be present.

Sizes of components in the drawings may be exaggerated for convenience of explanation. In other words, because sizes and thicknesses of elements in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display device DD, according to some example embodiments.

Referring to FIG. 1, the display device DD includes a display area DA for implementing an image and a peripheral area PA for not implementing an image. The display area DA may include a first display area DA1 and a second display area DA2, which are arranged adjacent to each other and have different resolutions. For example, a resolution of the first display area DA1 may be lower than that of the second display area DA2. According to some example embodiments, a resolution of the first display area DA1 may be lower than that of the second display area DA2. At this time, a resolution of each display area may be arranged in each of the display areas, and may be determined by an interval between the centers of pixels adjacent to each other, a pixel size, the total area of pixels per unit area of each display area, and/or the number of pixels per unit area of each display area. That is, a distance between centers of pixels adjacent to each other of a display area having a lower resolution of the display areas may be greater than that of a display area having a higher resolution, or may have a less number of pixels arranged per unit area (or equal area) than a display area having a higher resolution. Alternatively, the total area of pixels per unit area (or an equal area) of a display area having a lower resolution may be less than the total area of pixels per unit area (or an equal area) of another display area. For convenience of explanation, it will now be described in more detail with a focus on a case where a resolution of the first display area DA1 is lower than a resolution of the second display area DA2.

The light transmittance of the first display area DA1 may be different from the light transmittance of the second display area DA2. For example, the light transmittance of one of the first display area DA1 or the second display area DA2 may be greater than the light transmittance of the other of the first display area DA1 or the second display area DA2. For convenience of explanation, it will now be described in more detail with a focus on a case where the light transmittance of the first display area DA1 is greater than the light transmittance of the second display area DA2.

The first display area DA1 and the second display area DA2 as described above may be arranged in various forms. For example, a portion of the borders of the first display area DA1 may be arranged inside the second display area DA2, and the other portion of the borders of the first display area DA1 may meet the peripheral area PA. According to some example embodiments, the first display area DA1 may be arranged inside the second display area DA2 in such a way that the border of the first display area DA1 is wrapped around by the second display area DA2. For convenience of explanation, a case where the first display area DA1 is inside the second display area DA2 will now be focused on and described in more detail.

The first display area DA1 and/or the second display area DA2 may be an area below which components, such as sensors using infrared rays, visible light, or sound, are arranged, as described later with reference to FIG. 2. For convenience of explanation, it will now be described in more detail with a focus on a case where a component is arranged in the first display area DA1.

A plurality of main pixels PXm are arranged in the second display area DA2 and may emit light, and a main image may be provided through such light. The first display area DA1 may include a transmission area TA through which light and/or sound that are output from the component to the outside or proceeds from the outside toward the component may pass. According to some example embodiments, when infrared light is transmitted through the first display area DA1, the light transmittance may be about 10% or more, for example, about 20% or more, about 25% or more, about 50% or more, about 85% or more, or about 90% or more.

According to some example embodiments, a plurality of auxiliary pixels PXa may be arranged in the first display area DA1, and a certain image may be provided by using light emitted from the plurality of auxiliary pixels PXa. An image provided by the first display area DA1 is an auxiliary image, of which a resolution is lower than a resolution of an image provided by the second display area DA2. That is, because the first display area DA1 has the transmission area TA through which light and/or sound may pass, the number of auxiliary pixels PXa that may be arranged per unit area may be less than the number of main pixels PXm arranged per unit area in the second display area DA2. According to some example embodiments, the total area of auxiliary pixels PXa arranged per unit area of the first display area DA1 may be less than the total area of main pixels PXm arranged per unit area of the second display area DA2. According to some example embodiments, a distance between the centers of auxiliary pixels PXa adjacent to each other in the first display area DA1 may be greater than a distance between the centers of main pixels PXm adjacent to each other in the second display area DA2. In this case, the auxiliary pixels PXa and the main pixels PXm whose resolutions are compared with each other may emit light of the same color.

It will now be described that the display device DD is an organic light-emitting display device according to some example embodiments, but the display device according to embodiments of the present disclosure is not limited thereto. According to some example embodiments, display devices of various types may be used, such as an inorganic light-emitting display and a quantum dot light-emitting display.

FIG. 1 shows that the first display area DA1 is arranged at one side (upper right side) of the second display area DA2 that is rectangular, but embodiments according to the present disclosure are not limited thereto. The second display area DA2 may have a shape of, for example, a circle, an ellipse, or a polygon such as a triangle, a pentagon, or the like, and the position of the first display area DA1 and the number of first display areas DA1 may be modified in various ways.

Figure 2:
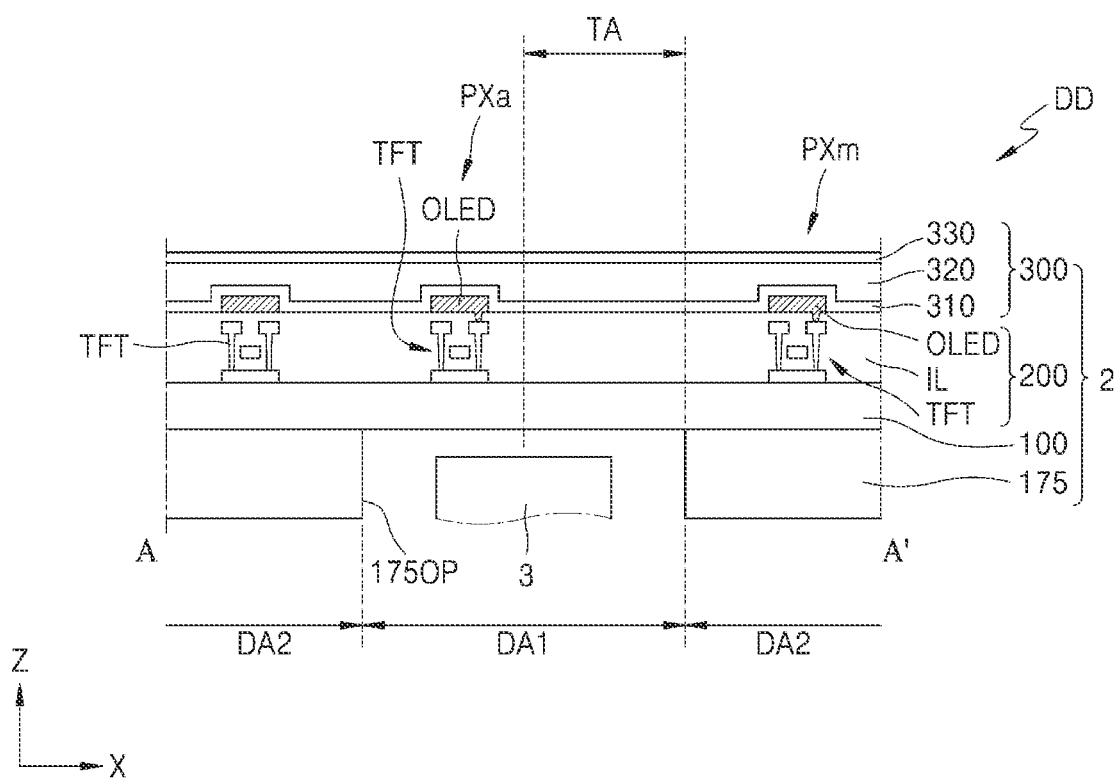
FIG. 2 is a cross-sectional view briefly illustrating a display device, according to some example embodiments.

FIG. 2 is a cross-sectional view briefly illustrating a display device, according to some example embodiments. FIG. 2 may correspond to a cross-section of the display device of FIG. 1 taken along line A-A' in FIG. 1.

Referring to FIG. 2, the display device DD may include a display panel 2 including a display element, and a component 3 arranged below the display panel 2 and corresponding to the first display area DA1.

The display panel 2 may include a substrate 100, a display element layer 200 arranged above the substrate 100, and a thin-film encapsulation layer 300 as a sealing member for sealing the display element layer 200. In addition, the display panel 2 may further include a lower protective film 175 below the substrate 100.

The substrate 100 may include glass or a polymer resin. The polymer resin may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including the layer including a polymer resin described above, and an inorganic layer.

The display element layer 200 may include a circuit layer including a thin-film transistor TFT, an organic light-emitting diode OLED as a display element, and an insulating layer IL therebetween.

A main pixel PXm including the thin-film transistor TFT and an organic light-emitting diode OLED connected thereto is arranged in the second display area DA2, an auxiliary pixel PXa including the thin-film transistor TFT and an organic light-emitting diode OLED connected thereto is arranged in the first display area DA1, and lines electrically connected to the main pixel PXm and the auxiliary pixel PXa may be arranged.

In addition, the transmission area TA in which neither thin-film transistor TFT nor pixels are arranged may be arranged in the first display area DA1. The transmission area TA may be understood as an area through which light/signals emitted from the component 3 or incident to the component 3 is transmitted.

The component 3 may be placed in the first display area DA1. The component 3 may be an electronic element that uses light or sound. For example, the component 3 may be a sensor that receives and uses light, such as an infrared sensor, a sensor that outputs and senses light or sound to measure a distance or recognizes a fingerprint, a small lamp that outputs light, or a speaker that outputs sound. In the case of an electronic element using light, light in various wavelength bands, such as visible light, infrared light, and ultraviolet light, may be used. The number of components 3 arranged in the first display area DA1 may be plural. For example, a light-emitting device and a light-receiving device may be provided together in one first display area DA1 as the component 3. Alternatively, a light-emitting unit and a light-receiving unit may be both provided in one component 3.

The thin-film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 therebetween.

The first and second inorganic encapsulation layers 310 and 330 may include at least one inorganic insulating materials from among aluminum oxide, titanium oxide, tantalum oxide, hafnium oxide, zinc oxide, silicon oxide, silicon nitride, and silicon oxynitride. The organic encapsulation layer 320 may include a polymer-based material. Polymer-based materials may include polyethylene terephthalate, polyethylene naphthalate, polycarbonate, polyimide, polyethylene sulfonate, polyoxymethylene, polyarylate, hexamethyldisiloxane, and acrylic resins (for example, polymethyl methacrylate, polyacrylic acid, or the like), or any combination thereof.

The lower protective film 175 may be attached below the substrate 100 to support and protect the substrate 100. The lower protective film 175 may have an opening 175OP corresponding to the first display area DA1. By providing the opening 175OP in the lower protective film 175, the light transmittance of the first display area DA1 may be improved. The lower protective film 175 may include polyethylene terephthalate (PET) or polyimide (PI).

The area of the first display area DA1 may be greater than the area where the component 3 is arranged. Although FIG. 2 shows that the first display area DA1 is equal in area as the opening 175OP, the area of the opening 175OP provided in the lower protective film 175 may not correspond to the area of the first display area DA1. For example, the area of the opening 175OP may be less than the area of the first display area DA1.

According to some example embodiments, components such as an input sensing member for sensing a touch input, an antireflection member including a polarizer and a retarder or a color filter and a black matrix, and a transparent window may further be arranged above the display panel 2.

Meanwhile, it is illustrated that the thin-film encapsulation layer 300 is used as an encapsulation member for sealing the display element layer 200 in the present embodiment, but embodiments according to the present disclosure are not limited thereto. For example, a sealing substrate that is bonded to the substrate 100 by sealant or frit may be used as a member for sealing the display element layer 200.

Figure 3:
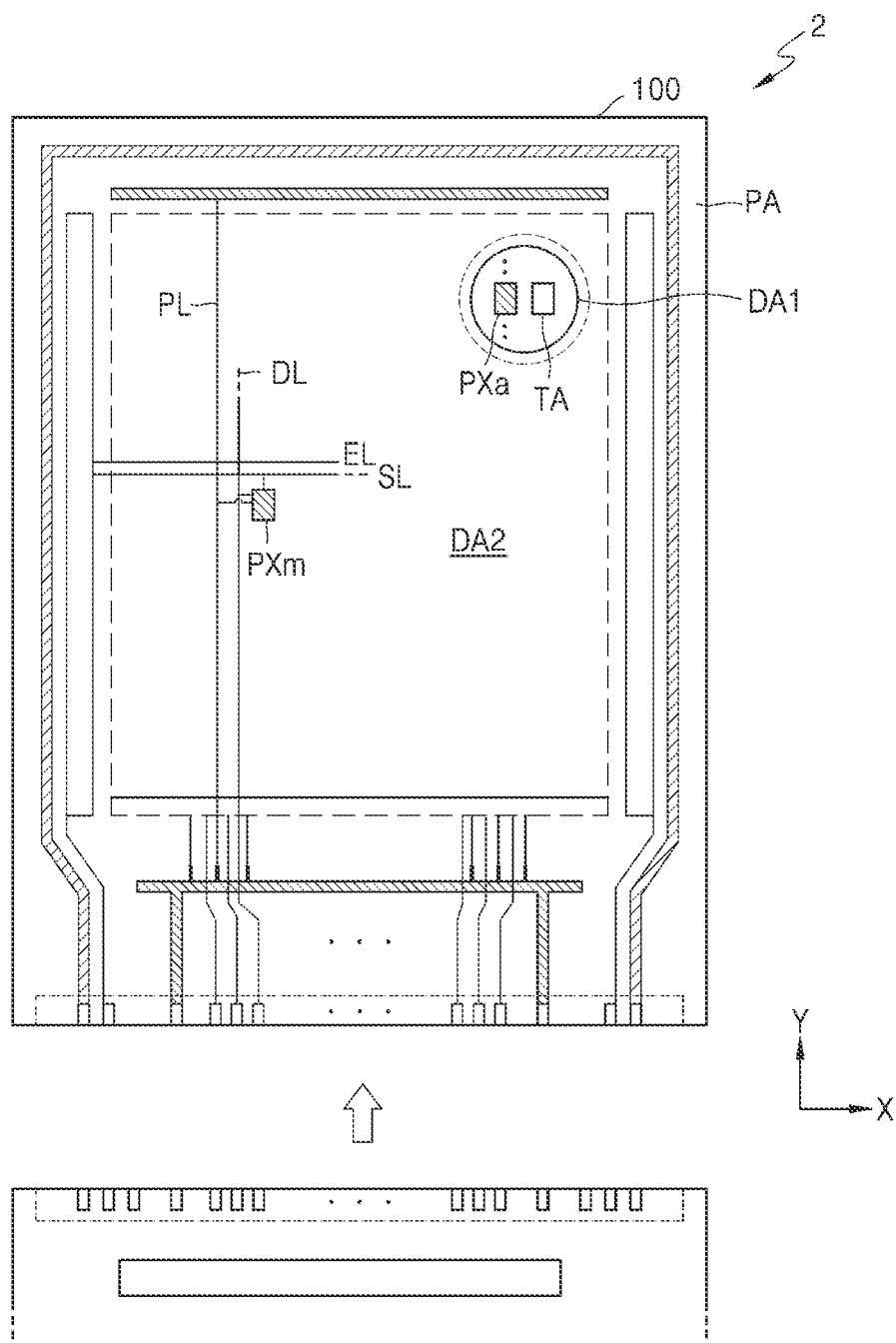
FIG. 3 is a plan view schematically illustrating a display panel, according to some example embodiments.

FIG. 3 is a plan view schematically illustrating a display panel, according to some example embodiments.

Referring to FIG. 3, various components included in the display panel 2 are arranged on the substrate 100. The substrate 100 includes a display area and a peripheral area PA surrounding the display area. The display area includes the second display area DA2 displaying a main image and the first display area DA1 including the transmission area TA therein and displaying an auxiliary image.

The plurality of main pixels PXm are arranged in the second display area DA2. Each of the main pixels PXm may include a display element such as an organic light-emitting device (OLED). Each of the main pixels PXm may emit, for example, red, green, blue, or white light through an OLED. A main pixel PXm in this specification may be understood as a pixel emitting any one of red, green, blue, and white colors of light as described above. The second display area DA2 may be covered by the sealing member described above with reference to FIG. 2 and may be protected from ambient air, moisture, or the like.

The first display area DA1 may be inside the second display area DA2, and the plurality of auxiliary pixels PXa may be in the first display area DA1. Each of the plurality of auxiliary pixels PXa may include a display element such as an OLED. Each of the auxiliary pixels PXa may emit, for example, red, green, blue, or white colors of light through an OLED. An auxiliary pixel PXa in this specification may be understood as a pixel emitting light of any one of red, green, blue, and white colors as described above. Meanwhile, the transmission area TA arranged between the auxiliary pixels PXa may be provided in the first display area DA1.

Because the first display area DA1 includes the transmission area TA, a resolution of the first display area DA1 may be lower than that of the second display area DA2. For example, a resolution of the first display area DA1 may be about ½ of that of the second display area DA2. According to some example embodiments, a resolution of the second display area DA2 may be 400 ppi or more, and a resolution of the first display area DA1 may be about 200 ppi.

Figure 4:
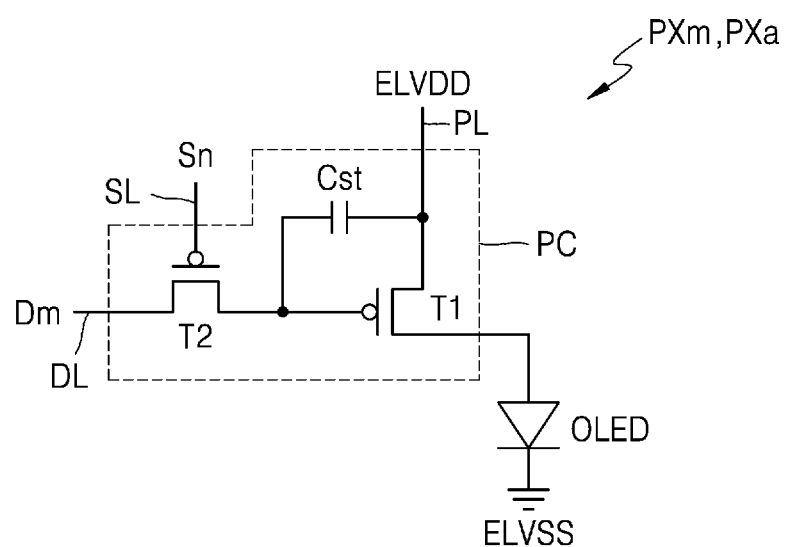
FIGS. 4 and 5 are equivalent circuit diagrams of pixels of a display panel, according to some example embodiments.
Figure 5:
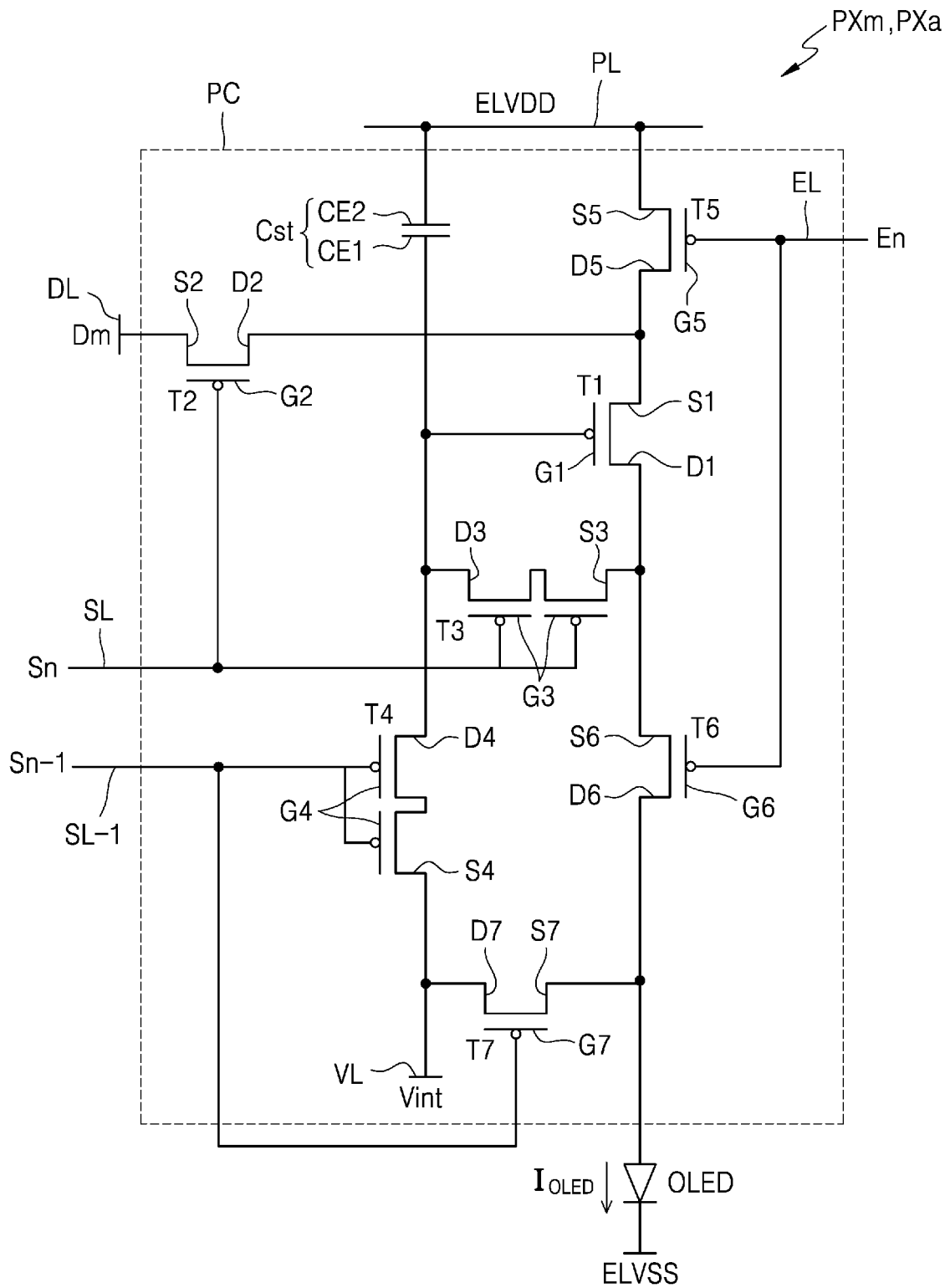

FIGS. 4 and 5 are equivalent circuit diagrams of pixels of a display panel, according to some example embodiments.

Referring to FIGS. 4 and 5, each of the pixels PXm and PXa includes a pixel circuit PC connected to a scan line SL and a data line DL, and an organic light-emitting device OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to transmit, to the driving thin-film transistor T1, a data signal Dm input through the data line DL, according to a scan signal Sn input through the scan line SL.

The storage capacitor Cst is connected to the switching thin-film transistor T2 and the driving voltage line PL, and stores a voltage corresponding to the difference between a voltage received from the switching thin-film transistor T2 and a driving voltage ELVDD (or the power voltage) supplied to a driving voltage line PL.

The driving thin-film transistor T1 is connected to the driving voltage line PL and the storage capacitor Cst, and may control a driving current flowing from the driving voltage line PL to the organic light-emitting device OLED to correspond to a voltage value stored in the storage capacitor Cst. The organic light-emitting device OLED, by the driving current, may emit light having a certain brightness.

FIG. 4 shows that the pixel circuit PC includes two thin-film transistors and one storage capacitor, but embodiments according to the present disclosure are not limited thereto. As shown in FIG. 5, the pixel circuit PC may include seven thin-film transistors and one storage capacitor. Although FIG. 5 shows that the pixel circuit PC includes one storage capacitor, the pixel circuit PC may include two or more storage capacitors.

Referring to FIG. 5, each of the pixels PXm and PXa includes the pixel circuit PC and the organic light-emitting diode OLED connected to the pixel circuit PC. The pixel circuit PC may include a plurality of thin-film transistors and a storage capacitor. The thin-film transistors and the storage capacitor may be connected to signal lines SL, SL−1, EL, and DL, an initialization voltage line VL, and the driving voltage line PL.

Although FIG. 5 shows that the pixels PXm and PXa are connected to signal lines SL, SL−1, EL, and DL, the initialization voltage line VL, and the driving voltage line PL, embodiments according to the present disclosure are not limited thereto. According to some example embodiments, at least one of the signal lines SL, SL−1, EL, or DL, the initialization voltage line VL, the driving voltage line PL, or the like may be shared by neighboring pixels.

The signal lines include the scan line SL for transmitting a scan signal Sn, the previous scan line SL−1 for transmitting a previous scan signal Sn−1 to a first initialization thin-film transistor T4 and a second initialization thin-film transistor T7, an emission control line EL for transmitting an emission control signal En to an operation control thin-film transistor T5 and an emission control thin-film transistor T6, and a data line DL crossing the scan line SL and transmitting a data signal Dm. The driving voltage line PL is configured to transmit the driving voltage ELVDD to the driving thin-film transistor T1, and the initialization voltage line VL is configured to transmit an initialization voltage Vint for initializing the driving thin-film transistor T1 and a pixel electrode.

A driving gate electrode G1 of the driving thin-film transistor T1 is connected to a bottom electrode CE1 of the storage capacitor Cst, a driving source electrode S1 of the driving thin-film transistor T1 is connected to the driving voltage line PL via the operation control thin-film transistor T5, and a driving drain electrode D1 of the driving thin-film transistor T1 is electrically connected to a pixel electrode of the organic light-emitting diode OLED via the emission control thin-film transistor T6. The driving thin-film transistor T1 receives the data signal Dm according to a switching operation of the switching thin-film transistor T2, and supplies a driving current $I_{OLED}$ to the organic light-emitting device OLED.

A switching gate electrode G2 of the switching thin-film transistor T2 is connected to the scan line SL, a switching source electrode S2 of the switching thin-film transistor T2 is connected to the data line DL, and a switching drain electrode D2 of the switching thin-film transistor T2 is connected to the driving source electrode S1 of the driving thin-film transistor T1 and to the driving voltage line PL through the operation control thin-film transistor T5. The switching thin-film transistor T2 is turned on in response to the scan signal Sn received through the scan line SL, and performs a switching operation for transmitting the data signal Dm transmitted to the data line DL to the driving source electrode S1 of the driving thin-film transistor T1.

A compensation gate electrode G3 of the compensation thin-film transistor T3 is connected to the scan line SL, a compensation source electrode S3 of the compensation thin-film transistor T3 is connected to the driving drain electrode D1 of the driving thin-film transistor T1 and to the pixel electrode of the organic light-emitting device OLED via the emission control thin-film transistor T6, and a compensation drain electrode D3 of the compensation thin-film transistor T3 is connected to the bottom electrode CE1 of the storage capacitor Cst, a first initialization drain electrode D4 of the first initialization thin-film transistor T4, and the driving gate electrode G1 of the driving thin-film transistor T1. The compensation thin-film transistor T3 is turned on in response to the scan signal Sn received through the scan line SL, and electrically connects the driving gate electrode G1 to the driving drain electrode D1 of the driving thin-film transistor T1 to diode-connect the driving thin-film transistor T1.

A first initialization gate electrode G4 of the first initialization thin-film transistor T4 is connected to the previous scan line SL−1, a first initialization source electrode S4 of the first initialization thin-film transistor T4 is connected to a second initialization drain electrode D7 of the second initialization thin-film transistor T7 and the initialization voltage line VL, and the first initialization drain electrode D4 of the first initialization thin-film transistor T4 is connected to the bottom electrode CE1 of the storage capacitor Cst, the compensation drain electrode D3 of the compensation thin-film transistor T3, and a driving gate electrode G1 of the driving thin-film transistor T1. The first initialization thin-film transistor T4 is turned on according to the previous scan signal Sn−1 received through the previous scan line SL−1, and transmits the initialization voltage Vint to the driving gate electrode G1 of the driving thin-film transistor T1 to initialize a voltage of the driving gate electrode G1 of the driving thin-film transistor T1.

An operation control gate electrode G5 of the operation control thin-film transistor T5 is connected to the emission control line EL, an operation control source electrode S5 of the operation control thin-film transistor T5 is connected to the driving voltage line PL, and an operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the light emission control thin-film transistor T6 is connected to the emission control line EL, a emission control source electrode S6 of the emission control thin-film transistor T6 is connected to the driving drain electrode D1 of the driving thin-film transistor T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting device OLED.

The operation control thin-film transistor T5 and the emission control thin-film transistor T6 are simultaneously turned on according to the emission control signal En received through the emission control line EL, and the driving voltage ELVDD is transmitted to the organic light-emitting diode OLED in such a way that the driving current $I_{OLED}$ flows through the main organic light-emitting device OLED.

A second initialization gate electrode G7 of the second initialization thin-film transistor T7 is connected to the previous scan line SL−1, the second initialization source electrode S7 of the second initialization thin-film transistor T7 is connected to the emission control drain electrode D6 of the emission control thin-film transistor T6 and a pixel electrode of the organic light-emitting device OLED, and a second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on according to the previous scan signal Sn−1 received through the previous scan line SL−1, and initializes a pixel electrode of the organic light-emitting device OLED.

In FIG. 5, the first initialization thin-film transistor T4 and the second initialization thin-film transistor T7 are connected to the previous scan line SL−1, but embodiments according to the present disclosure are not limited thereto. According to some example embodiments, the first initialization thin-film transistor T4 may be connected to the previous scan line SL−1 and may be driven according to the previous scan signal Sn−1, and the second initialization thin-film transistor T7 may be connected to a separate signal line (for example, a next scan line, and may be driven according to a signal transmitted to the signal line.

The upper electrode CE2 of the storage capacitor Cst is connected to the driving voltage line PL and an opposite electrode of the organic light-emitting device OLED is connected to a common voltage ELVSS. Accordingly, the organic light-emitting device OLED may receive the driving current $I_{OLED}$ from the driving thin-film transistor T1 and may emit light to thereby display an image.

FIG. 5 shows that the compensation thin-film transistor T3 and the first initialization thin-film transistor T4 have a dual gate electrode. However, the compensation thin-film transistor T3 and the first initialization thin-film transistor T4 may have one gate electrode.

Figure 6:
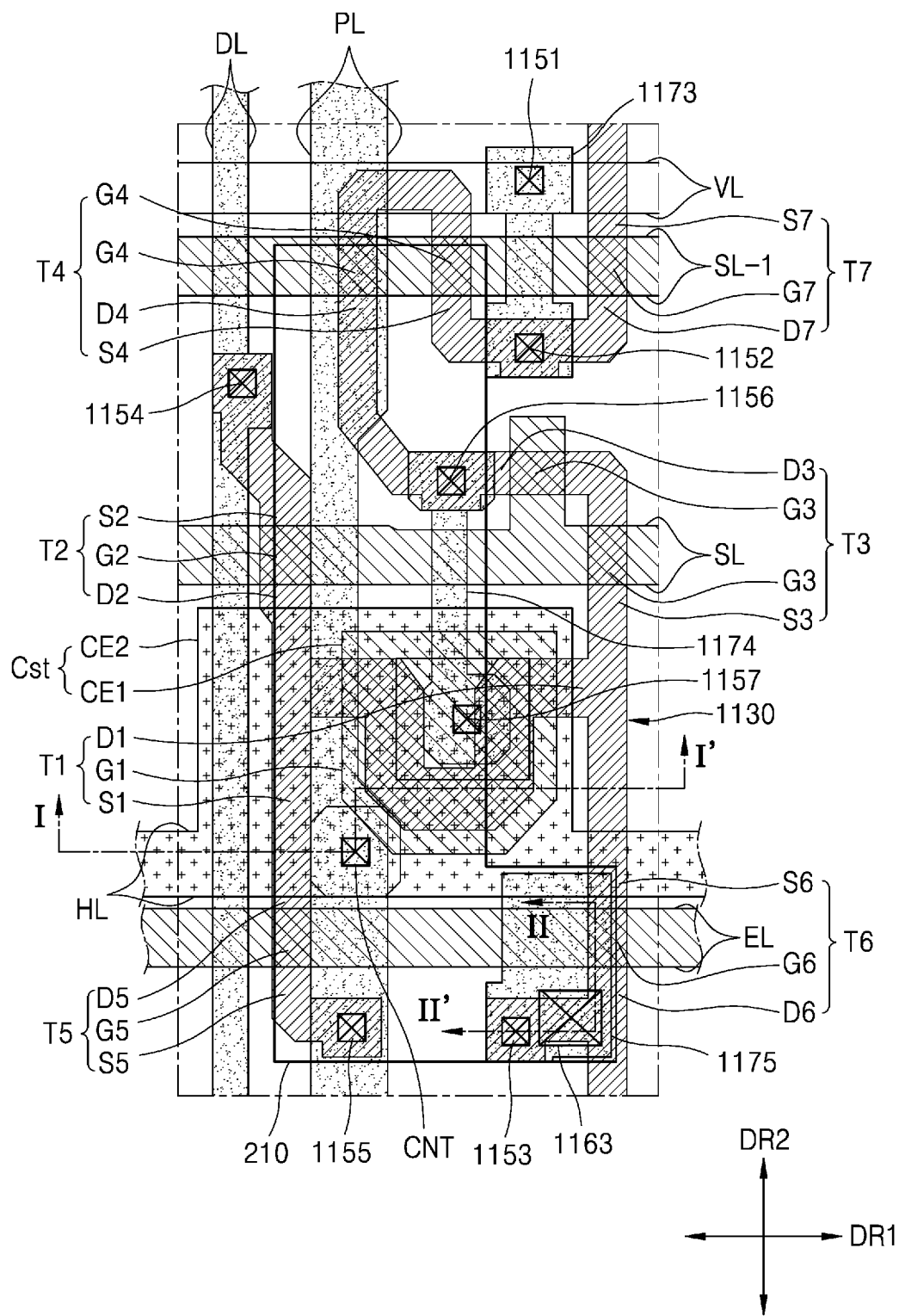
FIG. 6 is a layout view schematically illustrating a pixel circuit of pixels, according to some example embodiments.
Figure 7:
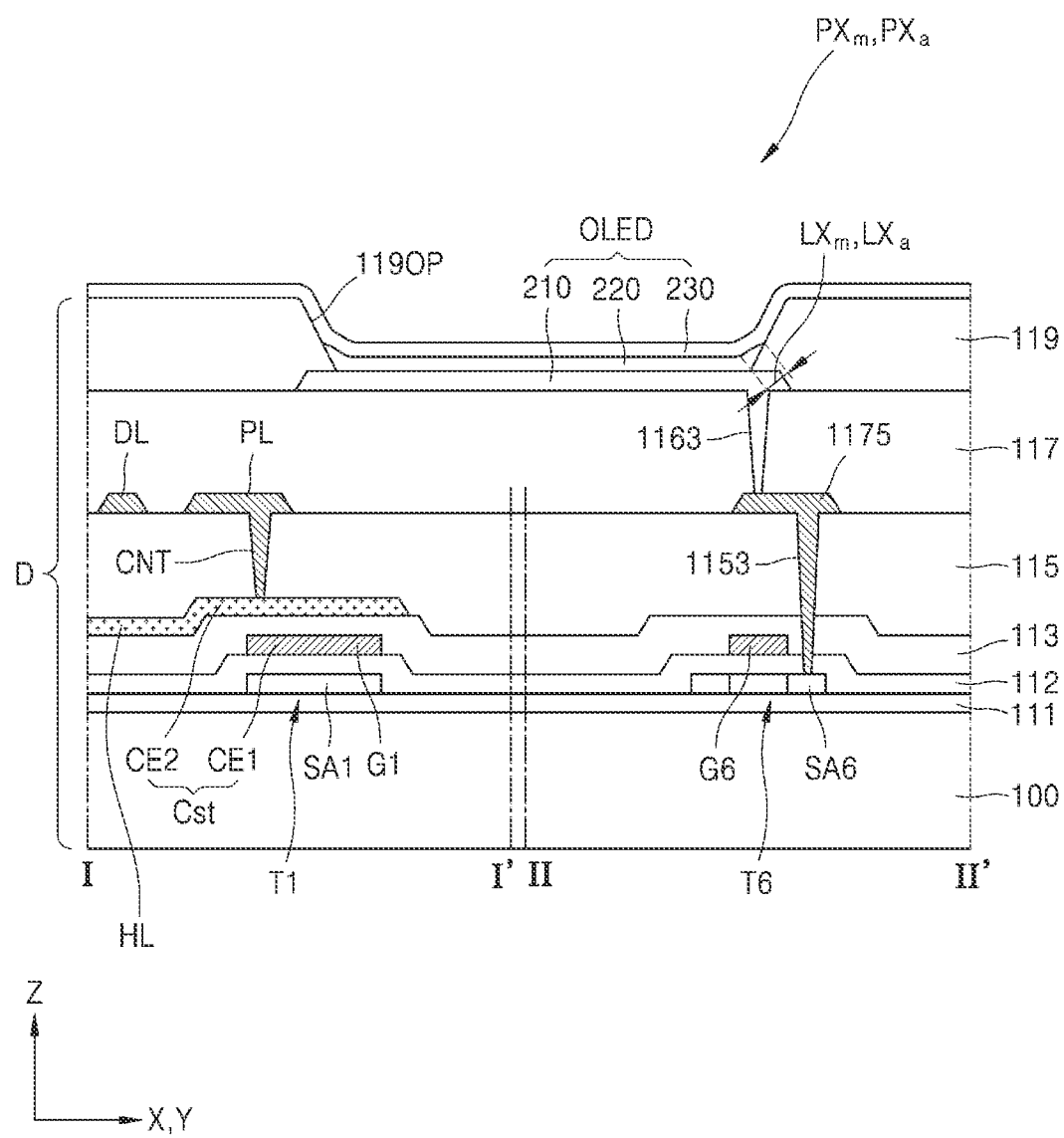
FIG. 7 is a cross-sectional view of the pixels of FIG. 6, taken along the lines I-I' and II-II' of FIG. 6.

FIG. 6 is a layout view schematically illustrating a pixel circuit of pixels, according to some example embodiments. FIG. 7 is a cross-sectional view of the pixels of FIG. 6 taken along the lines I-I' and II-II' of FIG. 6.

Referring to FIGS. 6 and 7, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130.

The semiconductor layer 1130 is arranged on a substrate on which a buffer layer, which is an inorganic insulating material, is formed. According to some example embodiments, the semiconductor layer 1130 may include low-temperature polycrystalline silicon (LTPS). Because the polysilicon material has high electron mobility (more than 100 cm²/Vs), the semiconductor layer 1130 has low energy consumption and excellent reliability, and thus may be used for a thin-film transistor of a display device. However, embodiments according to the present disclosure are not limited thereto. According to some example embodiments, the semiconductor layer 1130 may be formed of amorphous silicon (a-Si) and/or oxide semiconductor, and some semiconductor layers of the plurality of thin-film transistors may be formed of LTPS, and other semiconductor layers may also be formed of amorphous silicon (a-Si) and/or oxide semiconductor.

Some areas of the semiconductor layer 1130 correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be understood as being connected to one another and curved in various shapes.

The semiconductor layer 1130 includes a channel region, and a source region and a drain region on either side of the channel region, and the source region and the drain region may be understood as source and drain electrodes of the corresponding thin-film transistor, respectively. For convenience, the source region and the drain region will now be referred to as source and drain electrodes, respectively.

The driving thin-film transistor T1 includes the driving gate electrode G1 overlapping a driving channel region, and includes the driving source electrode S1 and the driving drain electrode D1 on either side of the driving channel region. The driving channel region overlapping the driving gate electrode G1 has a bent shape such as an omega shape, and thereby, a long channel length may be formed in a narrow space. When the driving channel region is long, a driving range of a gate voltage is widened, and thus, a gradation of light emitted from the organic light emitting diode OLED may be more precisely controlled. Thus, display quality may be improved.

The switching thin-film transistor T2 includes a switching gate electrode G2 overlapping the switching channel region and includes a switching source electrode S2 and a switching drain electrode D2 on either side of the switching channel region. The switching drain electrode D2 may be connected to the driving source electrode S1.

The compensation thin-film transistor T3 is a dual thin-film transistor, which may include compensation gate electrodes G3 overlapping two compensation channel regions, respectively, and may include the compensation source electrodes S3 and the compensation drain electrodes D3 arranged on either side of the compensation source electrodes S3. The compensation thin-film transistor T3 may be connected to the driving gate electrode G1 of the driving thin-film transistor T1 through a node connection line 1174 which will be described later below.

The first initialization thin-film transistor T4 is a dual thin-film transistor, which may include the first initialization gate electrode G4 overlapping two first initialization channel regions, and may include the first initialization source electrode S4 and the first initialization drain electrode D4 arranged on either side of the first initialization gate electrode G4.

The operation control thin-film transistor T5 may include the operation control gate electrode G5 overlapping an operation control channel region and may include an operation control source electrode S5 and the operation control drain electrode D5 arranged on either side of the operation control gate electrode G5. The operation control drain electrode D5 may be connected to the driving source electrode S1.

The emission control thin-film transistor T6 may include the emission control gate electrode G6 overlapping the emission control channel region, and may include a emission control source electrode S6 and an emission control drain electrode D6 arranged on either side of the emission control gate electrode G6. The emission control source electrode S6 may be connected to the driving drain electrode D1.

The second initialization thin-film transistor T7 may include the second initialization gate electrode G7 overlapping a second initialization channel region, and may include the second initialization source electrode S7 and the second initialization drain electrode D7 arranged on either side of the second initialization gate electrode G7.

The above-described thin-film transistors may be connected to signal lines SL, SL−1, EL, and DL, the initialization voltage line VL, and the driving voltage line PL.

The scan line SL, the previous scan line SL−1, the emission control line EL, and the driving gate electrode G1 may be arranged on the semiconductor layer 1130 with an insulating layer(s) therebetween.

The scan line SL may extend along a first direction DR1. At least one area of the scan line SL may correspond to the switching and compensation gate electrodes G2 and G3. For example, an area of the scan line SL that overlaps channel regions of the switching and compensation thin-film transistors T2 and T3 may be the switching and compensation gate electrodes G2 and G3, respectively.

The previous scan line SL−1 extends along the first direction DR1, but some areas may correspond to the first and second initialization gate electrodes G4 and G7, respectively. For example, areas of the previous scan line SL−1 that respectively overlap channel regions of the first and second initialization driving thin-film transistors T4 and T7 may be the first and second initialization gate electrodes G4 and G7, respectively.

The emission control line EL extends along the first direction DR1. One or more areas of the emission control line EL may correspond to the operation control gate electrode G5 and the emission control gate electrode G6, respectively. For example, areas of the emission control line EL that overlap channel regions of the operation control driving thin-film transistor T5 and the emission control driving thin-film transistor T6 may be the operation control and emission control gate electrodes G5 and G6, respectively.

The driving gate electrode G1 is a floating electrode, which may be connected to the compensation thin-film transistor T3 through the node connection line 1174 described above.

An electrode voltage line HL may be arranged on the scan line SL, the previous scan line SL−1, the emission control line EL, and the driving gate electrode G1 with an insulating layer(s) therebetween.

The electrode voltage line HL may extend along the first direction DR1 and intersect the data line DL and the driving voltage line PL. A portion of the electrode voltage line HL covers at least a portion of the driving gate electrode G1 and may form the storage capacitor Cst together with the driving gate electrode G1. For example, the driving gate electrode G1 may be the bottom electrode CE1 of the storage capacitor Cst, and a portion of the electrode voltage line HL may be the upper electrode CE2 of the storage capacitor Cst.

The upper electrode CE2 of the storage capacitor Cst is electrically connected to the driving voltage line PL. In this regard, the electrode voltage line HL may be connected to the driving voltage line PL arranged on the electrode voltage line HL through a contact hole CNT. Therefore, the electrode voltage line HL may have the same voltage level (constant voltage) as the driving voltage line PL. For example, the electrode voltage line HL may have a constant voltage of +5V. The electrode voltage line HL may be understood as a transverse driving voltage line.

The driving voltage line PL extends along a second direction DR2, and the electrode voltage line HL electrically connected to the driving voltage line PL extends along the first direction DR1 crossing the second direction DR2. Thus, at least one driving voltage line PL and at least one electrode voltage line HL may form a mesh structure in a display area.

The data line DL, the driving voltage line PL, an initialization connection line 1173, and the node connection line 1174 may be arranged on the electrode voltage line HL with an insulating layer(s) therebetween.

The data line DL extends in the second direction DR2 and may be connected to the switching source electrode S2 of the switching thin-film transistor T2 through a contact hole 1154. A portion of the data line DL may be understood as a switching source electrode.

The driving voltage line PL extends in the second direction DR2, and is connected to the electrode voltage line HL through the contact hole CNT as described above. In addition, the driving voltage line PL may be connected to the operation control thin-film transistor T5 through a contact hole 1155. The driving voltage line PL may be connected to the operation control drain electrode D5 through a contact hole 1155.

One end of the initialization connection line 1173 may be connected to each of the first and second initialization thin-film transistors T4 and T7 through a contact hole 1152, and the other end may be connected to the initialization voltage line VL, which will be described later below, through a contact hole 1151.

One end of the node connecting line 1174 may be connected to the compensation drain electrode D3 through a contact hole 1156 and the other end may be connected to the driving gate electrode G1 through a contact hole 1157.

The initialization voltage line VL may be arranged on the data line DL, the driving voltage line PL, the initialization connection line 1173, and the node connection line 1174 with an insulating layer(s) therebetween.

The initialization voltage line VL extends in the first direction DR1. The initialization voltage line VL may be connected to each of the first and second initialization driving thin-film transistors T4 and T7 through the initialization connection line 1173. The initialization voltage line VL may have a constant voltage (e.g., −2V or the like).

The initialization voltage line VL is arranged on the same layer as a pixel electrode 210 of the organic light emitting diode OLED (in FIG. 7) and may include the same material as the pixel electrode 210. The pixel electrode 210 may be connected to the emission control thin-film transistor T6. The pixel electrode 210 may be connected to a connection metal 1175 through a contact hole 1163, and the connection metal 1175 may be connected to the emission control drain electrode D6 through a contact hole 1153.

In FIG. 6, the initialization voltage line VL is arranged on the same layer as the pixel electrode 210, but according to some example embodiments, the initialization voltage line VL may be arranged on the same layer as the electrode voltage line HL.

Hereinafter, a stacked structure of components included in the display panel according to some example embodiments will be described with reference to FIG. 7.

The substrate 100 may include glass or a polymer resin. The polymer resin may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the above-described polymer resin and an inorganic layer.

The buffer layer 111 may be arranged on the substrate 100 to reduce or block foreign matter, moisture, or ambient air from penetrating into the bottom of the substrate 100 and may provide a flat surface on the substrate 100. The buffer layer 111 may include an inorganic material, such as an oxide or nitride, an organic material, or an organic-inorganic composite material, and may have a single layer structure or a multi-layer structure including an inorganic material or an organic material. A barrier layer for blocking penetration of ambient air may be further included between the substrate 100 and the buffer layer 111.

A plurality of gate electrodes G1 and G6 are respectively arranged on a plurality of semiconductor layers SA1 and SA6, with a first gate insulating layer 112 therebetween. The gate electrode G1 may include molybdenum (Mo), aluminum (Al), copper (Cu), titanium (Ti), or the like and may be formed of a single layer or multiple layers. For example, the gate electrodes G1 and G6 may be a single layer of Mo. The scan line SL (see FIG. 6), the previous scan line SL−1, and the emission control line EL may be formed on the same layer as the gate electrodes G1 and G6. That is, the gate electrodes G1 and G6, the scan line SL (see FIG. 6), the previous scan line SL−1, and the emission control line EL may be above the first gate insulating layer 112.

The first gate insulating layer 112 may include silicon oxide (SiO$_2$) silicon nitride (SiN$_X$), silicon oxynitride (SiON), aluminium oxide (Al$_2$O$_3$), titanium oxide (TiO$_2$), tantalum oxide (Ta$_2$O$_5$), hafnium oxide (HfO$_2$), or zinc oxide (ZnO$_2$).

A second gate insulating layer 113 may cover the gate electrodes G1 and G6. The second gate insulating layer 113 may include SiO$_2$, SiN$_X$, SiON, Al$_2$O$_3$, TiO$_2$, Ta$_2$O$_5$, HfO$_2$, or ZnO$_2$.

The bottom electrode CE1 of the storage capacitor Cst may be integrally formed with the driving gate electrode G1 of the driving thin-film transistor T1. For example, the driving gate electrode G1 of the driving thin-film transistor T1 may function as the bottom electrode CE1 of storage capacitor Cst.

The second electrode CE2 of the storage capacitor Cst may overlap the bottom electrode CE1 with the second gate insulating layer 113 therebetween. In this case, the second gate insulating layer 113 may serve as a dielectric layer of the storage capacitor Cst. The upper electrode CE2 may include a conductive material, including Mo, Al, Cu, Ti, or the like, and may be formed of a multi-layer or single layer including the above material. For example, the upper electrode CE2 may be a single layer of Mo or multiple layers of Mo/Al/Mo.

In the drawing, the storage capacitor Cst overlaps the driving thin-film transistor T1, but embodiments according to the present disclosure are not limited thereto. Various modifications are possible, for example, the storage capacitor Cst may be arranged not to overlap the driving thin-film transistor T1.

The upper electrode CE2 may function as the electrode voltage line HL. For example, a portion of the electrode voltage line HL may be the upper electrode CE2 of the storage capacitor Cst.

An interlayer insulating layer 115 may be provided to cover the upper electrode CE2. The interlayer insulating layer 115 may include SiO$_2$, SiN$_X$, SiON, Al$_2$O$_3$, TiO$_2$, Ta$_2$O$_5$, HfO$_2$, or ZnO$_2$. FIG. 7 shows that the interlayer insulating layer 115 is a single layer, but according to some example embodiments, the interlayer insulating layer 115 may be formed in a multi-layer structure.

The data line DL, the driving voltage line PL, and the connection metal 1175 may be arranged above the interlayer insulating layer 115. The data line DL, the driving voltage line PL, and the connection metal 1175 may include a conductive material including Mo, Al, Cu, Ti, or the like, and may be formed as a single layer or multiple layers including the above-described materials. For example, the data line DL, the driving voltage line PL, and the connection metal 1175 may be formed in a multi-layer structure of Ti/Al/Ti.

The upper electrode CE2 of the storage capacitor Cst may be connected to the driving voltage line PL through the contact hole CNT defined in the interlayer insulating layer 115. This may mean that the electrode voltage line HL is connected to the driving voltage line PL through the contact hole CNT. Therefore, the electrode voltage line HL may have the same voltage level (constant voltage) as the driving voltage line PL.

The connection metal 1175 is connected to the semiconductor layer SA6 of the emission control thin-film transistor T6 through the contact hole 1153 that passes through the interlayer insulating layer 115, the second gate insulating layer 113, and the first gate insulating layer 112. The emission control thin-film transistor T6 may be electrically connected to a pixel electrode 210 of the organic light-emitting diode OLED through the connection metal 1175.

A planarization layer 117 may be arranged on the data line DL, the driving voltage line PL, and the connection metal 1175, and the organic light-emitting diode OLED may be arranged on the planarization layer 117.

The planarization layer 117 may have a flat upper surface so that the pixel electrode 210 may be formed flat. The planarization layer 117 may be formed of a single layer or multiple layers of an organic material. The planarization layer 117 may include a general polymer such as benzocyclobutene (BCB), polyimide (PI), hexamethyldisiloxane (HMDSO), poly(methyl methacrylate) (PXMMA), and polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The planarization layer 117 may include an inorganic material. The planarization layer 117 may include SiO$_2$, SiN$_X$, SiON, Al$_2$O$_3$, TiO$_2$, Ta$_2$O$_5$, HfO$_2$, or ZnO$_2$. When the planarization layer 117 is made of an inorganic material, in some cases, chemical planarization polishing may be performed. Meanwhile, the planarization layer 117 may include both organic and inorganic materials.

The pixel electrode 210 may be a (semi)transparent electrode or a reflective electrode. In some example embodiments, the pixel electrode 210 may include a reflective film including silver (Ag), magnesium (Mg), Al, platinum (Pt), palladium (Pd), gold (Au), nickel (Ni), neodymium (Nd), iridium (Ir), chromium (Cr), a compound thereof, or the like, and a transparent or (semi)transparent electrode layer formed on the reflective film. The transparent or (semi)transparent electrode layer may include at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO). In some example embodiments, the pixel electrode 210 may be provided in a stacked structure of ITO/Ag/ITO.

A pixel defining layer 119 may be arranged above the planarization layer 117 and may have an opening 1190P exposing a central portion of the pixel electrode 210, thereby defining an emission area of the pixel. In addition, the pixel defining layer 119 may serve to prevent or reduce arcs or the like from occurring at an edge of the pixel electrode 210 by increasing a distance between the edge of the pixel electrode 210 and an opposite electrode 230 above the pixel electrode 210. The pixel defining layer 119 may include an organic insulating material such as PI, polyamide, acrylic resin, BCB, HMDSO, and phenolic resin, and may be formed by spin coating or the like.

An intermediate layer 220 of the organic light-emitting diode OLED may include an organic emission layer. The organic emission layer may include an organic material including a fluorescent or phosphorescent material that emits red, green, blue, or white light. The organic emission layer may be a low molecular organic material or high molecular organic material, and functional layers such as a hole transport layer (HTL), a hole injection layer (HIL), an electron transport layer (ETL), an electron injection layer (EIL), and the like may be selectively further arranged below and above the organic emission layer. The intermediate layer 220 may be arranged to correspond to each of at least one pixel electrode 210. However, embodiments according to the present disclosure are not limited thereto. Various modifications are possible, for example, the intermediate layer 220 may include an integral layer over the at least one pixel electrode 210.

Sizes of at least one intermediate layer 220 emitting the same color of light may be different from each other in the first display area DA1 and the second display area DA2. For example, the area on a plane of at least one layer from among the at least one intermediate layer 220 of the main pixel PXm may be different from the area on a plane of at least one layer from among the at least one intermediate layer 220 of the auxiliary pixel PXa. For example, the area on a plane of at least one layer from among the at least one intermediate layer 220 of the main pixel PXm may be less than the area on a plane of at least one layer from among the at least one intermediate layer 220 of the auxiliary pixel PXa. For example, the area on a plane of the HIL from among the at least one intermediate layer 220 of the main pixel PXm may be less than the area on a plane of the HIL from among the at least one intermediate layer 220 of the auxiliary pixel PXa.

According to some example embodiments, the area on a plane of the organic emission layer from among the at least one intermediate layer 220 of the main pixel PXm may be less than the area on a plane of the organic emission layer from among the at least one intermediate layer 220 of the auxiliary pixel PXa. According to some example embodiments, the area on a plane of the HIL and the organic emission layer from among the at least one intermediate layer 220 of the main pixel PXm may be less than the area on a plane of the HIL and the organic emission layer from among the at least one intermediate layer 220 of the auxiliary pixel PXa. In this case, the above relationship is not limited thereto, and may be applied to a pixel electrode, an HTL, an ETL, an EIL, and the like.

In addition, a thickness of the intermediate layer 220 of the main pixel PXm and a thickness of the intermediate layer 220 of the auxiliary pixel PXa may be uniform in some sections and variable in other sections. For example, the intermediate layer 220 arranged above the pixel electrode 210 of each pixel may have a constant thickness, whereas the intermediate layer 220 arranged on an inner surface of the opening 1190P of the pixel defining layer 119 may not have a constant thickness. In this case, the thickness of the intermediate layer 220 arranged on the inner surface of the opening 1190P of the pixel defining layer 119 may decrease as the distance from the pixel electrode 210 increases.

According to some example embodiments, a thickness of the intermediate layer 220 arranged in a portion of the pixel electrode 210 of each pixel may be constant, and a thickness of the intermediate layer 220 may decrease toward an end of the intermediate layer 220 as described in more detail below. In this case, a thickness of the intermediate layer 220 may be measured in a vertical direction from a surface of the pixel electrode 210 in direct contact with the intermediate layer 220 or a surface of the pixel defining layer 119 to a surface of the intermediate layer 220 in contact with the opposite electrode 230. For convenience of explanation, a case where a section in which a thickness of the intermediate layer 220 is variable is arranged only on the inner surface of an opening of the pixel defining layer 119 will now be focused on and described in more detail.

In the above case, a thickness of the intermediate layer 220 of a constant thickness portion of the intermediate layer 220 of the main pixel PXm may be the same as a thickness of the intermediate layer 220 of a constant thickness portion of the intermediate layer 220 of the auxiliary pixel PXa. In addition, a first length LXm of a section in which a thickness of the intermediate layer 220 of the main pixel PXm is variable may be different from a second length LXa of a section in which a thickness of the intermediate layer 220 of the auxiliary pixel PXa is variable. For example, one of the first length LXm or the second length LXa may be greater than the first length LXm or the second length LXa. For example, the first length LXm may be greater than the second length LXa, or the second length LXa may be greater than the first length LXm. At this time, when a resolution of the second display area DA2 is higher than that of the first display area DA1, the first length LXm may be greater than the second length LXa. According to some example embodiments, when the resolution of the second display area DA2 is lower than that of the first display area DA1, the first length LXm may be less than the second length LXa.

In this case, a section in which a thickness of the intermediate layer 220 of each pixel is variable is shortened, and thereby, it is possible to implement a clear image in at least one of the first display area DA1 or the second display area DA2. For example, when the second length LXa is less than the first length LXm, the transmission area TA may be secured as much as possible, and thus, malfunction or deterioration in operating performance may be prevented or reduced when a component arranged in the first display area DA1 is operated. For convenience of explanation, a case in which the second length LXa is less than the first length LXm will now be focused on and described in more detail.

The opposite electrode 230 may be a transparent electrode or a reflective electrode. In some example embodiments, the opposite electrode 230 may be a transparent or (semi) transparent electrode, and may include a metal thin-film having a small work function including lithium (Li), calcium (Ca), lithium fluoride (LiF)/Ca, LiF/Al, Ag, Mg, and a compound thereof. In addition, a transparent conductive oxide (TCO) film such as ITO, IZO, ZnO, $In_2O_3$, or the like may further be arranged on the metal thin-film.

When the pixel electrode 210 is provided as a reflective electrode and the opposite electrode 230 as a light-transmitting electrode, light emitted from the intermediate layer 220 is emitted to the opposite electrode 230 side, and the display device may be a front-emission type. When the pixel electrode 210 is configured as a transparent or (semi)transparent electrode, and the opposite electrode 230 is configured as a reflective electrode, light emitted from the intermediate layer 220 is emitted to the substrate 100 side, and thus, the display device may be a rear-emission type. However, embodiments according to the present disclosure are not limited thereto. The display device of embodiments of the disclosure may be a double-sided emission type that emits light in both front and rear directions.

According to some example embodiments, the opposite electrode 230 is arranged over the entire front surface of the second display area DA2, and a portion of the edge may be arranged in the peripheral area PA. The opposite electrode 230 may be integrally formed with the main pixels PXm arranged on the second display area DA2, that is, a plurality of organic light-emitting diodes OLEDs, and may correspond to the plurality of pixel electrodes 210, respectively.

Meanwhile, the opposite electrode 230 is also provided in the auxiliary pixels PXa arranged above the first display area DA1. However, because the first display area DA1 includes the transmission area TA arranged between the auxiliary pixels PXa, a portion of the opposite electrode 230 may not be provided in some areas corresponding to the transmission area TA. In a display device of front-emission type, light may be emitted to the opposite electrode 230 side, but the transmittance may be partially lowered by the opposite electrode 230. Therefore, by not having the opposite electrode 230 in areas corresponding to the transmission area TA, the transmittance of the transmission area TA may be improved. At this time, at least one opposite electrode 230 spaced apart from each other in the first display area DA1 may at least partially overlap the opposite electrode 230 which is connected by a separate bridge or adjacent to the opposite electrode 230. Each of the main pixel PXm and the auxiliary pixel PXa as described above may include the pixel electrode 210, the intermediate layer 220, and the opposite electrode 230 described above. According to some example embodiments, the auxiliary pixel PXa may include a first pixel electrode, a first intermediate layer, and a first opposite electrode, and the main pixel PXm may include a second pixel electrode, a second intermediate layer, and a second opposite electrode.

Figure 8:
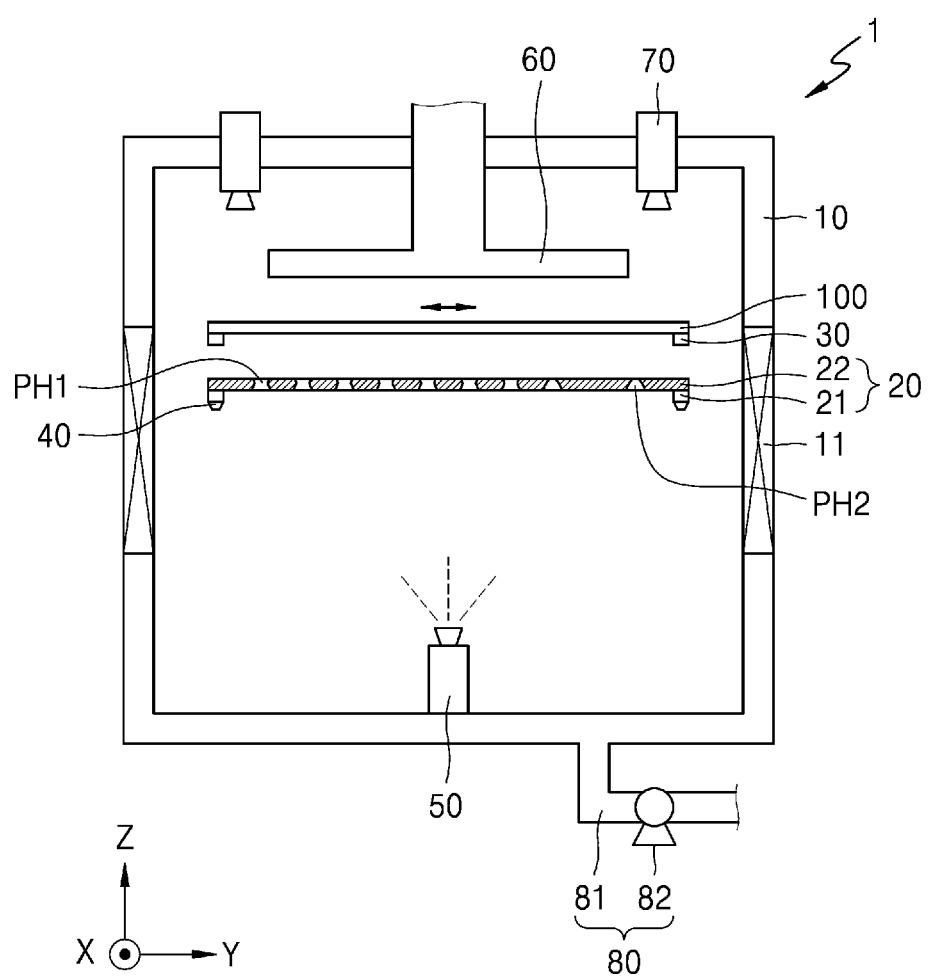
FIG. 8 is a cross-sectional view illustrating an apparatus for manufacturing a display device, according to some example embodiments.
Figure 9:
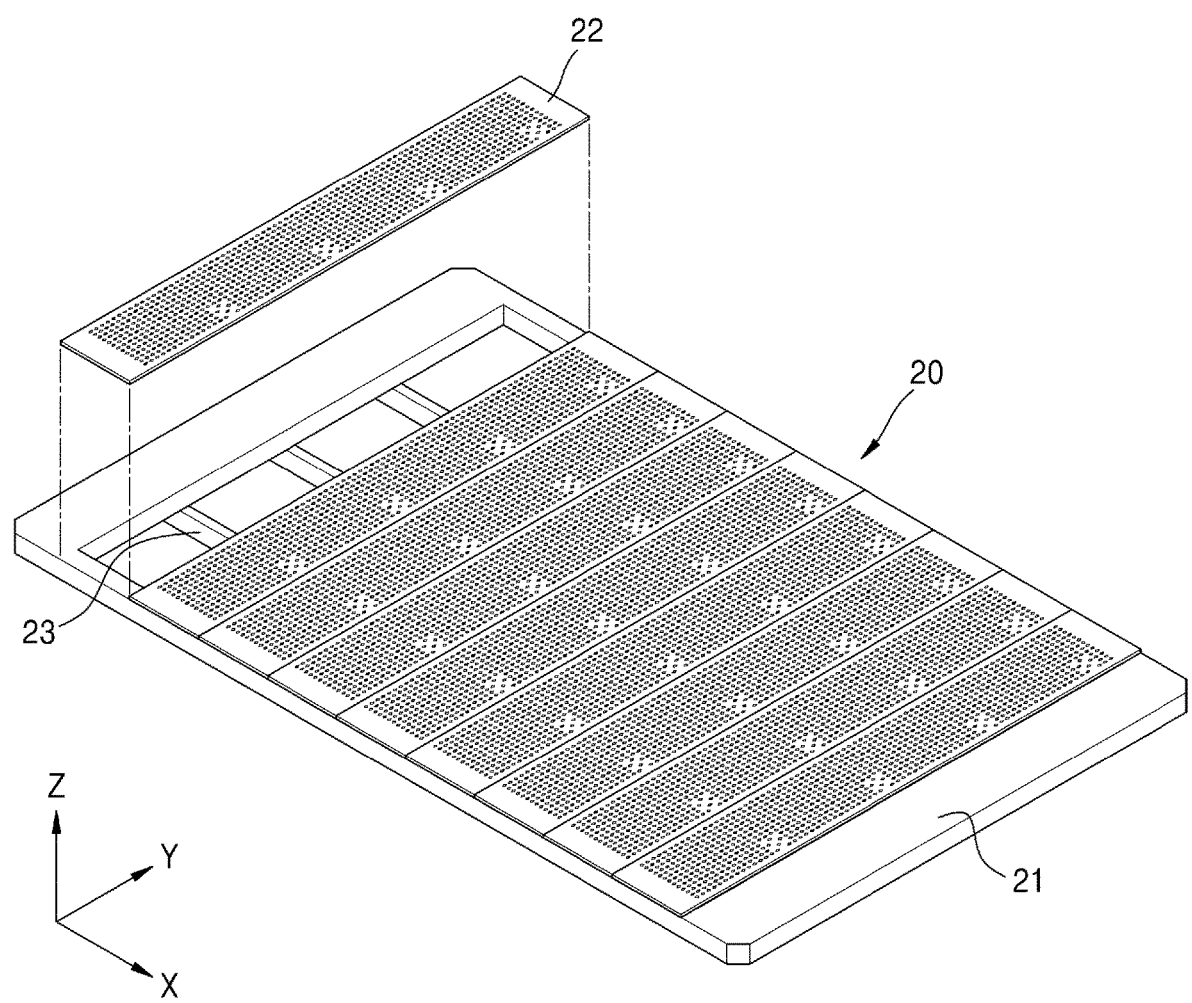
FIG. 9 is a perspective view illustrating the mask assembly shown in FIG. 8.

FIG. 8 is a cross-sectional view of an apparatus for manufacturing a display device, according to some example embodiments. FIG. 9 is a perspective view illustrating the mask assembly shown in FIG. 8.

Referring to FIGS. 8 and 9, the display device DD may be manufactured by an apparatus for manufacturing a display device (1).

The apparatus for manufacturing the display device (1) may include a chamber 10, a mask assembly 20, a first support portion 30, a second support portion 40, a deposition source 50, a magnetic force generating portion 60, a vision portion 70, and a pressure control portion 80.

The chamber 10 may have a space therein, and may be partially opened. At this time, a gate valve 11 may be arranged so that an opening portion may be opened and closed.

The mask assembly 20 may be selectively placed inside the chamber 10. The mask assembly 20 may include a mask frame 21 and a mask sheet 22. The mask sheet 22 may be fixed to the mask frame 21 in a tensioned state. The mask sheet 22 may include at least one first pattern hole PH1 and at least one second pattern hole PH2. The first pattern hole PH1 and the second pattern hole PH2 may be through holes for a deposition material to pass through the mask sheet 22.

The mask assembly 20 may include a mask frame 21 and a mask sheet 22. The mask frame 21 is formed by connecting a plurality of frames to each other and may include an opening therein. The mask frame 21 may include one opening or a plurality of openings separated from each other. In this case, the mask frame 21 may be formed in a grid shape, such as a window frame or the like.

The mask sheet 22 may be fixed to the mask frame 21 in a tensioned state. The mask sheet 22 may be provided in singular or plural. When one mask sheet 22 is provided, the mask sheet 22 is arranged on the mask frame 21 and may shield an opening of the mask frame 21. According to some example embodiments, when the mask sheet 22 is provided in plural, the at least one mask sheets 22 may also be arranged adjacent to each other along one side of the mask frame 21 (for example, X direction or Y direction) to shield the opening of the mask frame 21. For convenience of explanation, a case in which the mask sheet 22 is provided in plural will now be focused on and described in more detail.

The mask assembly 20 may further include a support frame 23 for supporting the mask sheet 22. The mask sheet 22 may be arranged above the support frame 23. The support frame 23 may be arranged in the opening of the mask frame 21 and may be provided in plural. The support frames 23 may be arranged to be spaced apart from one another in a direction parallel or perpendicular to a length direction (e.g., Y direction) of the mask sheet 22.

The substrate 100 may be mounted above the first support portion 30. The first support portion 30 may adjust a position of the substrate 100. For example, the first support portion 30 may include a UVW stage.

The mask assembly 20 may be mounted on the second support portion 40. Similar to the first support portion 30, the second support portion 40 is capable of adjusting a position of the mask assembly 20.

At least one of the first support portion 30 or the second support portion 40 may be elevated and/or lowered inside the chamber 10. In this case, at least one of the first support portion 30 or the second support portion 40 may adjust a width between the substrate 100 and the mask frame 21.

The deposition source 50 may be supplied to the chamber 10 by storing a deposition material and then, vaporizing and subliming the deposition material. The deposition source 50 may include a heater that may melt or sublimate a deposition material inside the deposition source 50 by heating the deposition material. In this case, the deposition source 50 may be arranged at the center or side of the chamber 10.

The magnetic force generating portion 60 is arranged in the chamber 10 in such a way that the substrate 100 is in close contact with the mask assembly 20. At this time, the magnetic force generating portion 60 may include an electromagnet, permanent magnet, or the like for generating a magnetic force.

The vision portion 70 may be arranged in the chamber 10 and capture an image of positions of the mask assembly 20 and the substrate 100. At this time, the vision portion 70 may capture an image of an alignment mark or the like of at least one of the mask assembly 20 or the substrate 100.

The pressure control portion 80 may be connected to the chamber 10 and control a pressure inside the chamber 10. At this time, the pressure control portion 80 may include a connection pipe 81 connected to the chamber 10 and a pump 82 arranged in the connection pipe 81.

Referring to the operation of the apparatus for manufacturing the display device (1) as described above, the substrate 100 and the mask assembly 20 may be inserted into the chamber 10 by opening the gate valve 11 in a state that the pressure control portion 80 maintains a pressure inside the chamber 10 to be equal or similar to the atmospheric pressure. At this time, at least one of the substrate 100 or the mask assembly 20 may move through a separate robot arm outside the chamber 10 or a shuttle inserted into or withdrawn from the chamber 10. In this case, the substrate 100 may have, for example, each of the layers arranged below the pixel defining layer 119 as shown in FIG. 7, the pixel defining layer 119, and the pixel electrode 210 formed therein.

After the mask frame 21 and the substrate 100 are arranged on the second support portion 40 and the first support portion 30, respectively, the positions of the mask frame 21 and the substrate 100 may be detected with the vision portion 70 and aligned. Thereafter, the substrate 100 and the mask frame 21 are brought close to each other, and then the mask frame 21 and the substrate 100 may be brought into close contact with each other by using the magnetic force generating portion 60.

When a deposition material is released from the deposition source 50, the deposition material may be deposited on the substrate 100 through the first pattern hole PH1 and the second pattern hole PH2 of the mask sheet 22, and thereby, a pattern is formed. At this time, the deposition material may be deposited on the substrate 100, and may form, for example, the intermediate layer 220 (see FIG. 7) or at least one layer (e.g., at least one of an organic emission layer or a functional layer) from among the intermediate layer 220 (see FIG. 7).

When the above process is completed, the substrate 100 may be taken outside the chamber 10 or moved to another place in the chamber 10, and thereby, another layer may be formed above the substrate 100.

The above operations may be performed individually in various layers. For example, by forming a pixel electrode through the mask assembly 20, and transporting the substrate 100 to another display device manufacturing apparatus, at least one of an HTL or an HIL from among the functional layers may be formed above the pixel electrode. An organic emission layer may be formed above the functional layer by transporting the substrate 100 to another display device manufacturing apparatus, and the substrate 100 may be transported to another display device manufacturing apparatus. Thereby, an HTL and an EIL from among the functional layers may be formed above the organic emission layer. In this case, the organic emission layer may be formed on the substrate 100 by using different mask assemblies in a separate display device manufacturing apparatus for each organic emission layer that implements different colors.

When the above process is completed, an opposite electrode and a thin-film encapsulation layer may be sequentially formed above the functional layer in another display device manufacturing apparatus.

In this case, at least one of the pixel electrode, the functional layer, or the organic emission layer may be formed on the substrate 100 in a display device manufacturing apparatus which is identical or similar to the apparatus for manufacturing the display device (1) shown in FIG. 9.

Figure 10A:
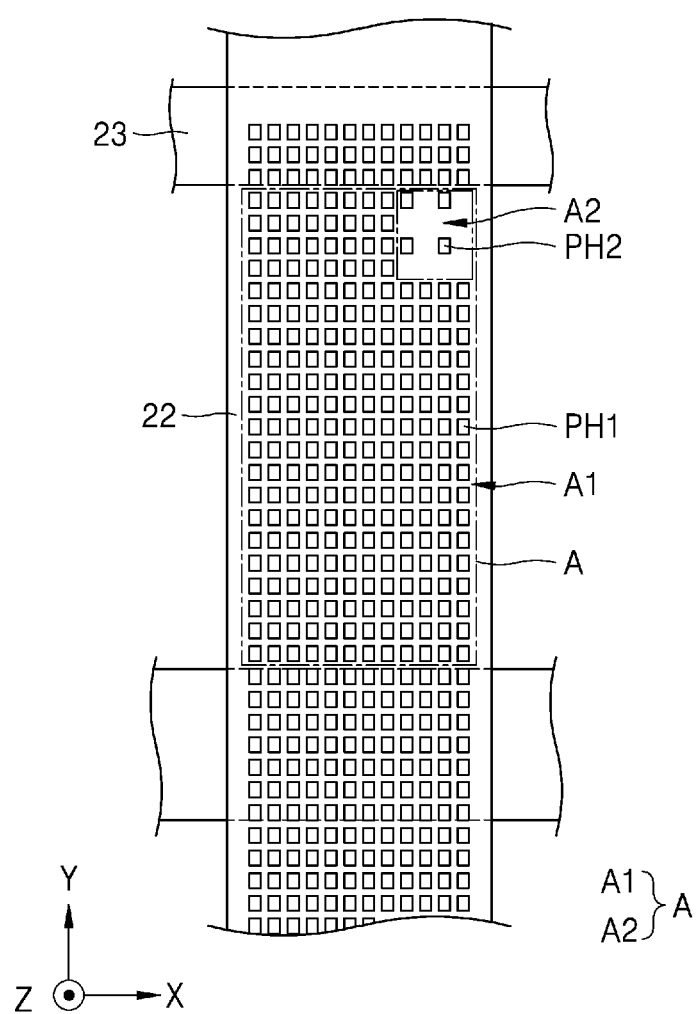
FIGS. 10A and 10B are plan views schematically illustrating a portion of a mask sheet and a support frame of a mask assembly, respectively, according to some example embodiments.
Figure 10B:
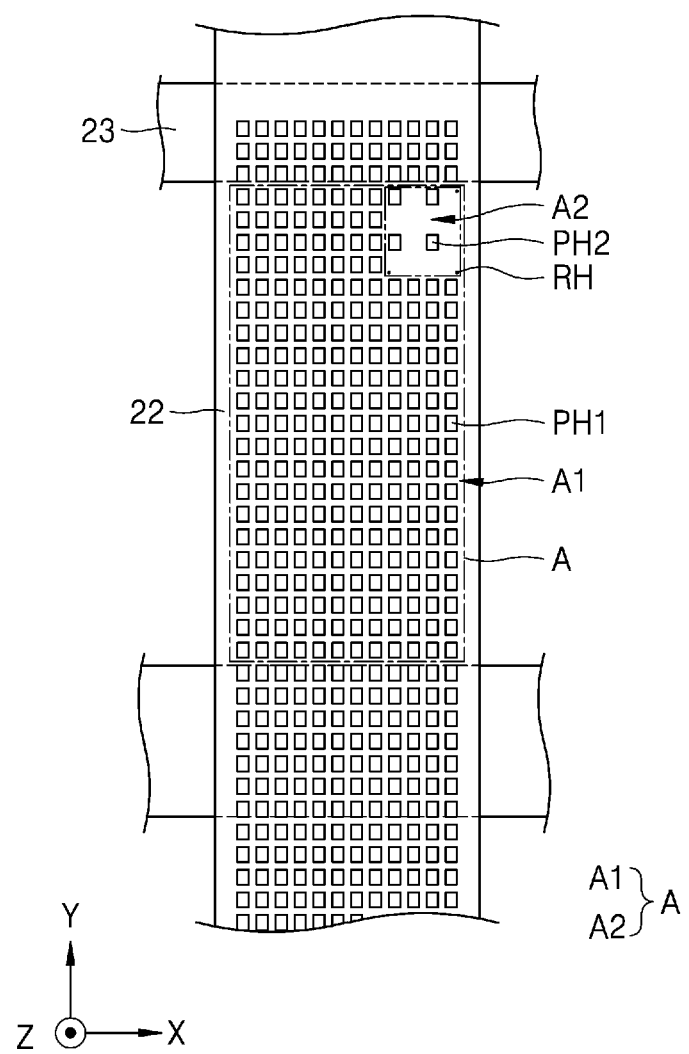

FIGS. 10A and 10B are plan views schematically illustrating a portion of a mask sheet and a support frame of a mask assembly, respectively, according to some example embodiments.

Referring first to FIG. 10A, a portion of the mask sheet 22 may overlap the support frame 23. A pattern hole located in an area overlapping the support frame 23 from among the pattern holes of the mask sheet 22 may be shielded by the support frame 23. That is, the deposition material cannot pass through the pattern hole arranged in an area where the support frame 23 overlaps the mask sheet 22.

Therefore, an area between at least one support frame 23 spaced apart from each other may be defined as a deposition area A. The deposition area A may have a shape such as a polygon, such as a rectangle, a square, a triangle, or the like, an ellipse, a circle, according to a shape and arrangement of the support frame 23. The deposition area A may include a first area A1 and a second area A2 of which at least one side is surrounded by the first area A1 on a plane. FIG. 10A illustrates that the second area A2 is provided in singular. However, embodiments according to the present disclosure are not limited thereto, and at least two second areas A2 may be included.

The mask sheet 22 may include the first pattern hole PH1 and the second pattern hole PH2 in such a way that a deposition material passes therethrough. The first pattern hole PH1 and the second pattern hole PH2 may be holes that penetrate in a thickness direction of the mask sheet 22. The first pattern hole PH1 may be arranged in the first area A1 of the deposition area A, and the second pattern hole PH2 may be arranged in the second area A2 of the deposition area A.

A shape of each of the first pattern hole PH1 and the second pattern hole PH2 may be a rectangle or a square, or may be a variety of shapes, for example, a polygon such as a triangle, a circle, an ellipse, or the like. Here, the shape of each of the first pattern hole PH1 and the second pattern hole PH2 may be, for example, a shape on a plane that is parallel to one surface of the mask sheet 22 facing the deposition source 50. In FIG. 10A, both the first pattern hole PH1 and the second pattern hole PH2 have a rectangular shape, but are not limited thereto. The shapes of the first pattern hole PH1 and the second pattern hole PH2 may be different from each other.

In addition, the areas of the first pattern hole PH1 and the second pattern hole PH2 may be different from each other. Here, the areas of the first pattern hole PH1 and the second pattern hole PH2 may be the size of the shapes of the first pattern hole PH1 and the second pattern hole PH2 on the plane. For example, the size of a shape of the first pattern hole PH1 may be less than the size of a shape on the plane of the second pattern hole PH2. In FIG. 10A, the sizes of shapes of the first pattern hole PH1 and the second pattern hole PH2 are the same, but are not limited thereto.

The number (i.e., density) per equal area of at least one first pattern hole PH1 and at least one second pattern hole PH2 may be different from each other. According to some example embodiments, the number of the at least one first pattern hole PH1 may be greater per equal area than the number of the at least one second pattern hole PH2. Through this, the display device DD may be manufactured in such a way that the second display area DA2 and the first display area DA1 of the display device DD respectively corresponding to the first area A1 and the second area A2 of the mask sheet 22 have different resolutions from each other. FIG. 10A shows that four second pattern holes PH2 are arranged in the second area A2, but this is an example and embodiments are not limited thereto.

Meanwhile, a thickness of the mask sheet 22 in the first area A1 may be different from a thickness of the mask sheet 22 in the second area A2. For example, the thickness in the second area A2 may be less than the thickness in the first area A1, and the thickness in the second area A2 may be 50%, or 40%, or 30%, or 20% or less of the thickness in the first area A1. This will be described later in more detail below with reference to FIG. 16F.

Referring to FIG. 10B, a reference hole RH may be additionally arranged in the second area A2 of the mask sheet 22. The reference hole RH may be a through hole. At least two reference holes RHs may be arranged at a corner of the second area A2. For example, when the second area A2 has a rectangular shape, two reference holes RHs may be arranged respectively adjacent to two corners arranged at diagonally opposite to each other from among the four corners of the second area A2. Alternatively, as shown in FIG. 10B, four reference holes RHs adjacent to the four corners of the second area A2, respectively, may be arranged. In addition, when the second area A2 has a circular shape, at least two reference holes RHs may be arranged along the circumference of the second area A2 at the edge of the circumference.

As described in more detail with reference to FIG. 19, the reference holes RHs may be utilized to align the material (base material) of the mask sheet 22 in the step of processing which uses a laser beam. Through this, it is possible to form an elaborate pattern hole by irradiating a laser beam to an exact position on the material of the mask sheet 22.

Figure 11A:
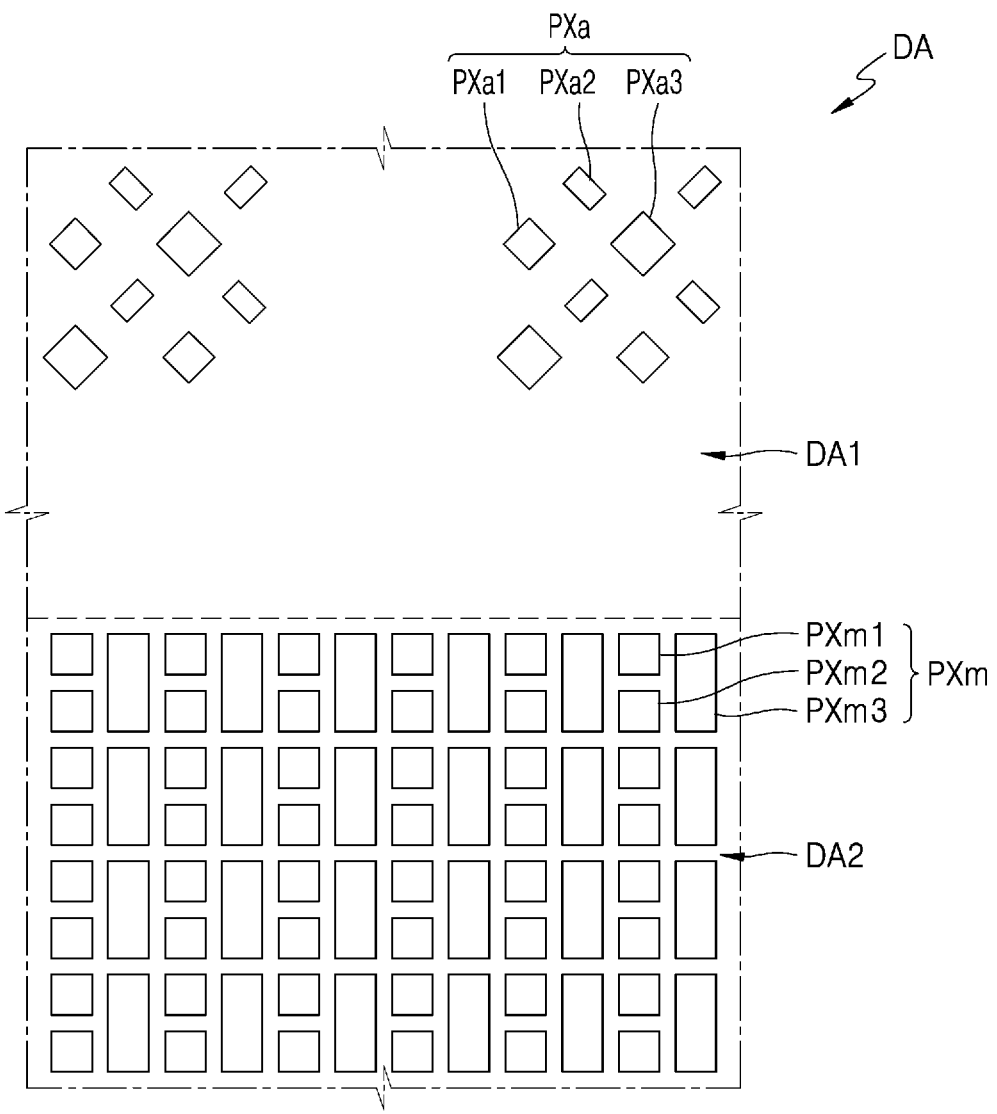
FIG. 11A is a plan view illustrating a pixel arrangement of a display device, according to some example embodiments.

FIG. 11A is a plan view illustrating a pixel arrangement of a display device, according to some example embodiments.

Referring to FIG. 11A, the auxiliary pixel PXa arranged in the first display area DA1 may include a first auxiliary pixel PXa1, a second auxiliary pixel PXa2, and a third auxiliary pixel PXa3. At this time, the first auxiliary pixel PXa1, the second auxiliary pixel PXa2, and the third auxiliary pixel PXa3 may emit different colors of light. In addition, the shapes and on-plane areas of the first auxiliary pixel PXa1, the second auxiliary pixel PXa2, and the third auxiliary pixel PXa3 may be formed the same as or different from each another.

A main pixel PXm arranged in the second display area DA2 may include a first main pixel PXm1, a second main pixel PXm2, and a third main pixel PXm3. At this time, the first main pixel PXm1, the second main pixel PXm2, and the third main pixel PXm3 may emit different colors of light, and the shape and on-plane image areas of the first main pixel PXm1, the second main pixel PXm2, and the third main pixel PXm3 may be formed the same as or different from each other.

The first main pixel PXm1, the second main pixel PXm2, and the third main pixel PXm3 may emit light of the same color as the first auxiliary pixel PXa1, the second auxiliary pixel PXa2 and the third auxiliary pixel PXa3, respectively.

The auxiliary pixel PXa and the main pixel PXm as described above may be in various forms. For example, the main pixel PXm may be arranged in an S-stripe type. At this time, regarding the S-stripe type, one of the first main pixel PXm1, the second main pixel PXm2, and the third main pixel PXm3 may be in the form of a rectangle, and the other two of the first main pixel PXm1, the second main pixel PXm2, and the third main pixel PXm3 may be in the form of a square. In this case, the remaining two of the first main pixel PXm1, the second main pixel PXm2, and the third main pixel PXm3 shown in FIG. 11A may be arranged to correspond to one of the first main pixel PXm1, the second main pixel PXm2, and the third main pixel PXm3.

The auxiliary pixel PXa may be arranged in a PenTile type having a diamond structure. In this case, regarding the first auxiliary pixel PXa1, the second auxiliary pixel PXa2, and the third auxiliary pixel PXa3, based on one of the first auxiliary pixel PXa1, the second auxiliary pixel PXa2, and the third auxiliary pixel PXa3, the other two of the first auxiliary pixel PXa1, the second auxiliary pixel PXa2, and the third auxiliary pixel PXa3 may be arranged radially.

In this case, a resolution of the first display area DA1 may be lower than that of the second display area DA2.

For example, according to some example embodiments, the area on a plane of the auxiliary pixel PXa and the area on a plane of the main pixel PXm may be different from each other, wherein the auxiliary pixel PXa and the main pixel Pxm emit light of the same color. For example, the area on a plane of the auxiliary pixel PXa may be less than the area on a plane of the main pixel PXm, wherein the auxiliary pixel PXa and the main pixel Pxm emit light of the same color.

According to some example embodiments, a distance between the centers of the main pixels PXm that are adjacent to each other and emitting the same color may be less than a distance between the centers of the auxiliary pixels PXa that are adjacent to each other and emit light of the same color.

According to some example embodiments, the number of auxiliary pixels PXa arranged in a unit area of the first display area DA1 (e.g., 1 cm² of the first display area DA1) may be less than the number of main pixels PXm arranged in a unit area of the second display area DA2 (e.g., 1 cm² of the second display area DA2). Alternatively, the number of auxiliary pixels PXa may be less than the number of main pixels PXm per equal area, wherein the auxiliary pixels PXa and the main pixels PXm are arranged in the first display area DA1 and the second display area DA2, respectively. In this case, the number of the respective pixels may be the number of pixels emitting the same color.

Figure 11B:
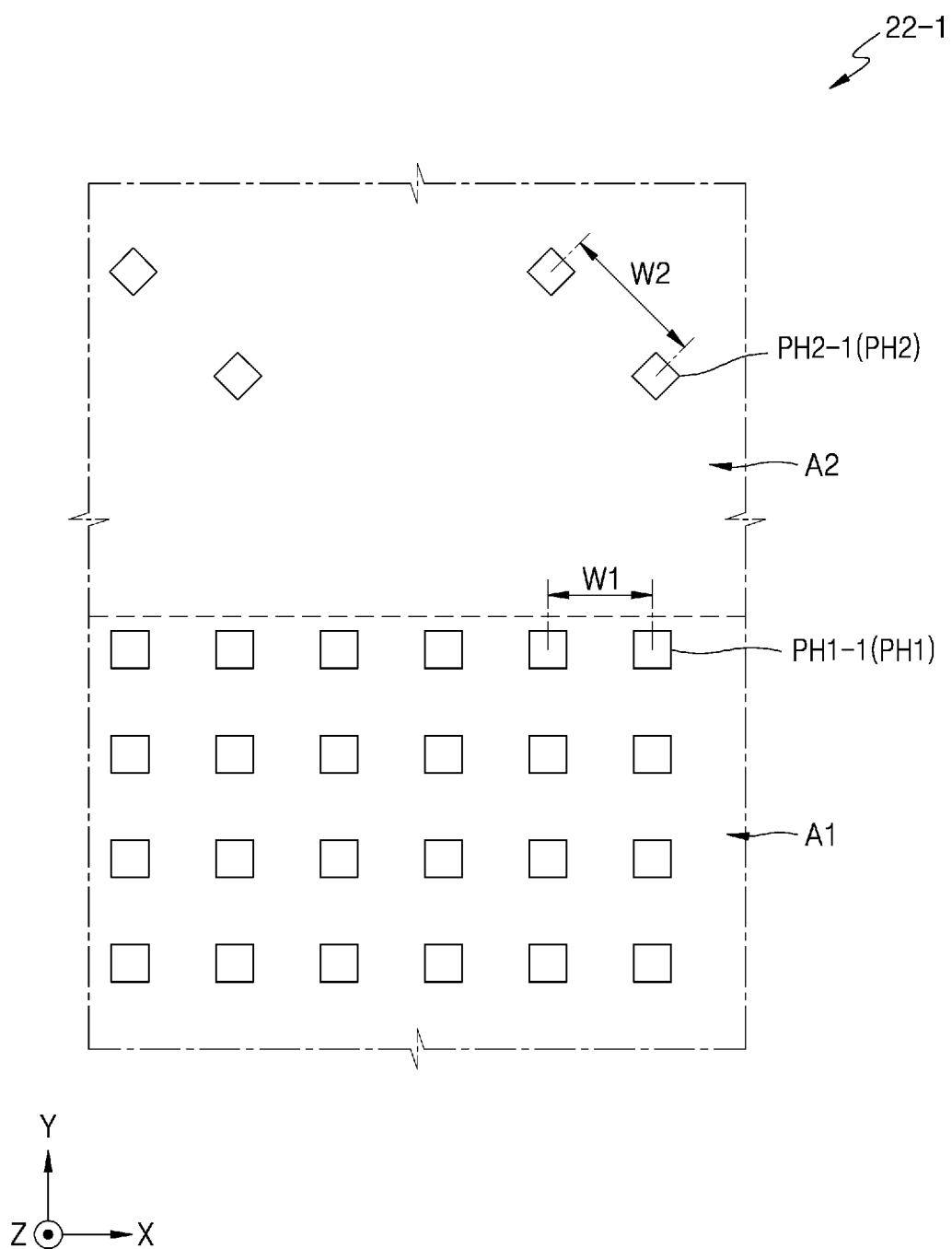
FIG. 11B is a plan view illustrating a portion of a first mask sheet used in manufacturing the first main pixel and the first auxiliary pixel shown in FIG. 11A.

FIG. 11B is a plan view illustrating a portion of a first mask sheet used in manufacturing a first main pixel and a first auxiliary pixel shown in FIG. 11A.

Referring to FIGS. 11A and 11B, pixels of the display device DD manufactured by using the first pattern hole PH1 of the mask sheet 22 may be arranged in an S-stripe shape, and pixels of the display device DD manufactured by using the second pattern hole PH2 may be arranged in a diamond-type PenTile structure.

One pattern hole may correspond to one pixel of the display device DD. For example, the deposition material deposited on the substrate through one pattern hole may form the intermediate layer 220 (see FIG. 7) of one pixel of the display device DD. The respective pixels mean emission areas that emit different colors, and may be, for example, one of a red (R) pixel, a green (G) pixel, and a blue (B) pixel.

When forming the first auxiliary pixel PXa1 and the first main pixel PXm1 through the apparatus for manufacturing the display device (1) shown in FIG. 8, a first mask sheet 22-1 may be used. At this time, the first mask sheet 22-1 may have a first-first pattern hole PH1-1 and a second-first pattern hole PH2-1 formed therein. Deposition materials that have passed through the first-first pattern hole PH1-1 and the second-first pattern hole PH2-1 may be deposited on the substrate 100, and may form a layer having a constant pattern, such as a source electrode, an organic emission layer, and a portion of a functional layer, on each of the first main pixel PXm1 and first auxiliary pixel PXa1.

The first-first pattern hole PH1-1 and the second-first pattern hole PH2-1 as described above may be formed to correspond to sizes and shapes of the first main pixel PXm1 and the first auxiliary pixel PXa1, respectively. In this case, the first-first pattern hole PH1-1 and the second-first pattern hole PH2-1 may be arranged on the first mask sheet 22-1 to correspond to the positions of the first main pixel PXm1 and the first auxiliary pixel PXa1, respectively.

In this case, the relationship between the first-first pattern hole PH1-1 and the second-first pattern hole PH2-1 may be the same as or similar to the relationship between the first main pixel PXm1 and the first auxiliary pixel PXa1. For example, the number of first-first pattern holes PH1-1 per area in the first area A1 of the first mask sheet 22-1 may be greater than the number of second-first pattern holes PH2-1 per area in the second area A2 of the first mask sheet 22-1. For example, the areas of the first area A1 and the second area A2 shown in FIG. 11B are the same, and for equal area, 24 first-first pattern holes PH1-1 may be arranged in the first area A1, and four second-first pattern holes PH2-1 may be arranged in the second area A2. Through this, the display device DD having display areas having different resolutions may be manufactured. The number of first-first pattern holes PH1-1 and second-first pattern holes PH2-1 per equal area may vary according to the designed resolution. Meanwhile, an area in which the second-first pattern hole PH2-1 is not arranged in the second area A2 may correspond to the transmission area TA of the display device DD.

In this case, a first width W1 between the first-first pattern holes PH1-1 adjacent to each other may be different from a second width W2 between the second-first pattern holes PH2-1 adjacent to each other. In this case, a width between pattern holes may be defined as a distance between centers of pattern holes adjacent to each other, a distance between edges arranged at the same position from among the edges arranged adjacent to each other, and the like. However, it will now be described in more detail on the assumption that a distance between pattern holes means a distance between the centers of the pattern holes adjacent to each other.

In this case, the first width W1 may be less than the second width W2. Through this, a width between the first main pixels PXm1 adjacent to each other formed on the display device DD may be less than a width between first sub-pixels PXa1 adjacent to each other.

In this case, the first auxiliary pixel PXa1 and the first main pixel PXm1 may emit one of red, green, or blue light. Hereinafter, for convenience of explanation, a case where the first auxiliary pixel PXa1 and the first main pixel PXm1 emit red light will be focused on and described in more detail.

Figure 11C:
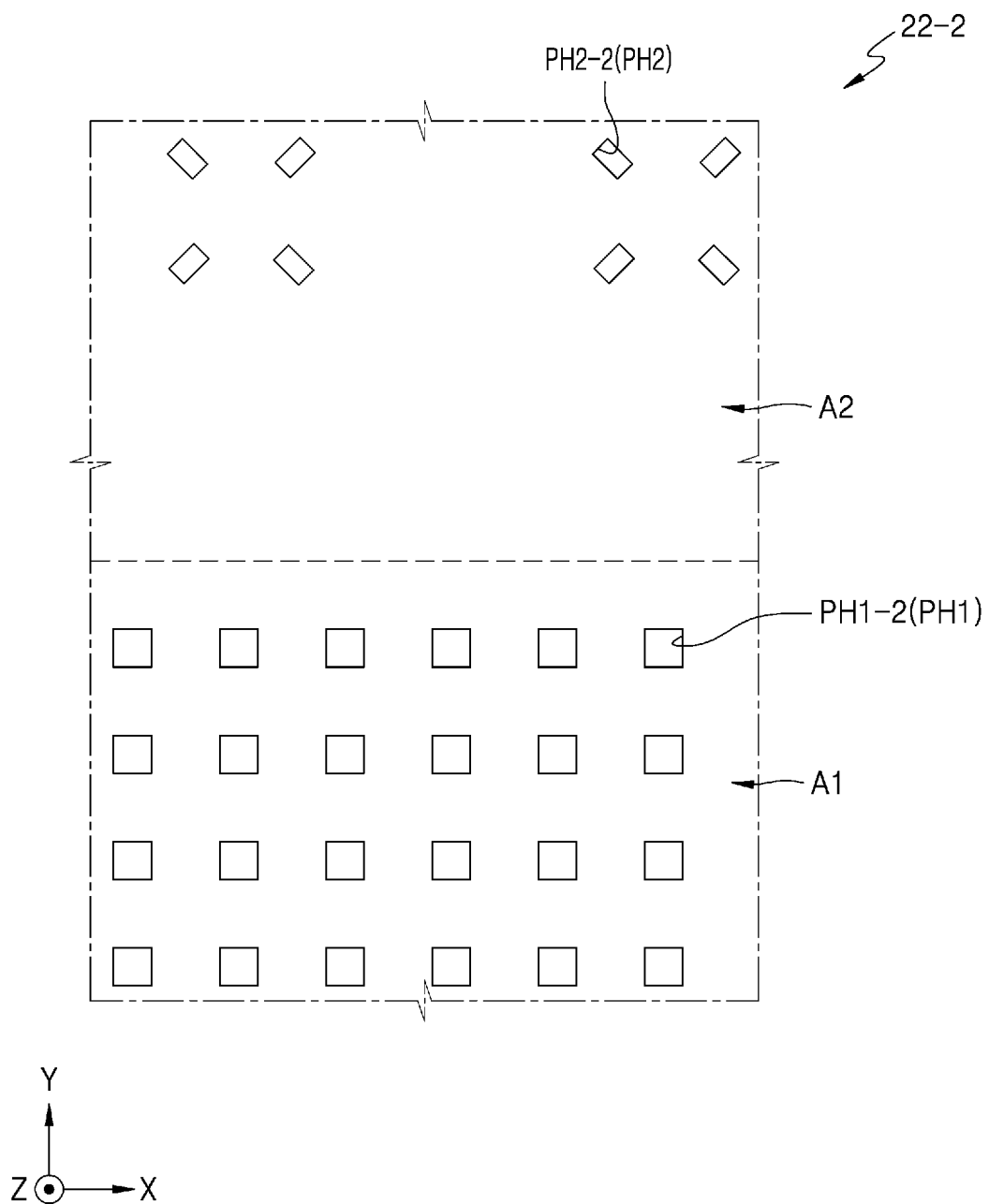
FIG. 11C is a plan view illustrating a portion of a second mask sheet used in manufacturing the second main pixel and the second auxiliary pixel shown in FIG. 11A.

FIG. 11C is a plan view illustrating a portion of a second mask sheet used in manufacturing the second main pixel and the second auxiliary pixel shown in FIG. 11A.

Referring to FIGS. 11A and 11C, a second mask sheet 22-2 may be used when forming the second auxiliary pixel PXa2 and the second main pixel PXm2 through the apparatus for manufacturing the display device (1) shown in FIG. 8. At this time, a first-second pattern hole PH1-2 and a second-second pattern hole PH2-2 may be formed in the second mask sheet 22-2. The deposition material that has passed through the first-second pattern hole PH1-2 and the second-second pattern hole PH2-2 is deposited on the substrate 100, and may form a layer having a constant pattern, such as a source electrode, an organic emission layer, a portion of a functional layer, or the like, on each of the second main pixel PXm2 and the second auxiliary pixel PXa2.

The first-second pattern hole PH1-2 and the second-second pattern hole PH2-2 as described above may be formed to correspond to the sizes and shapes of the second main pixel PXm2 and the second auxiliary pixel PXa2, respectively. In this case, the first-second pattern hole PH1-2 and the second-second pattern hole PH2-2 may be arranged on the second mask sheet 22-2 to correspond to the positions of the second auxiliary pixel PXa2 and the second main pixel PXm2, respectively. In this case, the relationship between the first-second pattern hole PH1-2 and the second-second pattern hole PH2-2 may be the same as or similar to the relationship between the first-first pattern hole PH1-1 and the second-first pattern hole PH2-1 shown in FIG. 11B. In addition, the relationship between the second auxiliary pixel PXa2 and the second main pixel PXm2 may be the same as or similar to the relationship between the first auxiliary pixel PXa1 and the first main pixel PXm1 described above.

In this case, the second auxiliary pixel PXa2 and the second main pixel PXm2 may emit one of red, green, or blue light. Hereinafter, for convenience of explanation, a case where the second auxiliary pixel PXa2 and the second main pixel PXm2 emit green light will be focused on and described in more detail.

Figure 11D:
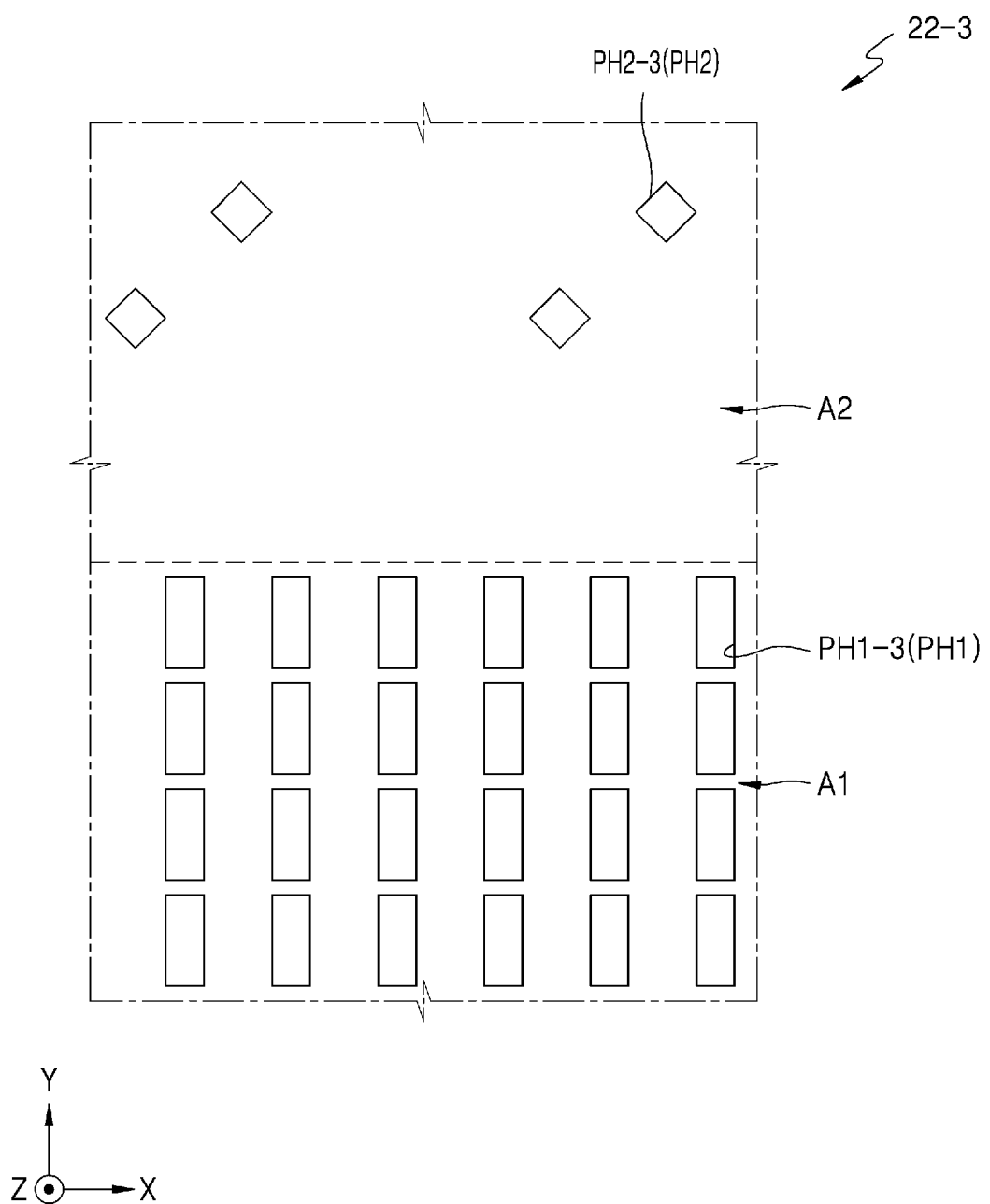
FIG. 11D is a plan view illustrating a portion of a third mask sheet used in manufacturing the third main pixel and the third auxiliary pixel shown in FIG. 11A.

FIG. 11D is a plan view illustrating a portion of a third mask sheet used in manufacturing the third main pixel and the third auxiliary pixel shown in FIG. 11A.

Referring to FIGS. 11A and 11D, a third mask sheet 22-3 may be used when forming the third auxiliary pixel PXa3 and the third main pixel PXm3 through the apparatus for manufacturing the display device (1) shown in FIG. 8. At this time, the third mask sheet 22-3 may have a first-third pattern hole PH1-3 and a second-third pattern hole PH2-3 formed therein. The deposition material that has passed through the first-third pattern hole PH1-3 and the second-third pattern hole PH2-3 is deposited on the substrate 100, and may form a layer having a constant pattern, such as a source electrode, an organic emission layer, a portion of a functional layer, or the like, at locations corresponding to the third main pixel PXm3 and the third auxiliary pixel PXa3.

The first-third pattern hole PH1-3 and the second-third pattern hole PH2-3 as described above may be formed to correspond to the sizes and shapes of the third main pixel PXm3 and the third auxiliary pixel PXa3, respectively. In this case, the first-third pattern hole PH1-3 and the second-third pattern hole PH2-3 may be arranged on the third mask sheet 22-3 to correspond to the positions of the third main pixel PXm3 and the third auxiliary pixel PXa3, respectively. In this case, the first-third pattern hole PH1-3 and the second-third pattern hole PH2-3 may have different shapes. In this case, a size of the first-third pattern hole PH1-3 may be larger than a size of the second-third pattern hole PH2-3. However, the number of second-third pattern holes PH2-3 per unit area may be greater than the number of first-third pattern holes PH1-3 per unit area, and a distance between the second-third pattern holes PH2-3 adjacent to each other may be greater than a distance between the first-third pattern holes adjacent to each other. At this time, the relationship between the third auxiliary pixel PXa3 and the third main pixel PXm3 may be the same as or similar to the relationship between the second-third pattern hole PH2-3 and the first-third pattern hole PH1-3 described above.

In this case, the third auxiliary pixel PXa3 and the third main pixel PXm3 may emit one of red, green, or blue light. Hereinafter, for convenience of explanation, a case where the third auxiliary pixel PXa3 and the third main pixel PXm3 emit blue light will be focused on and described in more detail.

On the other hand, when forming a pixel electrode or forming a layer in a pattern form while being common to all pixels of the functional layer, the mask sheet shown in FIGS. 11B to 11D may be used, or according to some example embodiments, one mask sheet may be used. When a layer common to all pixels is formed by using one mask sheet, a mask sheet in which a first pattern hole and a second pattern hole are formed may be used to correspond to all pixels as illustrated in FIG. 11A. In this case, the pattern holes of FIGS. 11B to 11D may be arranged on one mask sheet in such a way that the pattern holes do not overlap with each other.

Figure 12:
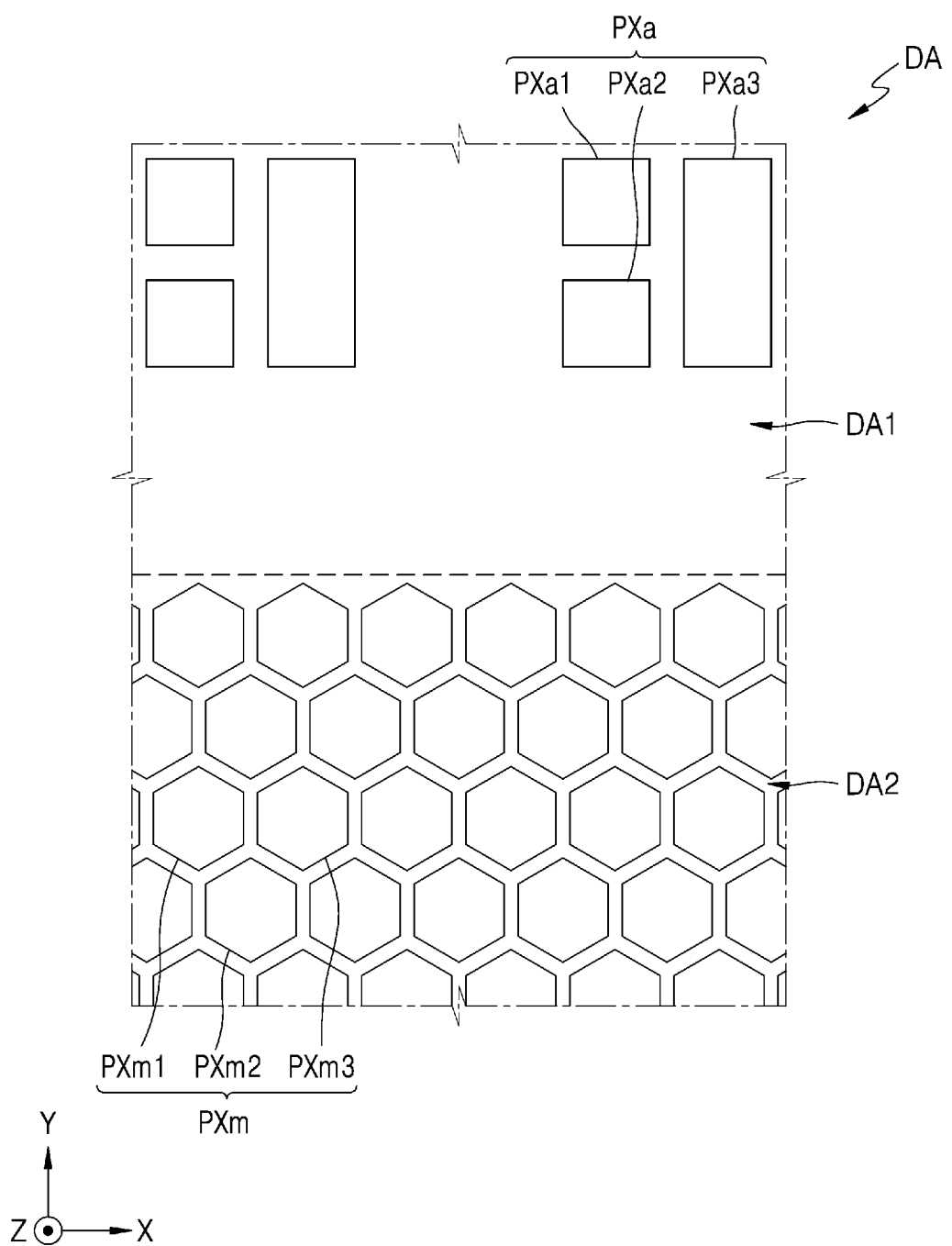
FIG. 12 is a plan view illustrating a pixel arrangement of a display device, according to some example embodiments.

FIG. 12 is a plan view illustrating a pixel arrangement of a display device, according to some example embodiments.

Referring to FIG. 12, the main pixel PXm may be a hexagon structure, and the auxiliary pixel PXa may be an S-stripe structure. At this time, in the hexagon structure, the first main pixel PXm1, the second main pixel PXm2, and the third main pixel PXm3 may have a hexagonal shape on a plane and may be arranged at regular intervals. In addition, the first auxiliary pixel PXa1, the second auxiliary pixel PXa2, and the third auxiliary pixel PXa3 may be arranged in the same form as the first main pixel PXm1, the second main pixel PXm2, and the third main pixel PXm3 shown in FIG. 11A. However, in this case, a distance between the first auxiliary pixels PXa1 adjacent to each other, a distance of the second auxiliary pixels PXa2 adjacent to each other, and a distance of the third auxiliary pixels PXa3 adjacent to each other may be respectively different from a distance between the first main pixels PXm1 adjacent to each other, a distance between the second main pixels PXm2 adjacent to each other, and a distance between the third main pixels PXm3 adjacent to each other.

Each of the auxiliary pixel PXa and the main pixel PXm as described above may be manufactured through a mask sheet having a shape similar to a shape shown in FIGS. 11B to 11D. That is, each of the pattern holes shown in FIGS. 11B to 11D may be formed to correspond to the auxiliary pixel PXa and the main pixel PXm shown in FIG. 12. In this case, the first auxiliary pixel PXa1 and the first main pixel PXm1 may be simultaneously formed on the substrate, and the second auxiliary pixel PXa2 and the second main pixel PXm2 may be simultaneously formed on the substrate. In addition, the third auxiliary pixel PXa3 and the third main pixel PXm3 may be simultaneously formed on the substrate.

Figure 13:
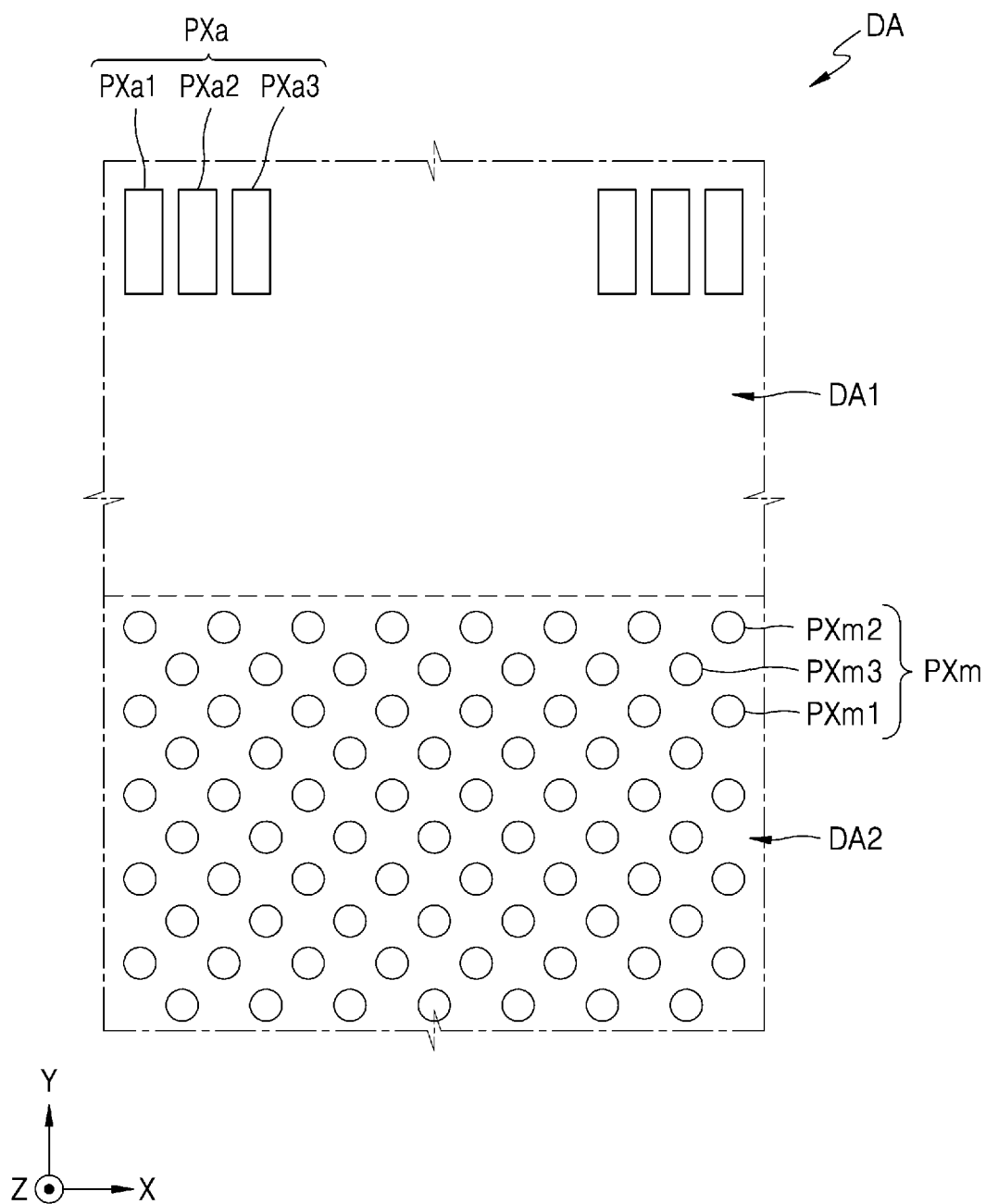
FIG. 13 is a plan view illustrating a pixel arrangement of a display device, according to some example embodiments.

FIG. 13 is a plan view illustrating a pixel arrangement of a display device, according to some example embodiments.

Referring to FIG. 13, the auxiliary pixel PXa may be arranged in a stripe shape, and the main pixel PXm may have a circular shape on a plane and be arranged in a PenTile structure. At this time, the planar shapes of the first auxiliary pixel PXa1, the second auxiliary pixel PXa2, and the third auxiliary pixel PXa3 may be linear. Further, the planar shapes of the first main pixel PXm1, the second main pixel PXm2, and the third main pixel PXm3 may be circular.

In this case, in the same area or per unit area, the area of the first auxiliary pixels PXa1 arranged in the first display area DA1 may be less than the area of the first main pixels PXm1 arranged in the second display area DA2. In the same area or per unit area, the area of the second auxiliary pixels PXa2 arranged in the first display area DA1 may be less than the area of the second main pixels PXm2 arranged in the second display area DA2. In the same area or per unit area, the area of the third auxiliary pixels PXa3 arranged in the first display area DA1 may be less than the area of the third main pixels PXm3 arranged in the second display area DA2.

The auxiliary pixel PXa and the main pixel PXm as described above may be manufactured through mask sheets having shapes similar to each of the shapes shown in FIGS. 11B to 11D. That is, each of the pattern holes shown in FIGS. 11B to 11D may be formed to correspond to the auxiliary pixel PXa and the main pixel PXm shown in FIG. 13. In this case, the first auxiliary pixel PXa1 and the first main pixel PXm1 may be simultaneously formed on the substrate, and the second auxiliary pixel PXa2 and the second main pixel PXm2 may be simultaneously formed on the substrate. In addition, the third auxiliary pixel PXa3 and the third main pixel PXm3 may be simultaneously formed on the substrate.

Figure 14:
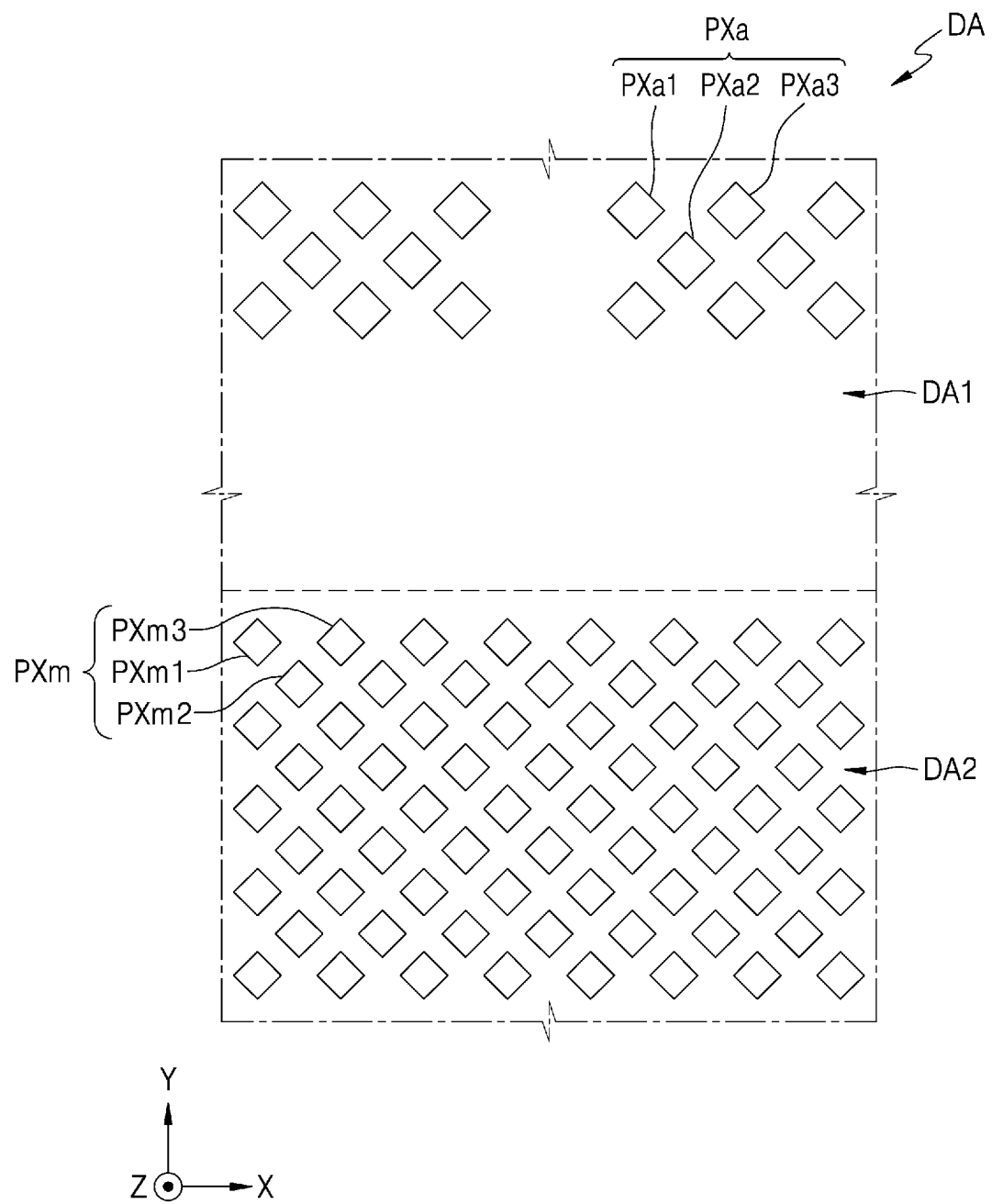
FIG. 14 is a plan view illustrating a pixel arrangement of a display device, according to some example embodiments.

FIG. 14 is a plan view illustrating a pixel arrangement of a display device, according to some example embodiments.

Referring to FIG. 14, each of the auxiliary pixel PXa and the main pixel PXm may be formed in a rhombus shape and arranged in a PenTile structure. In this case, the area on a plane of the auxiliary pixel PXa and the area on a plane of the main pixel PXm may be different from each other, wherein the auxiliary pixel PXa and the main pixel Pxm emit light of the same color. For example, the area on a plane of the main pixel PXm may be less than the area on a plane of the auxiliary pixel PXa, wherein the auxiliary pixel PXa and the main pixel Pxm emit light of the same color. For example, the area on the plane of the first main pixel PXm1 may be less than the area on the plane of the first auxiliary pixel PXa1, the area on the plane of the second main pixel PXm2 may be less than the area on the plane of the second auxiliary pixel PXa2, and the area on the plane of the third main pixel PXm3 may be less than the area on the plane of the third auxiliary pixel PXa3. In the above case, the same color of light is emitted, and per unit area, the number of main pixels PXm may be greater than the number of auxiliary pixels PXa. According to some example embodiments, the total area of main pixels PXm included in the unit area may be greater than the total area of auxiliary pixels PXa included in the unit area, wherein the main pixel PXm and the auxiliary pixel PXa emit light of the same color. Alternatively, a distance between the auxiliary pixels PXa adjacent to each other and emitting light of the same color may be greater than a distance between the main pixels PXm adjacent to each other and emitting light of the same color. In this case, a resolution of the first display area DA1 may be lower than that of the second display area DA2. The relationship between the main pixel PXm and the auxiliary pixel PXa described above may be reversed when a resolution of the first display area DA1 is greater than that of the second display area DA2.

Each of the auxiliary pixel PXa and the main pixel PXm as described above may be manufactured through mask sheets having shapes similar to the shapes shown in FIGS. 11B to 11D. That is, the pattern holes shown in FIGS. 11B to 11D may be formed to correspond to each of the auxiliary pixel PXa and the main pixel PXm shown in FIG. 14. In this case, the first auxiliary pixel PXa1 and the first main pixel PXm1 may be simultaneously formed on the substrate, and the second auxiliary pixel PXa2 and the second main pixel PXm2 may be simultaneously formed on the substrate. In addition, the third auxiliary pixel PXa3 and the third main pixel PXm3 may be simultaneously formed on the substrate.

A shape and pixel arrangement of the main pixel PXm and a shape and pixel arrangement of the auxiliary pixel PXa are not limited to the above. For example, each pixel may have an S-stripe shape, and pixels having a rectangular shape may be arranged in an X-direction. According to some example embodiments, it is also possible that all of the respective pixels may have a stripe form.

In the above case, the shape and pixel arrangement of the main pixel PXm and the auxiliary pixel PXa are not limited to the above, and may include any shape and pixel arrangement that allow the first display area DA1 to have a different resolution from a resolution of the second display area DA2.

FIGS. 15A to 15F are cross-sectional views schematically illustrating a manufacturing procedure of a mask sheet, according to some example embodiments.

Figure 15A:
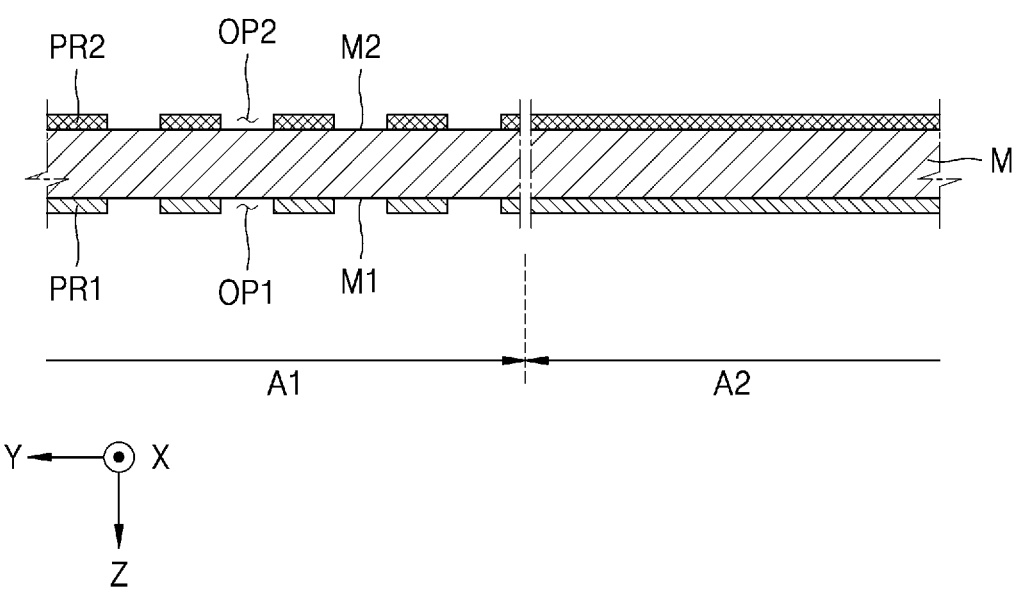
FIGS. 15A to 15F are cross-sectional views schematically illustrating a procedure for manufacturing a mask sheet, according to some example embodiments.

Referring to FIG. 15A, a base material M may be prepared to manufacture the mask sheet 22. The base material M may be in a state in which foreign substances adsorbed on each surface are removed through a polishing process, a washing process, or the like. The base material M may be a thin plate, and may include stainless steel, invar, nickel (Ni), cobalt (Co), nickel alloy, nickel-cobalt alloy, and the like.

When the base material M is prepared, a first photoresist PR1 and a second photoresist PR2 may be arranged on a first surface M1 and a second surface M2 of the base material M, respectively. At this time, the first photoresist PR1 and the second photoresist PR2 may be sequentially placed on the base material M or simultaneously placed on the base material M.

Thereafter, a first opening OP1 may be formed by exposing and performing a developer treatment on the first photoresist PR1 of the first area A1, and a second opening OP2 may be formed by exposing and developing the second photoresist PR2 of the first area A1. A position of the second opening OP2 may correspond to a position of the first opening OP1. At this time, a method of forming a photoresist opening by exposing a photoresist may be vary depending on whether the property of the photoresist is a negative method or a positive method. That is, when a photoresist is exposed and then, treated with a developer, an unexposed photoresist portion may be removed when the photoresist is a negative method, but an exposed photoresist portion may be removed when the photoresist is a positive method.

Through the above process, the first photoresist PR1 having the first opening OP1 located in the first area A1 of the base material M may be formed on the first surface M1 of the base material M, and the second photoresist PR2 having the second opening OP2 corresponding to the first opening OP1 may be formed on the second surface M2 of the base material M.

Meanwhile, as illustrated in FIG. 8, when the mask assembly 20 including the mask sheet 22 is arranged in the chamber 10, the first surface M1 may correspond to one surface of the mask sheet 22 facing the substrate 100, and the second surface may correspond to the other side of the mask sheet 22 facing the deposition source 50.

Figure 15B:
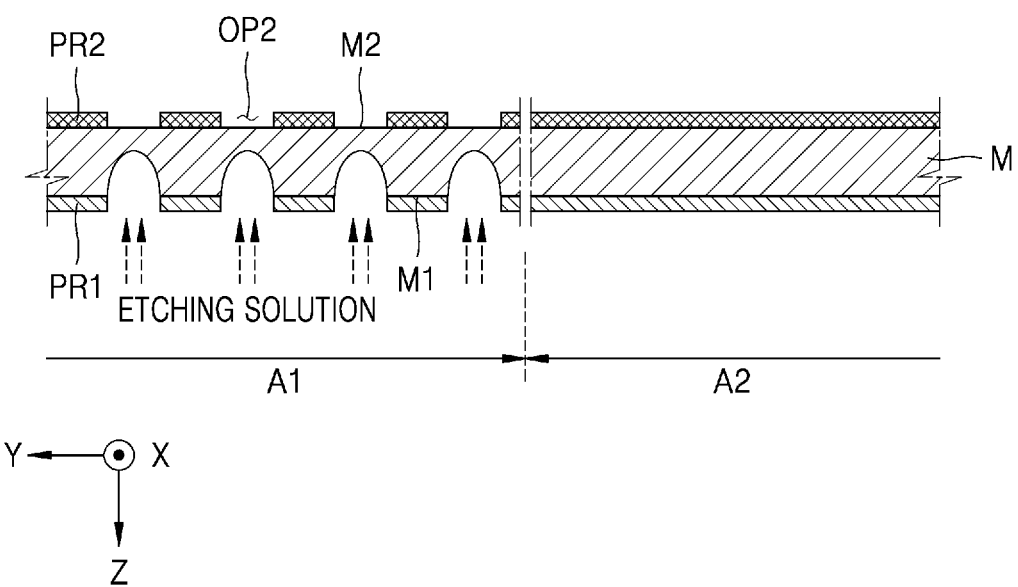

Referring to FIG. 15B, after the above process is completed, an etching solution may be sprayed on the first opening OP1. At this time, the first surface M1 of the base material M on which the first photoresist PR1 is arranged may be arranged downward, and the etching solution may be sprayed from the bottom of the first photoresist PR1 toward the first surface M1. When the etching solution is sprayed on the first opening OP1, the first surface M1 of the base material M may be partially etched at a position corresponding to the first opening OP1. Through this, a groove corresponding to the first opening OP1 may be generated in the first surface M1. Because the first opening OP1 is located only in the first area A1, a groove may not be formed in the second area A2 by the etching solution.

Figure 15C:
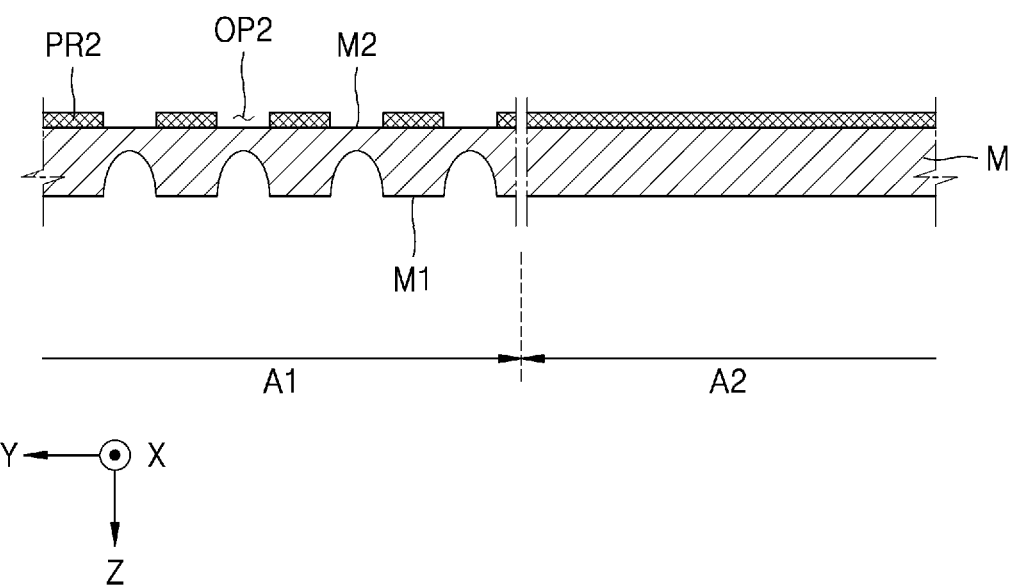

Referring to FIG. 15C, the first photoresist PR1 may be removed from the first surface M1 of the base material M. In another example, the first photoresist PR1, as described later below, may be removed together when removing the second photoresist PR2.

Figure 15D:
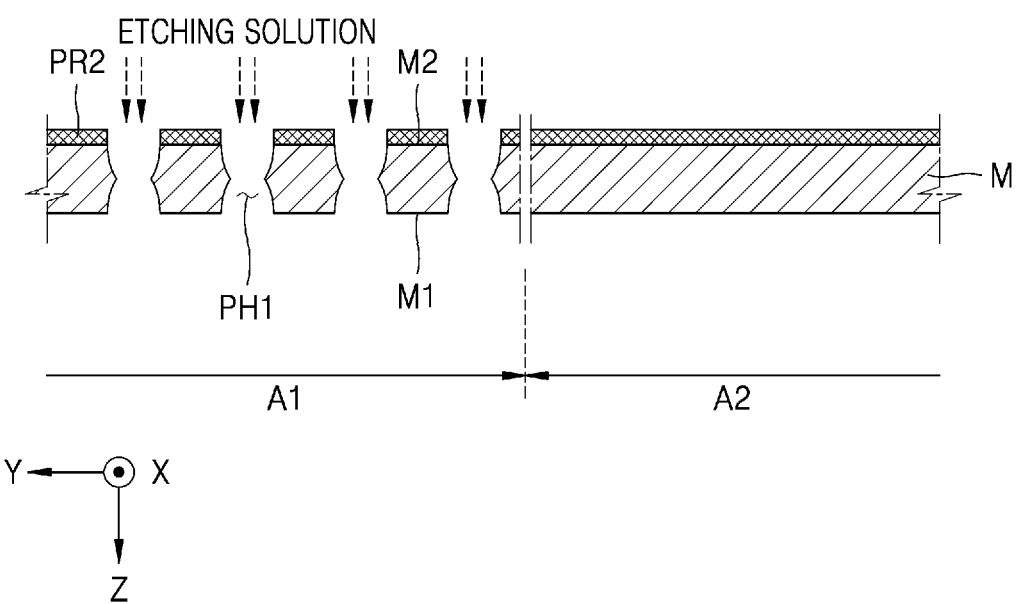

Referring to FIG. 15D, the etching solution may be sprayed on the second opening OP2. At this time, the etching solution may be sprayed from the top of the second photoresist PR2 toward the second surface M2 of the base material M. When the etching solution is sprayed on the second opening OP2, the second surface M2 of the base material M may be etched at a position corresponding to the second opening OP2, and thus, the first pattern hole PH1 penetrating through the base material M may be formed in the base material M. Because the second opening OP2 is located only in the first area A1, a hole may not be formed in the second area A2.

Figure 15E:
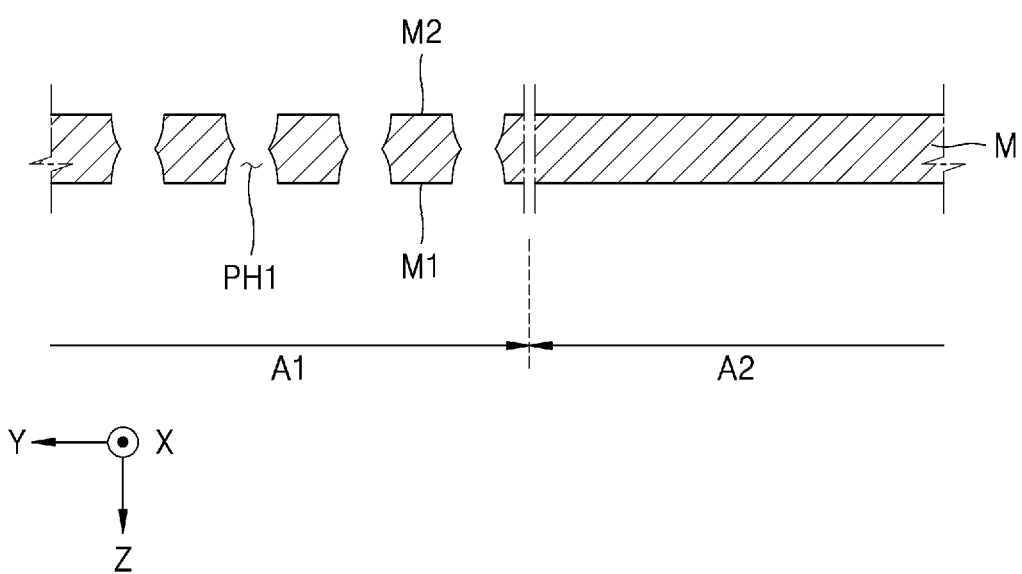

Referring to FIG. 15E, the second photoresist PR2 may be removed from the second surface M2 of the base material M.

Figure 15F:
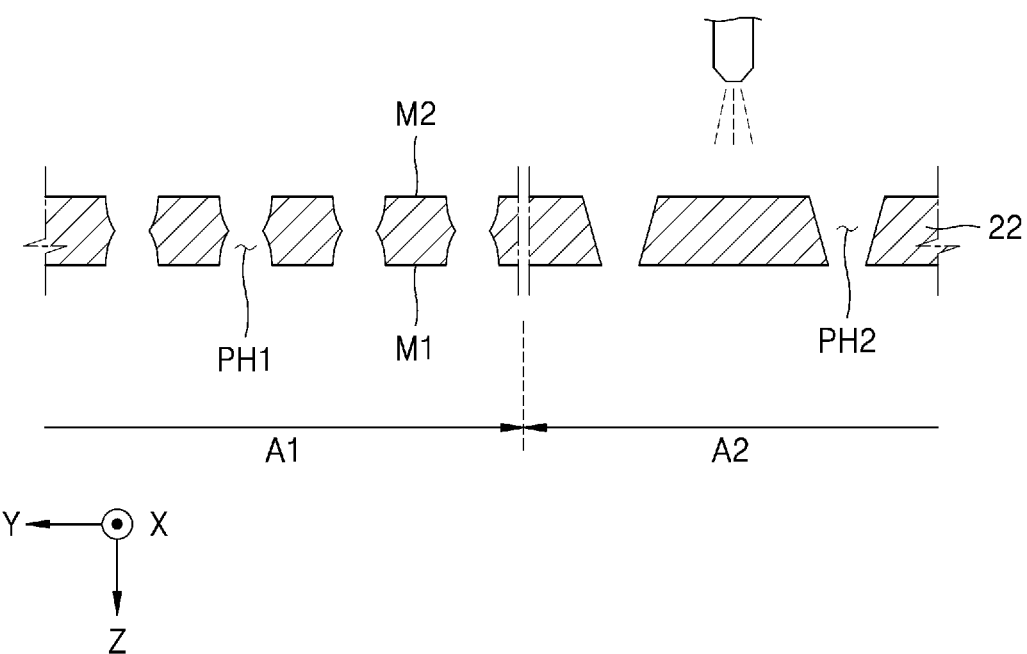

Referring to FIG. 15F, after the above process is completed, the second pattern hole PH2 may be formed by irradiating a laser beam from a preset position in the second area A2 of the base material M to the second surface M2 of the base material M through a laser processing device. At this time, the second pattern hole PH2 may be formed such that a width of the inner surface of the second pattern hole PH2 gradually increases from the first surface M1 to the second surface M2. At this time, the width may be a distance between the inner surfaces of the second pattern hole PH2 along a direction perpendicular to the thickness direction of the base material M. As another example, the second photoresist PR2 may be removed after forming the second pattern hole PH2 by irradiating a laser beam to the base material M.

According to some example embodiments, a process of forming the second pattern hole PH2 through a laser beam may be performed by repeating multiple times of processing by varying laser processing conditions, such as a depth of focus of a laser beam, a processing area, and the like. The base material M may be removed from the second surface M2 along the thickness direction of the base material M by irradiating a laser beam onto the second surface M2 of the base material M. At this time, while changing the depth of focus of the laser beam in the thickness direction of the base material M, it is possible to form a profile of the inner surface of the second pattern hole PH2.

To increase the processing precision through the laser beam, the number of laser beams, depth of focus, angle of incidence, shape, position, etc. may be controlled by using a scanner or an acousto-optic deflector (AOD). A laser processing apparatus will now be described in more detail with reference to FIG. 19.

The display device DD has a plurality of display areas, and a difference in characteristics such as shape, pixel arrangement, size, and resolution of pixels arranged in the display areas may be required between the display areas. To manufacture such a display device DD, the mask sheet 22 may also require a difference in characteristics such as shape, arrangement, size, and density of pattern holes between areas corresponding to the plurality of display areas. According to some example embodiments of the present disclosure, when forming two or more pattern holes having different characteristics on one mask sheet 22 as described above, it is possible to manufacture a mask sheet 22 with improved quality.

As a comparative example, in the case that the first pattern hole PH1 of the first area A1 of the mask sheet 22 and the second pattern hole PH2 of the second area A2 have different characteristics, when etching is performed by applying one processing condition, a processing variation between the pattern holes may increase and the processing quality of the mask sheet 22 may deteriorate. For example, a thickness of the base material M that can be used is generally different depending on the size (area) of a pattern hole to be formed. However, this cannot be considered in the comparative example, and thus, the processing quality of the pattern hole may deteriorate.

However, according to some example embodiments of the present disclosure, in the case of the first pattern hole PH1 arranged in the first area A1 of the mask sheet 22, etching is performed under processing conditions determined by considering features such as shape, pixel arrangement, size, and density of the first pattern hole PH1, and thus, consistent quality may be obtained. Further, the second pattern hole PH2 of the second area A2 may be separately formed through a laser beam, and thereby, the processing precision may be improved. Through this, it is possible to obtain a mask sheet 22 with improved overall quality.

Further, the second pattern hole PH2 may be formed in such a way that a width of the inner surface of the second pattern hole PH2 gradually increases from the first surface M1 to the second surface M2 by using a laser beam. As such, a protruding portion may not be formed in the middle of the inner surface of the second pattern hole PH2. When deposition is performed by using the second pattern hole PH2, a shadow phenomenon may be reduced and the manufacturing quality of the display device DD may be improved.

In addition, because the second pattern hole PH2 is processed by using a laser beam, precise processing is possible without restrictions on various shapes of the second pattern hole PH2.

FIGS. 16A to 16F are cross-sectional views schematically illustrating a manufacturing procedure of a mask sheet, according to some example embodiments.

The same contents as the manufacturing procedure described above with reference to FIGS. 15A to 15F will be omitted, and differences will be mainly described below.

Figure 16A:
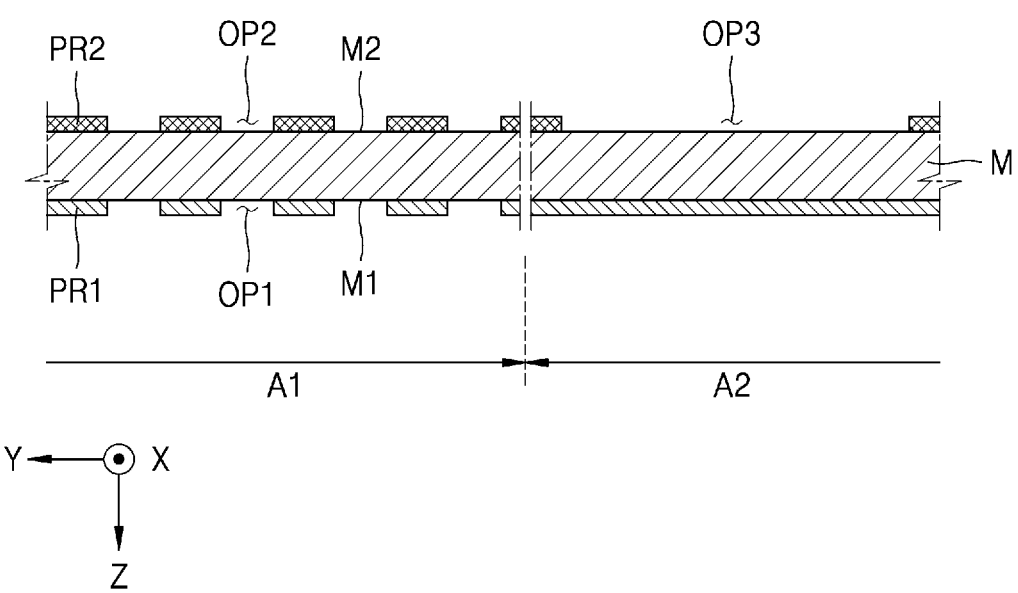
FIGS. 16A to 16F are cross-sectional views schematically illustrating a procedure for manufacturing a mask sheet, according to some example embodiments.

Referring to FIG. 16A, the first photoresist PR1 and the second photoresist PR2 may be arranged on the first surface M1 and the second surface M2 of the base material M, respectively. Thereafter, the first photoresist PR1 may be exposed and treated with a developer and may form the first opening OP1 arranged in the first area A1. The second opening OP2 arranged in the first area A1 and a third opening OP3 arranged in the second area A2 may be formed by exposing and developing the second photoresist PR2. The second opening OP2 may be formed to correspond to the first opening OP1, and the third opening OP3 may be formed to correspond to the entire second area A2.

Through the above process, the first photoresist PR1 having the first opening OP1 located in the first area A1 of the base material M may be formed on the first surface M1 of the base material M, and the second photoresist PR2 having the second opening OP2 corresponding to the first opening OP1 and the third opening OP3 formed to correspond to the entire second area A2 of the base material M may be formed on the second surface M2 of the base material M.

Figure 16B:
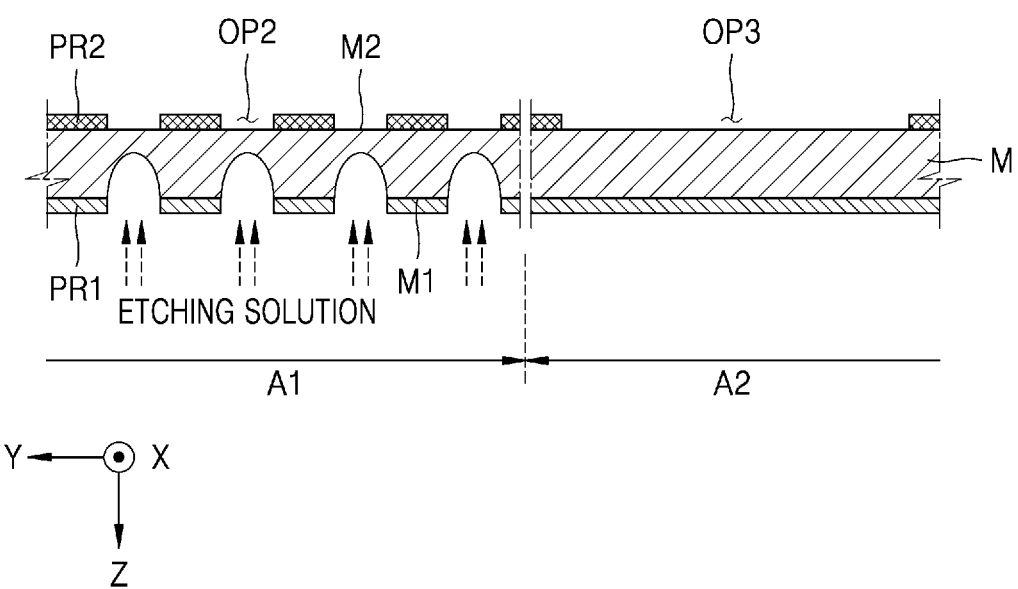

Referring to FIG. 16B, after the above process is completed, the first surface M1 of the base material M may be partially etched at a position corresponding to the first opening OP1 by spraying an etching solution on the first opening OP1. Through this, a groove corresponding to the first opening OP1 may be generated in the first surface M1.

Figure 16C:
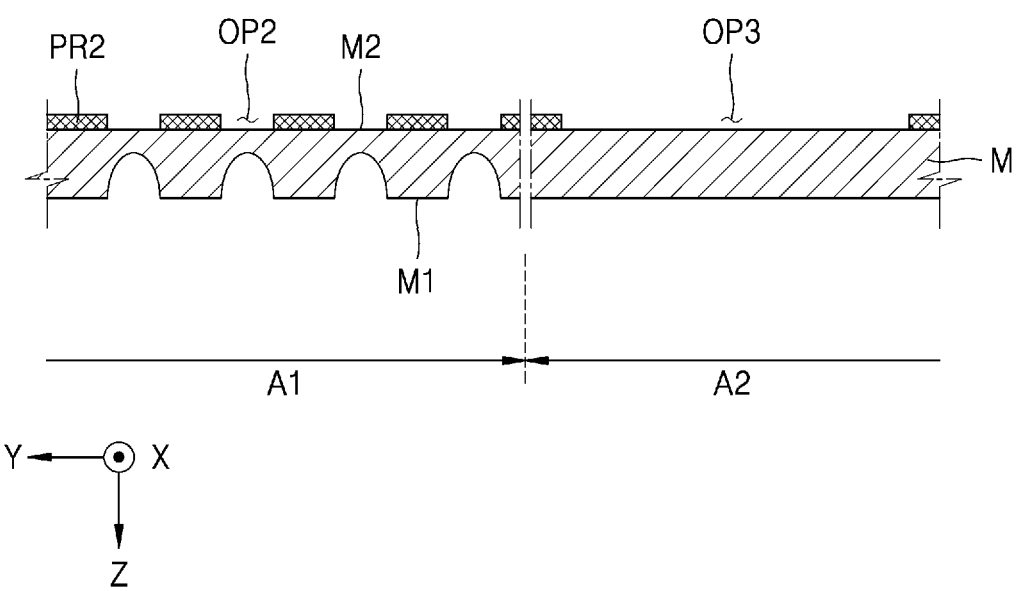

Referring to FIG. 16C, the first photoresist PR1 may be removed from the first surface M1 of the base material M.

Figure 16D:
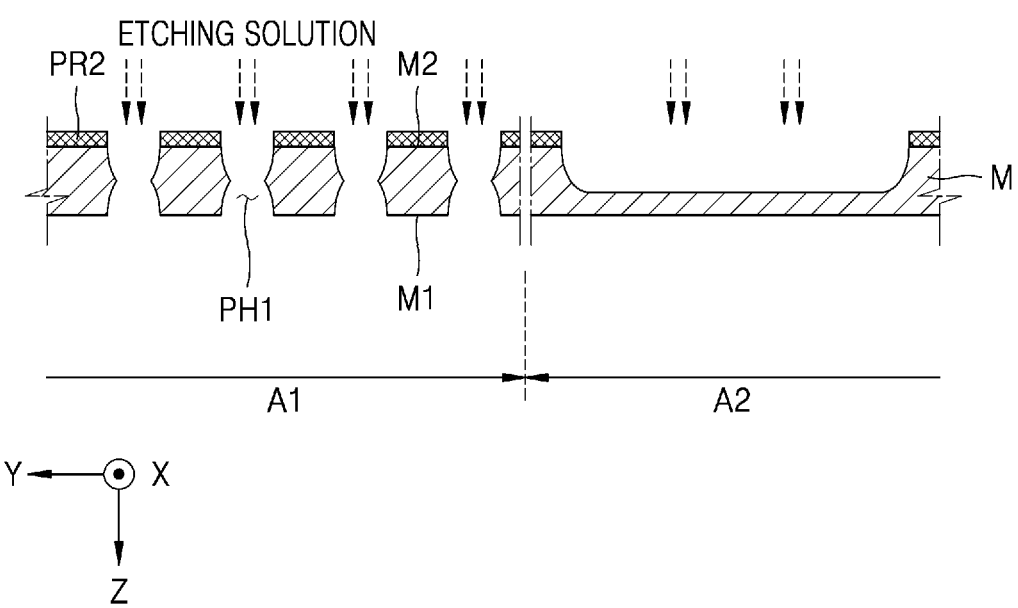

Referring to FIG. 16D, the etching solution may be sprayed on the second opening OP2 and the third opening OP3. When the etching solution is sprayed on the second opening OP2, the second surface M2 of the base material M may be etched at a position corresponding to the second opening OP2, and thus, the first pattern hole PH1 penetrating through the base material M may be formed in the base material M. When the etching solution is sprayed on the third opening OP3, the second surface M2 of the base material M may be partially etched at a position corresponding to the third opening OP3, and thus, a wide etching surface may be formed in the second area A2 of the base material M. At this time, the etched depth may be 50% or more, 60% or more, 70% or more, or 80% or more of the original thickness of the base material M.

Figure 16E:
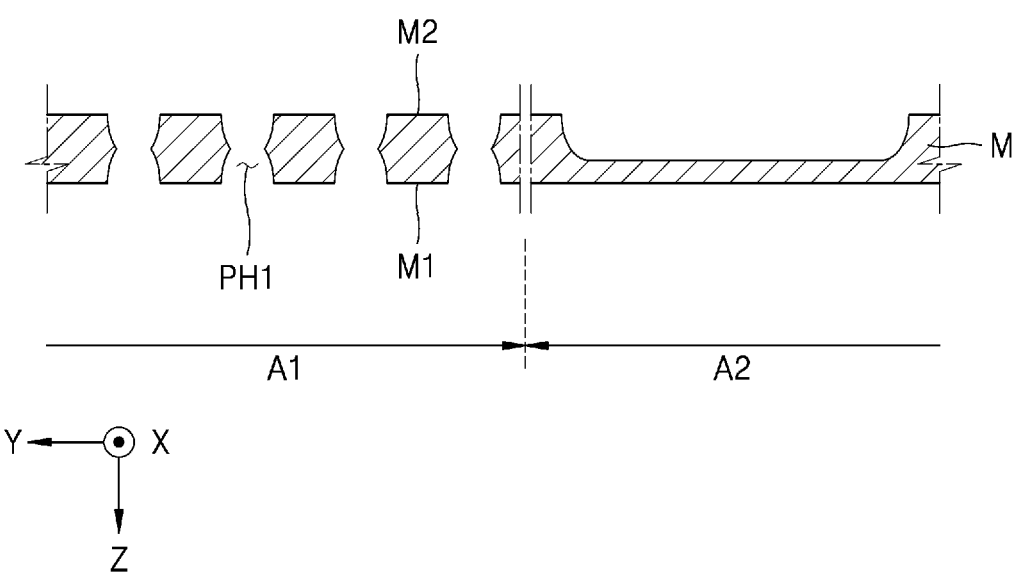

Referring to FIG. 16E, the second photoresist PR2 may be removed from the second surface M2 of the base material M.

Figure 16F:
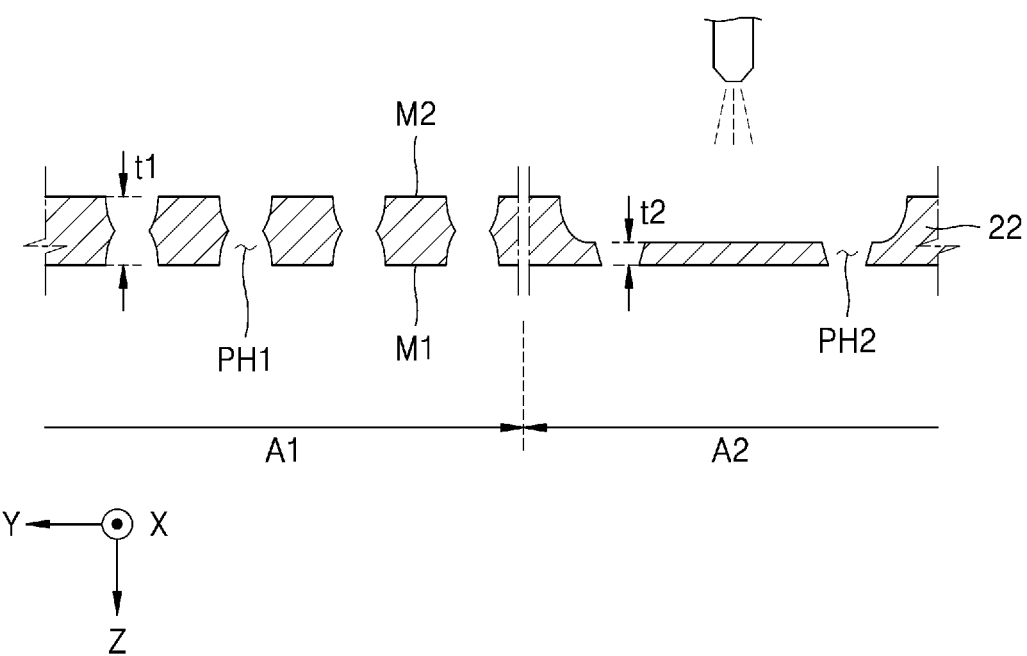

Referring to FIG. 16F, after the above process is completed, the second pattern hole PH2 may be formed by irradiating a laser beam from a preset position in the second area A2 of the base material M to an etched surface formed to correspond to the third opening OP3 in the second surface M2 of the base material M through a laser processing device from a preset position in the second area A2 of the base material M. Through this, the mask sheet 22 may be produced.

Here, a thickness of the mask sheet 22 in the first area A1 may be different from a thickness of the mask sheet 22 in the second area A2. For example, from among the thicknesses of the mask sheet 22, a thickness t1 in the first area A1 may be greater than a thickness t2 in the second area A2. A thickness in the second area A2 may be 50%, or 40%, or 30%, or 20% or less of a thickness in the first area A1.

According to some example embodiments of the present disclosure described above, because the second surface M2 of the second area A2 is partially etched before the formation of the second pattern hole PH2, the processing amount of the laser beam may be reduced. Through this, it is possible to improve the processability of the laser beam and significantly reduce the amount of dust generated during laser processing.

FIGS. 17A to 17F are cross-sectional views schematically illustrating a manufacturing procedure of a mask sheet, according to some example embodiments. The same contents as the manufacturing procedure described above with reference to FIGS. 15A to 15F will be omitted, and differences will be mainly described below.

Figure 17A:
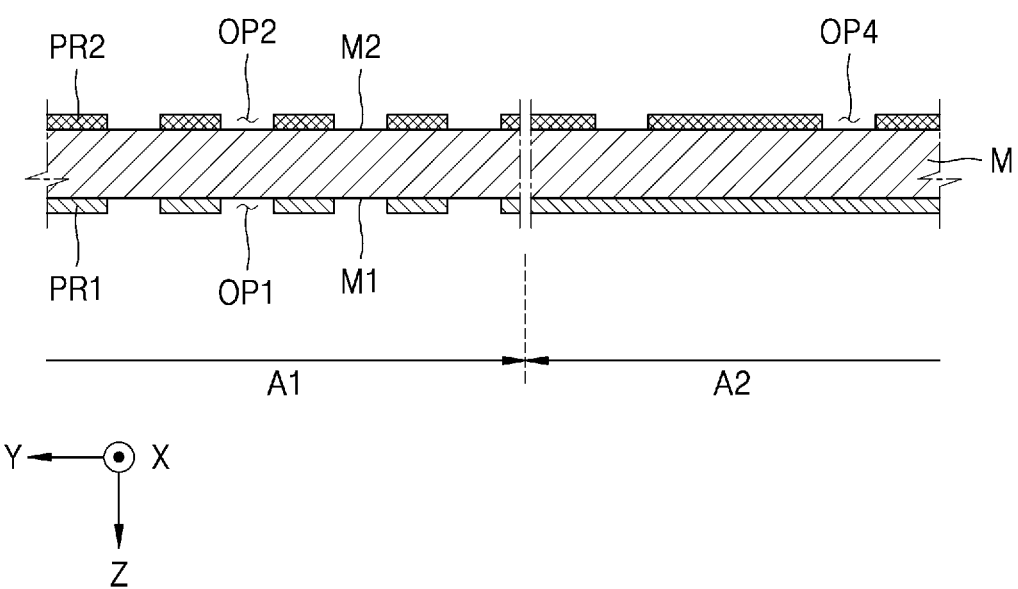
FIGS. 17A to 17G are cross-sectional views schematically illustrating a procedure for manufacturing a mask sheet, according to some example embodiments.

Referring to FIG. 17A, the first photoresist PR1 and the second photoresist PR2 may be arranged on the first surface M1 and the second surface M2 of the base material M, respectively. Thereafter, the first photoresist PR1 may be exposed and treated with a developer, and may form the first opening OP1 arranged in the first area A1. The second photoresist PR2 may be exposed and developed, and may form the second opening OP2 arranged in the first area A1 and a plurality of fourth openings OP4 arranged in the second opening OP2 as being spaced apart from each other. The second opening OP2 may correspond to the first opening OP1, and at least one fourth opening OP4 may correspond to a preset position where the second pattern hole PH2 is to be formed. Therefore, the number of at least one fourth opening OP4 may be the same as the number of second pattern holes PH2 to be formed.

Through the above process, the first photoresist PR1 having the first opening OP1 located in the first area A1 of the base material M may be formed on the first surface M1 of the base material M, and the second photoresist PR2 having the second opening OP2 corresponding to the first opening OP1 and the plurality of fourth openings OP4 arranged in the second area A2 of the base material M may be formed on the second surface M2, wherein the plurality of fourth openings OP4 are spaced apart from each other.

Figure 17B:
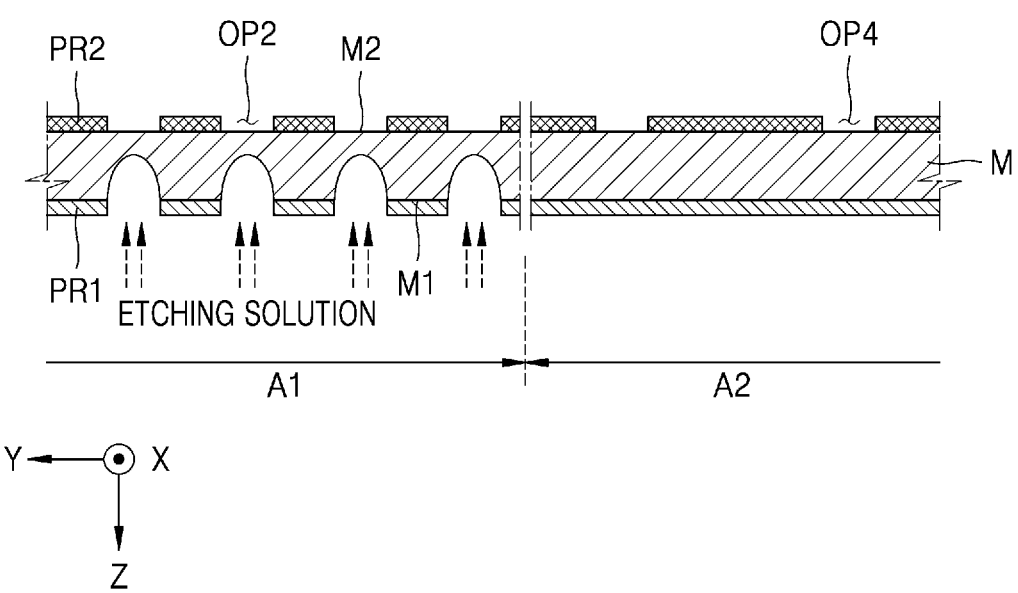

Referring to FIG. 17B, after the above process is completed, a portion of the first surface M1 of the base material M may be etched at a position corresponding to the first opening OP1 by spraying an etching solution on the first opening OP1. Through this, a groove corresponding to the first opening OP1 may be generated in the first surface M1.

Figure 17C:
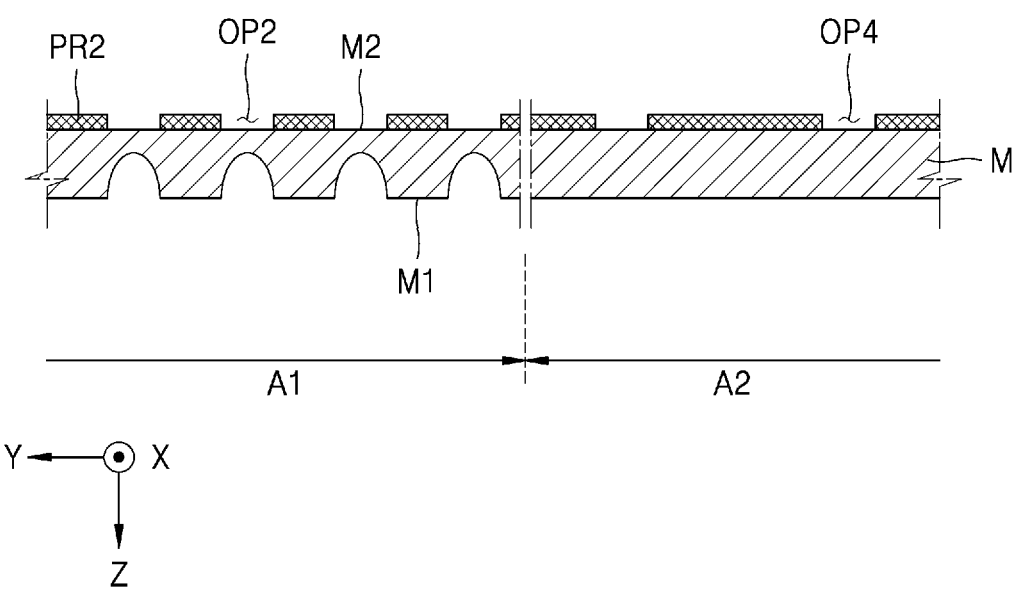

Referring to FIG. 17C, the first photoresist PR1 may be removed from the first surface M1 of the base material M.

Figure 17D:
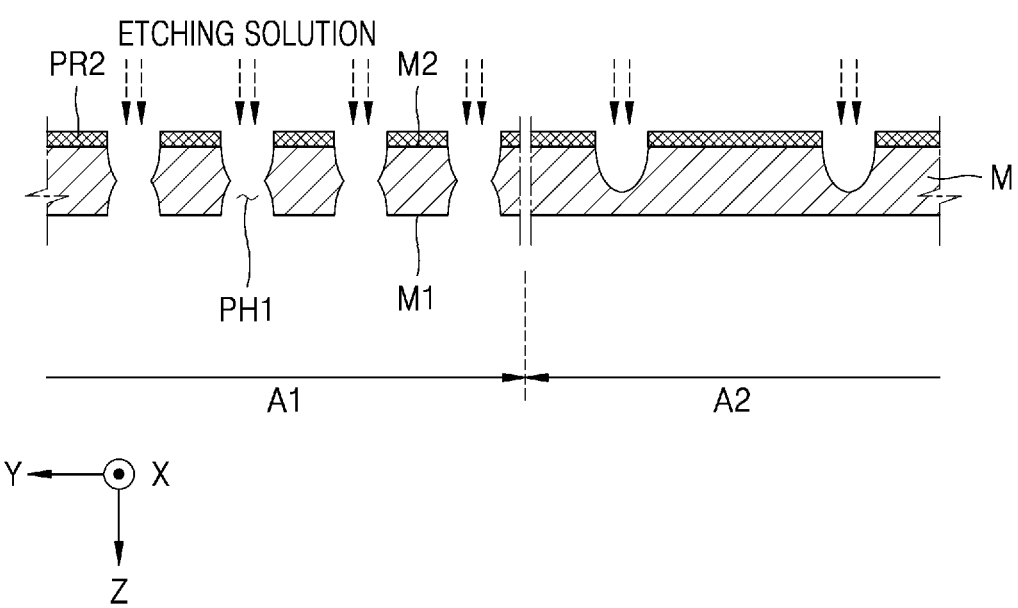

Referring to FIG. 17D, the etching solution may be sprayed on the second opening OP2 and the fourth opening OP4. When the etching solution is sprayed on the second opening OP2, the second surface M2 of the base material M may be etched at a position corresponding to the second opening OP2, and thus, the first pattern hole PH1 penetrating through the base material M may be formed in the base material M. When the etching solution is sprayed on the fourth opening OP4, the second surface M2 of the base material M may be partially etched at a position corresponding to the fourth opening OP4. At this time, the etched depth may be 50% or more, 60% or more, 70% or more, or 80% or more of the original thickness of the base material M. A size (area) of a hole formed at a position corresponding to the fourth opening OP4 may be less than a size of the second pattern hole PH2.

Figure 17E:
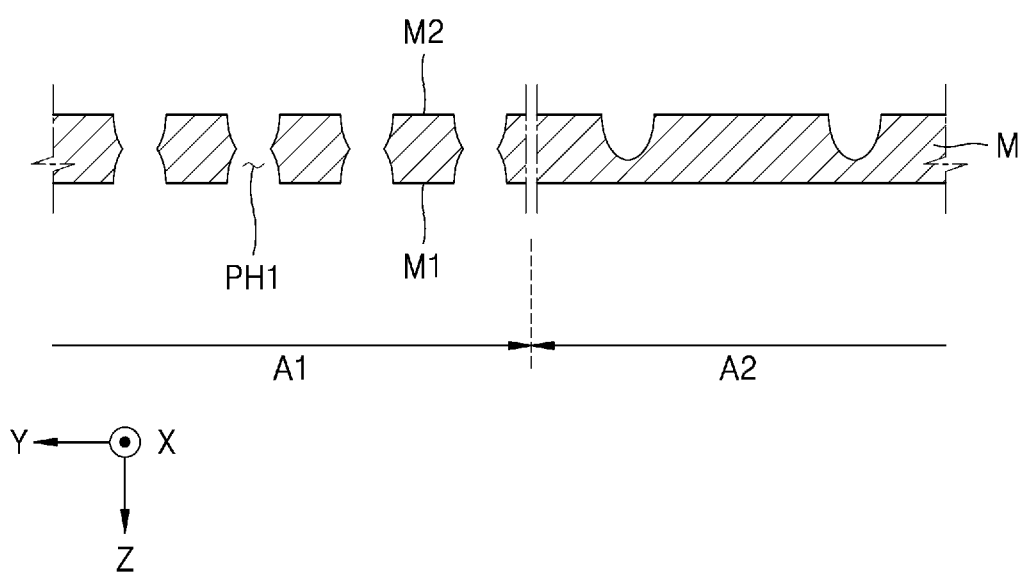

Referring to FIG. 17E, the second photoresist PR2 may be removed from the second surface M2 of the base material M.

Figure 17F:
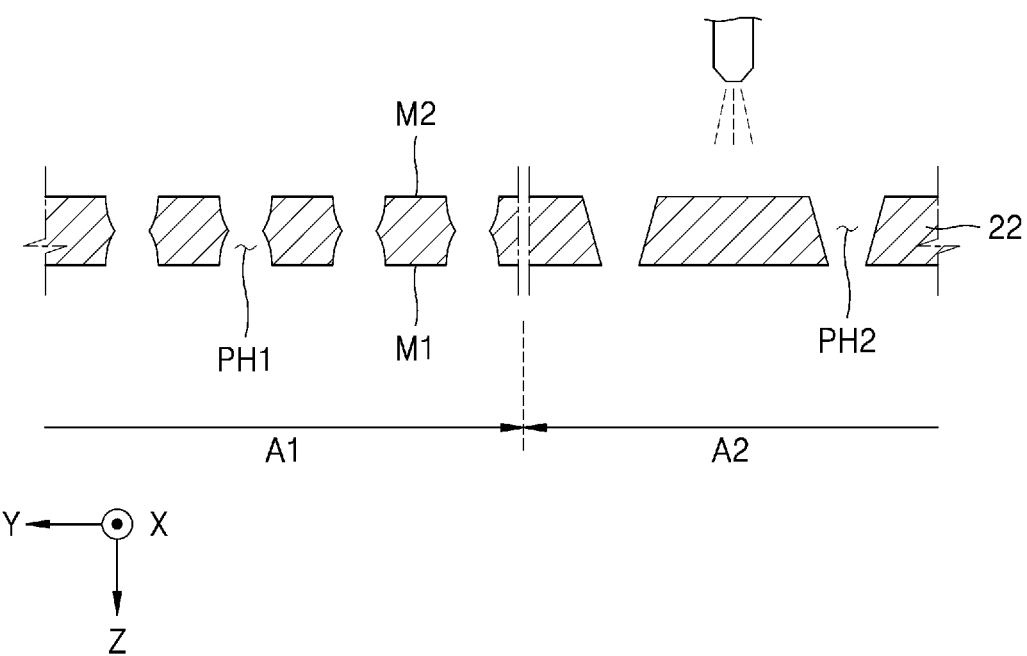

Referring to FIG. 17F, after the above process is completed, the second pattern hole PH2 may be formed by irradiating a laser beam from the second area A2 of the base material M to an etched surface formed to correspond to the fourth opening OP4 in the second surface M2 of the base material M through a laser processing device. Through this, the mask sheet 22 may be produced.

According to the above-described embodiments of the present disclosure, before forming the second pattern hole PH2, the second surface M2 of the base material M may be partially pre-etched at a position where the second pattern hole PH2 is to be formed, and thus, the laser processing amount may be reduced, and it may be relatively easy to identify the position where the second pattern hole PH2 will be formed. Thus, it is possible to manually perform laser processing, if necessary.

Figure 17G:
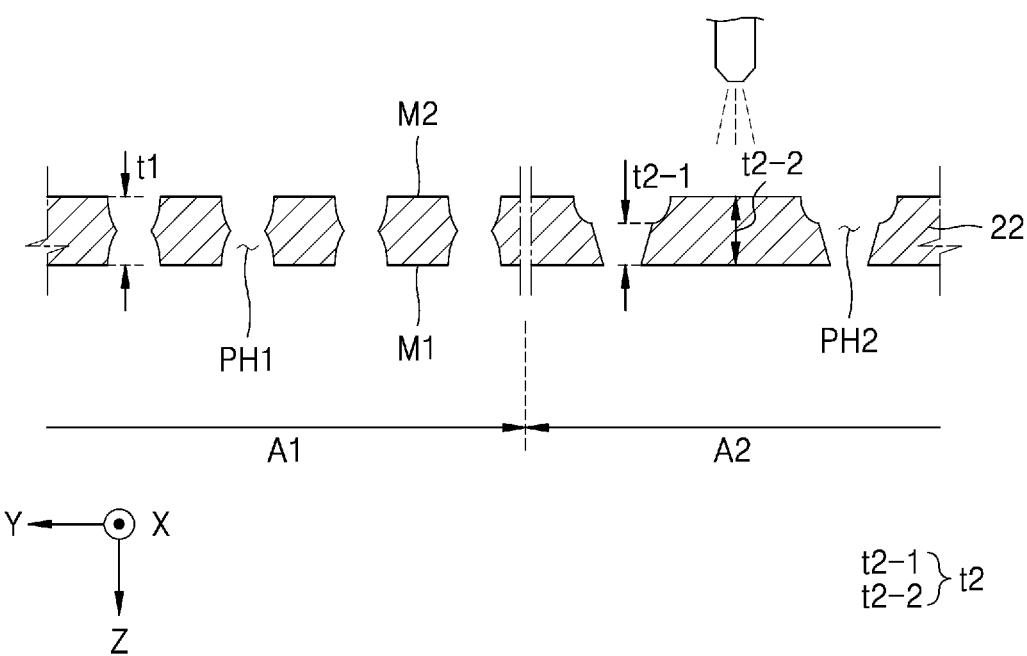

Referring to FIG. 17G, according to some example embodiments, some etched portions of the base material M may remain around the second pattern hole PH2 by the etching solution. This structure may be formed when a width of the fourth opening OP4 is greater than a width of the second pattern hole PH2. In this case, a thickness t2-1 in a peripheral area adjacent to the second pattern hole PH2 from among the thickness t2 in the second area A2 of the mask sheet 22 may be less than the thickness t1 in the first area A1, and a thickness t2-2 in an area between the second pattern hole PH2 adjacent to each other may be substantially the same as the thickness t1 in the first area A1. Before forming the second pattern hole PH2, a portion of the second surface M2 of the base material M is sufficiently pre-etched at a position where the second pattern hole PH2 is to be formed, and thus, the amount of laser processing may be reduced and a position where the second pattern hole PH2 may be easily identified.

FIGS. 18A to 18F are cross-sectional views schematically illustrating a manufacturing procedure of a mask sheet, according to some example embodiments.

Figure 18A:
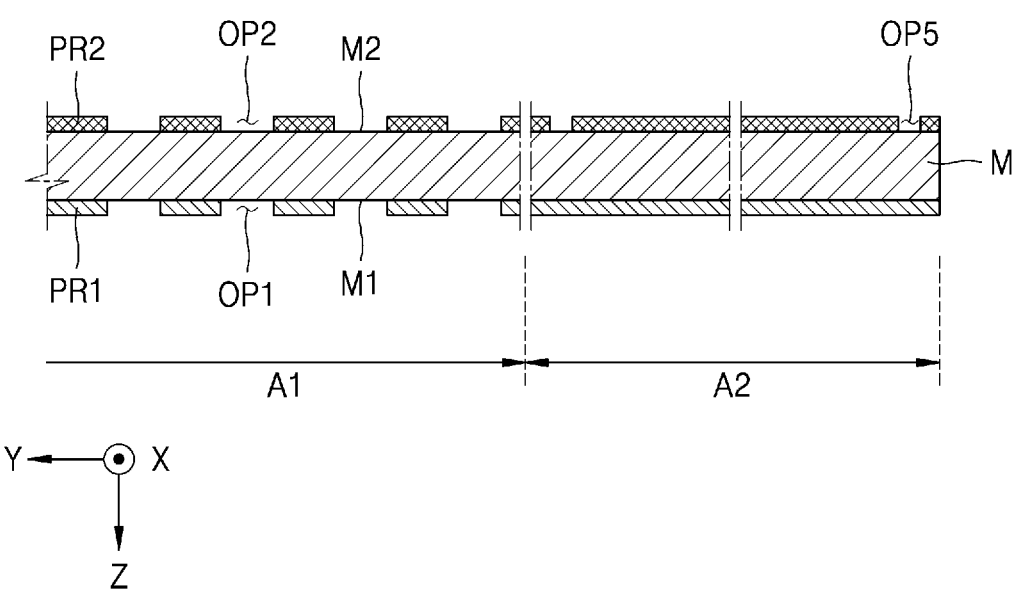
FIGS. 18A to 18F are cross-sectional views schematically illustrating a procedure for manufacturing a mask sheet, according to some example embodiments.

Referring to FIG. 18A, the first photoresist PR1 and the second photoresist PR2 may be arranged on the first surface M1 and the second surface M2 of the base material M, respectively. Thereafter, the first photoresist PR1 may be exposed and treated with a developer, and may form the first opening OP1 arranged in the first area A1. The second opening OP2 arranged in the first area A1 and a plurality of fifth openings OP5 formed at an edge of the second area A2 may be formed by exposing and developing the second photoresist PR2. The second opening OP2 may correspond to the first opening OP1.

At least two fifth openings OP5 may be formed at an edge of the second area A2. For example, when the second area A2 has a rectangular shape, the fifth opening OP5 may be arranged adjacent to corners located diagonally opposite to each other among the four corners. Alternatively, four fifth openings OP5 may be arranged adjacent to the four corners. In addition, when the second area A2 has a circular shape, at least two fifth openings OP5 may be arranged along the edge of the circumference.

Through the above process, the first photoresist PR1 having the first opening OP1 located in the first area A1 of the base material M may be formed on the first surface M1 of the base material M, and the second photoresist PR2 having the second opening OP2 corresponding to the first opening OP1 and the plurality of fifth openings OP5 formed at an edge of the second area A2 of the base material M may be formed on the second surface M2.

Figure 18B:
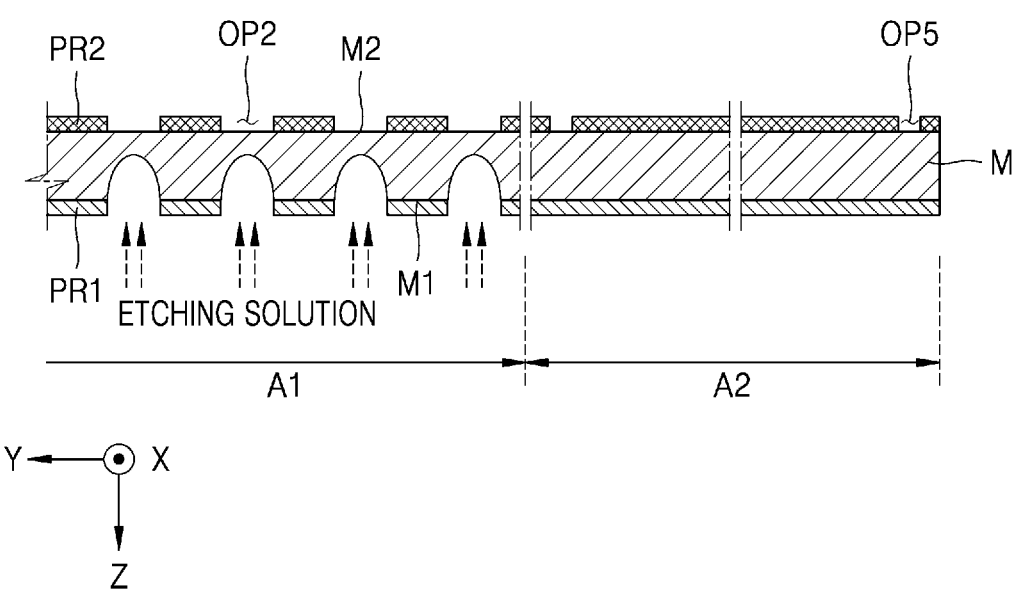

Referring to FIG. 18B, after the above process is completed, the first surface M1 of the base material M may be partially etched at a position corresponding to the first opening OP1 by spraying an etching solution on the first opening OP1. Through this, a groove corresponding to the first opening OP1 may be generated in the first surface M1.

Figure 18C:
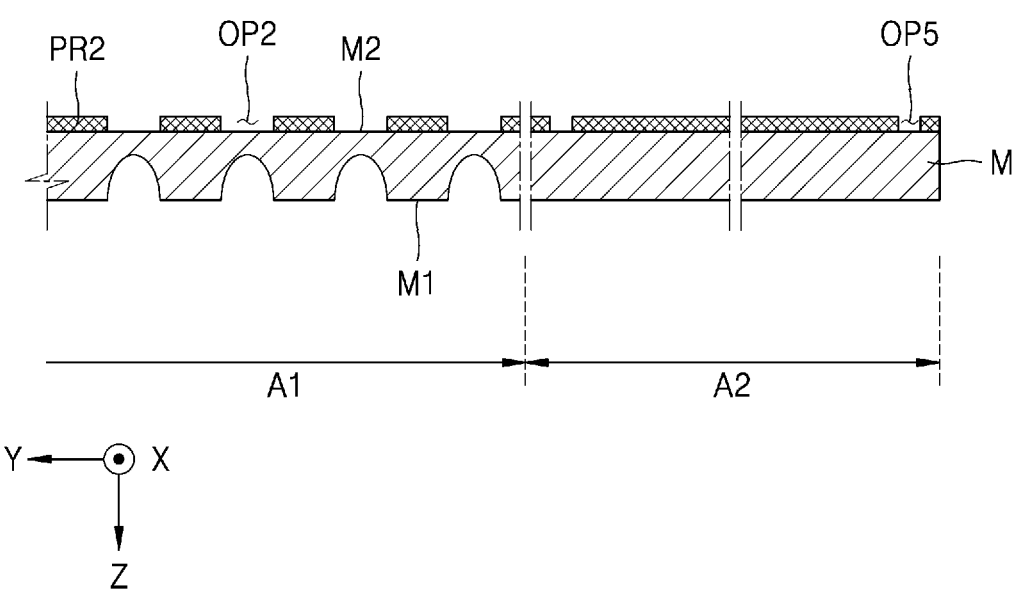

Referring to FIG. 18C, the first photoresist PR1 may be removed from the first surface M1 of the base material M.

Figure 18D:
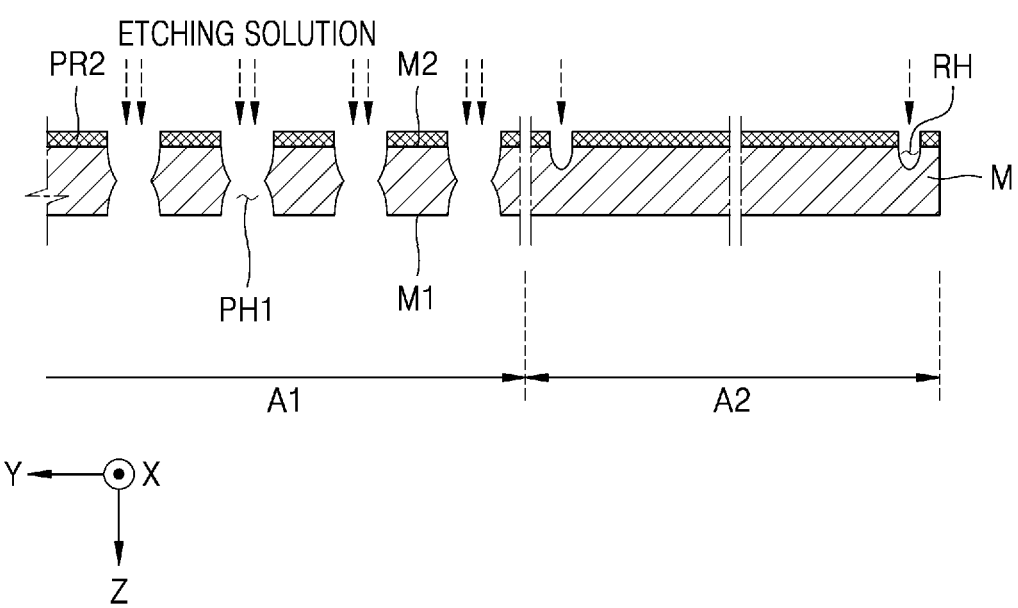

Referring to FIG. 18D, the etching solution may be sprayed on the second opening OP2 and the fifth opening OP5. When the etching solution is sprayed on the second opening OP2, the second surface M2 of the base material M may be etched at a position corresponding to the second opening OP2, and thus, the first pattern hole PH1 penetrating the base material M may be formed in the base material M. When the etching solution is sprayed on the fifth opening OP5, the second surface M2 of the base material M may be partially etched at a position corresponding to the fifth opening OP5. At this time, the etched depth may be 10% or more, 20% or more, 30% or more, 40% or more, or 50% or more of the original thickness of the base material M. Through this, at least two reference holes RH may be formed at a position corresponding to the fifth opening OP5. The reference holes RHs may be utilized to align the base material M in a processing step using a laser beam, as described in more detail with reference to FIG. 19.

Figure 18E:
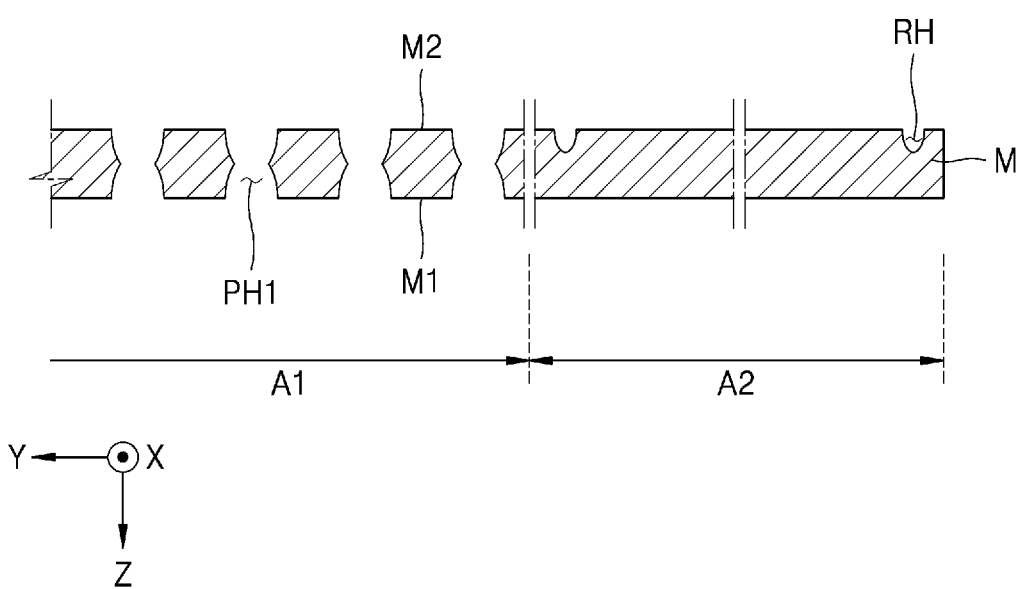

Referring to FIG. 18E, the second photoresist PR2 may be removed from the second surface M2 of the base material M.

Figure 18F:
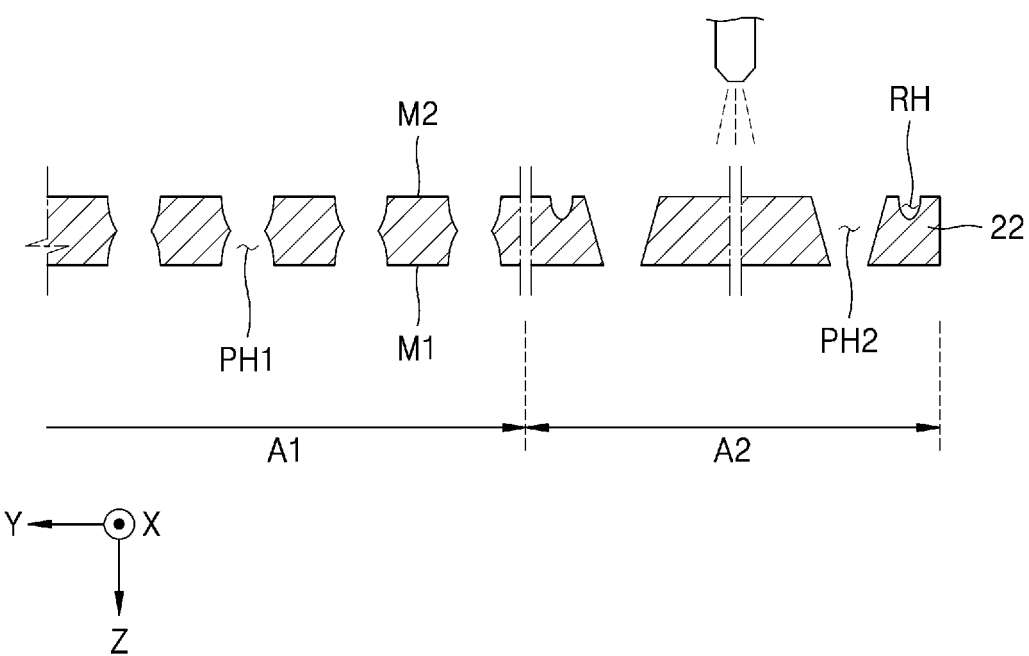

Referring to FIG. 18F, after the above process is completed, the second pattern hole PH2 may be formed by irradiating a laser beam from the second area A2 of the base material M to the second surface M2 of the base material M through a laser processing device. Through this, the mask sheet 22 may be produced.

Figure 19:
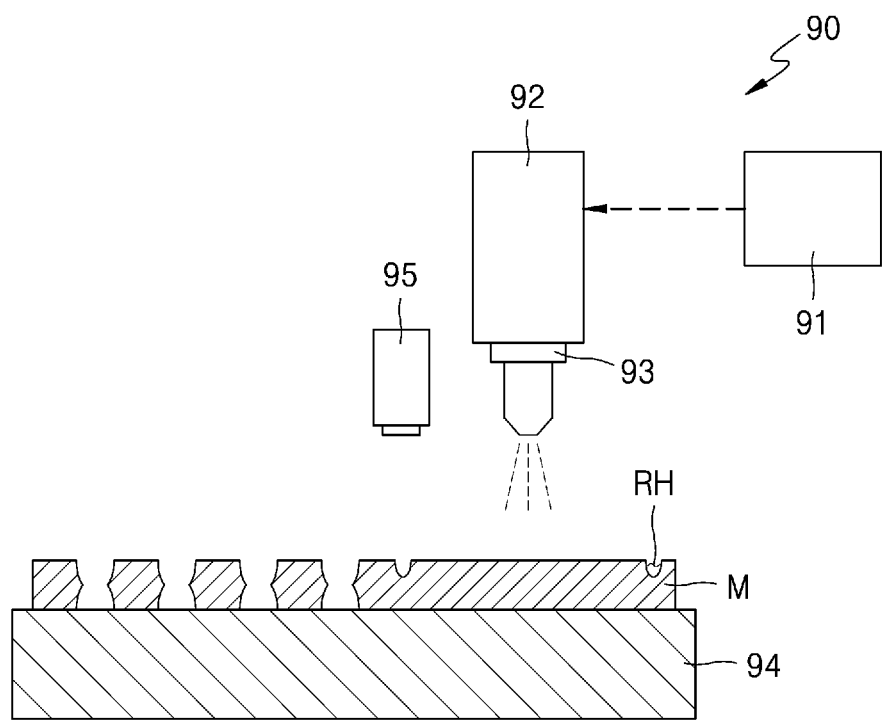
FIG. 19 is a cross-sectional view schematically illustrating a laser processing apparatus, according to some example embodiments.

FIG. 19 is a cross-sectional view schematically illustrating a laser processing apparatus, according to an embodiment;

Referring to FIG. 19, a laser processing apparatus 90 may include a laser oscillator 91, an optical system 92, a scanner 93, a stage 94, and an inspector 95.

The laser oscillator 91 may emit a pulsed laser beam to form a pattern hole in the base material M. The laser oscillator 91 may include an ultraviolet (UV) laser, a carbon dioxide ($CO_2$) laser, and the like.

The optical system 92 may receive a laser beam emitted from the laser oscillator 91 to adjust a condition to be optimum for pattern hole formation. For example, a laser beam intensity, a spot size, a radiation angle, and the number of radiations may be finely adjusted. For example, a spot size of the laser beam may be 20 μm or less, but embodiments are not limited thereto, and the spot size of the laser beam may also be changed according to the design change of the mask sheet 22 according to a resolution of the display device DD. Further, as an example, the occurrence of burrs on the surface of the mask sheet 22 may be suppressed by using an ultrashort pulse laser of between tens of femtoseconds to hundreds of picoseconds.

The scanner 93 may determine a position of a laser beam emitted from the laser oscillator 91, for example, a position of a laser beam on the second surface M2 of the base material M to be processed. The scanner 93 may include a scanner that irradiates a laser beam onto the second surface M2 of the base material M by changing a path of the laser beam.

The stage 94 may support the base material M to be processed. The base material M may be arranged above the stage 94 and may be fixed by an electrostatic chuck or the like. In addition, the stage 94 may precisely move on a plane to process the base material M at a desired position by a driver.

The inspector 95 may include a three-dimensional (3D) imaging module capable of checking a processing area of the base material M and inspecting whether processing is performed. Further, the inspector 95 may include an alignment camera that captures an image of a certain point of the base material M. After comparing image data obtained from the alignment camera and preset data and determining the degree of alignment of the base material M, the stage 94 may move through the driver by reflecting the degree of alignment. Through this, the base material M may be aligned in such a way that a processing position of the base material M to be processed corresponds to a position of the scanner 93 irradiated by the laser beam.

According to some example embodiments of the present disclosure, a reference hole RH may be used to align the base material M. The alignment camera may capture an image of the second area A2 of the base material M, which is to be an area to be processed by a laser beam, and may obtain position information of the reference hole RH arranged in the second area A2. By referring thereto, the degree of alignment of the base material M may be determined, and the stage 94 may move and the base material M may be aligned based on preset position information of the second pattern hole PH2. Through this, a laser beam may be irradiated to the correct position on the second surface M2 of the base material M, and thereby, the second pattern hole PH2 may be formed.

FIGS. 20A to 20F are cross-sectional views schematically illustrating a manufacturing procedure of a mask sheet, according to some example embodiments.

Figure 20A:
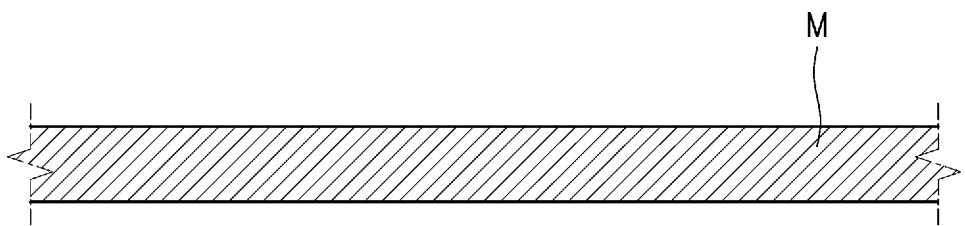
FIGS. 20A to 20F are cross-sectional views schematically illustrating a procedure for manufacturing a mask sheet, according to some example embodiments.
Figure 20A:
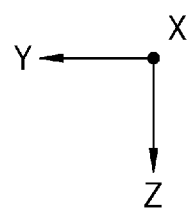

Referring to FIG. 20A, a base material M may be prepared to manufacture the mask sheet 22. The base material M may be in a state in which foreign substances adsorbed on each surface are removed through a polishing process, a washing process, or the like.

Figure 20B:
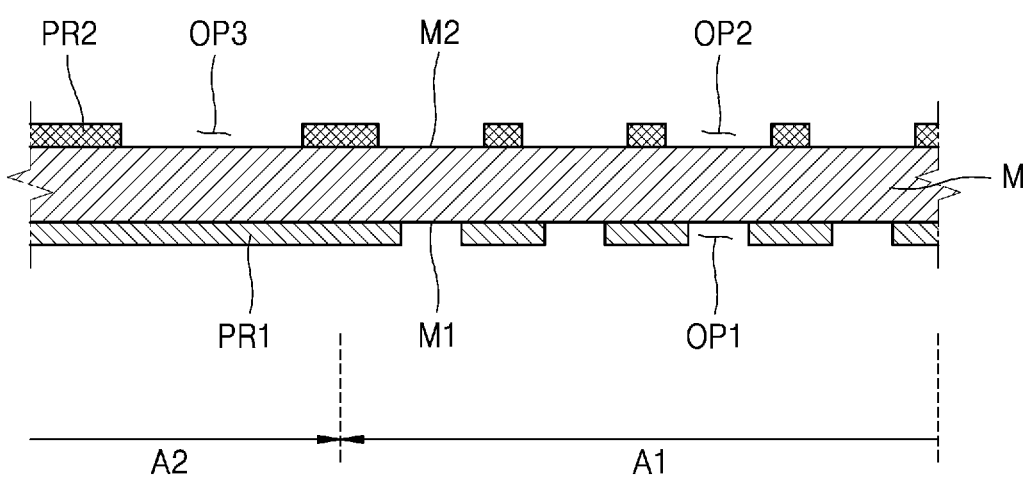

Referring to FIG. 20B, when the base material M is prepared, a first photoresist PR1 and a second photoresist PR2 may be arranged on a first surface M1 and a second surface M2 of the base material M, respectively. At this time, the first photoresist PR1 and the second photoresist PR2 may be sequentially placed on the base material M or simultaneously placed on the base material M. Thereafter, the first photoresist PR1 may be exposed and treated with a developer to form the first opening OP1, and the second photoresist PR2 may be exposed and developed to form the second opening OP2 and the third opening OP3. At this time, a method of forming a photoresist opening by exposing a photoresist may vary depending on whether the property of the photoresist is a negative method or a positive method. That is, when a photoresist is exposed and then, treated with a developer, an unexposed photoresist portion may be removed when the photoresist is a negative method, but an exposed photoresist portion may be removed when the photoresist is a positive method.

Figure 20C:
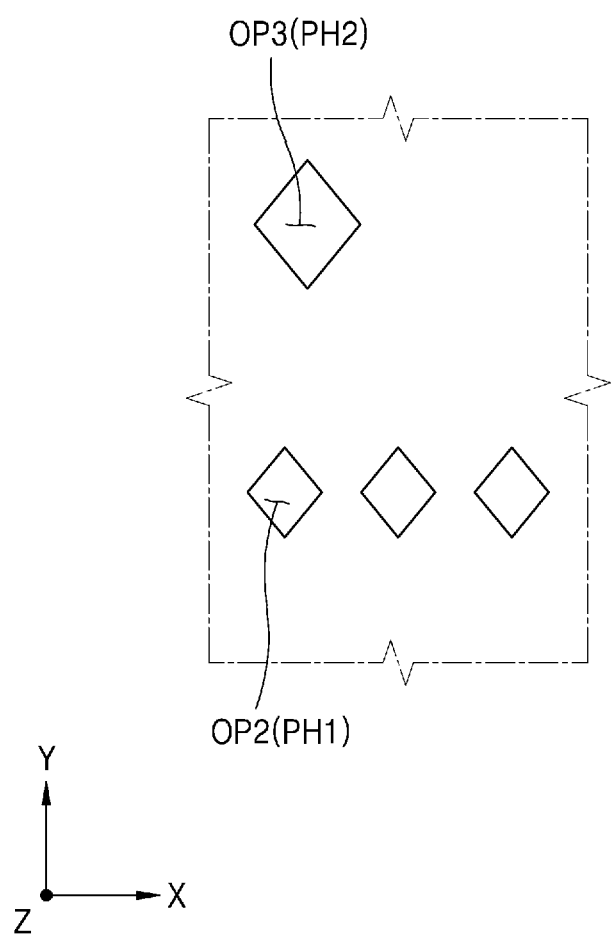

Referring to FIG. 20C, when the first photoresist PR1 and the second photoresist PR2 are arranged on the base material M as described above, the sizes of the second opening OP2 and the third opening OP3 on a plane may be different from each other. For example, when a shape of the second opening OP2 and a shape of the third opening OP3 are the same, the area of the second opening OP2 may be less on a plane than the area of the third opening OP3. At this time, the number of a plurality of second openings OP2 may be greater than the number of third openings OP3 arranged per unit area or equal area.

In this case, the second opening OP2 may correspond to the first pattern hole PH1, and the third opening OP3 may correspond to the second pattern hole PH2. When the first pattern hole PH1 and the second pattern hole PH2 are formed after the process, which will be described later below, is completed, the relationship between the first pattern hole PH1 and the second pattern hole PH2 may be similar to the relationship between the second opening OP2 and the third opening OP3. That is, a plane size of the second pattern hole PH2 arranged on one surface of the mask sheet 22 may be greater than or equal to a plane size of the first pattern hole PH1 arranged on one surface of the same mask sheet 22. However, the number of first pattern holes PH1 may be greater than the number of second pattern holes PH2 per equal area.

The above relationship can be applied to all of the embodiments of the present disclosure. In addition, the above relationship may be formed by the first pattern hole PH1. In addition, the above relationship may be formed by a second intermediate layer arranged in the first display area, and the second intermediate layer. Additionally, the above relationship may be applied in the same manner to the relationship with a first intermediate layer arranged in the second display area.

Figure 20D:
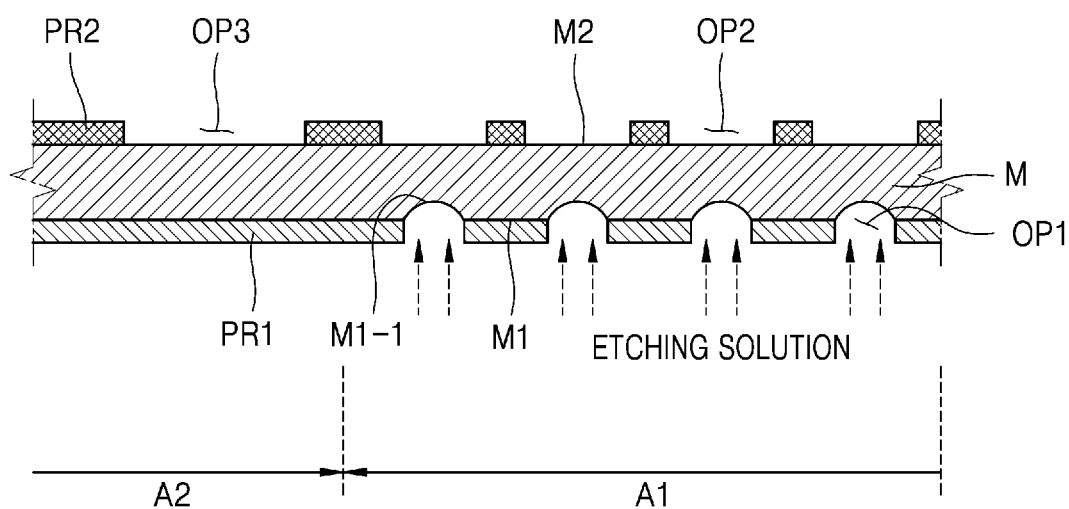

Referring to FIG. 20D, after the above process is completed, an etching solution may be sprayed on the first opening OP1. At this time, the first surface M1 of the base material M on which the first photoresist PR1 is arranged may be arranged opposite the lower surface, and an etching solution may be sprayed from the bottom of the first photoresist PR1 to the upper surface.

When the etching solution is sprayed on the first opening OP1 as described above, a first groove M1-1 may be formed in the base material M to correspond to the first opening OP1. Thereafter, the first photoresist PR1 may be removed from the first surface M1 of the base material M.

Figure 20E:
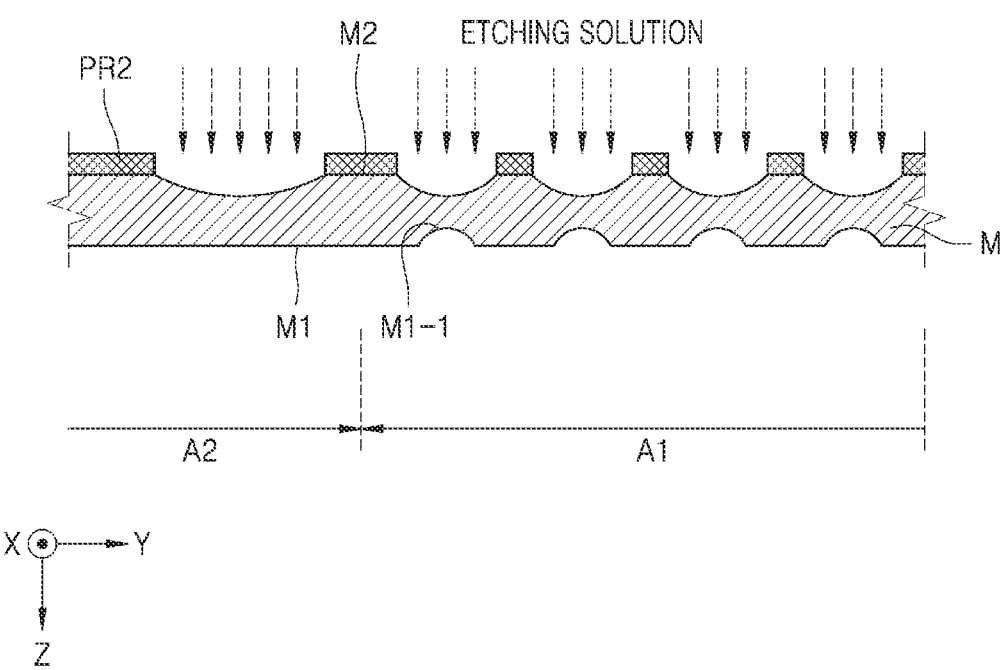
Figure 20F:
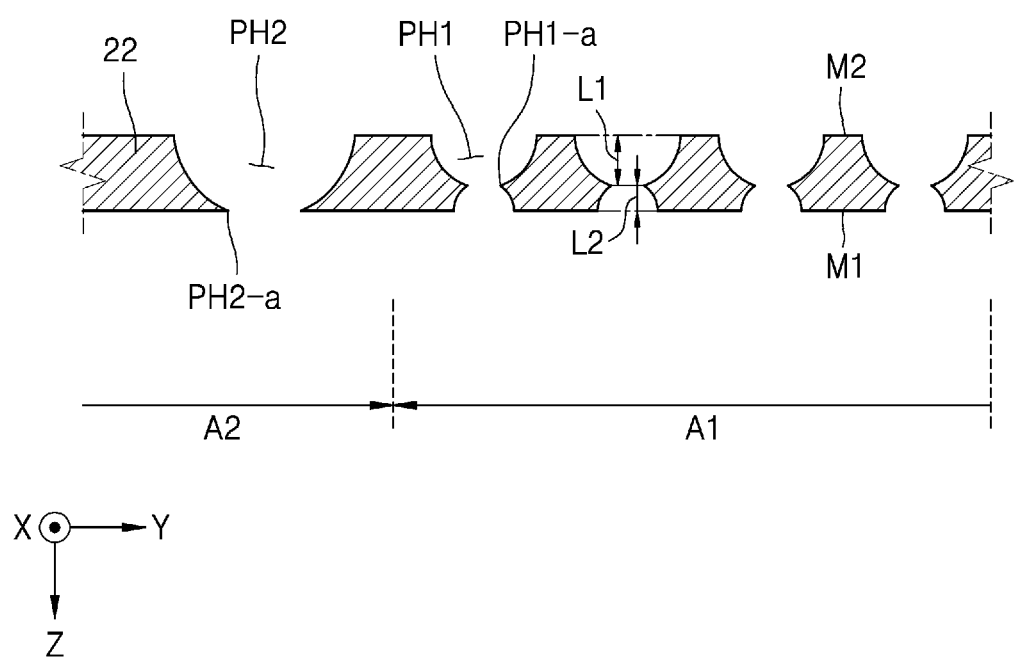

Referring to FIG. 20E, after the above process is completed, an etching solution may be sprayed on the second opening OP2 and the third opening OP3. At this time, the etching solution may be sprayed from the upper surface of the base material M in the direction of the second surface M2 of the base material M.

When the above process is completed, the etching solution may pass through the second opening OP2 and the third opening OP3 and may remove a portion of the base material M. At this time, the etching solution that has passed through the second opening OP2 may be connected to the first groove M1-1 of the first surface M1 formed to correspond to the first opening OP1 by removing the base material M from the second surface M2 of the base material M to the first surface M1 of the base material M in the thickness direction of the base material M so that the first pattern hole PH1 may be formed. In addition, the etching solution that has passed through the third opening OP3 may remove the second surface M2 of the base material M to the first surface M1, to thereby form the second pattern hole PH2.

In this case, the degree of etching of the base material M by the etching solution may be adjusted due to a difference between a width of the second opening OP2 (or the area on the plane) and a width of the first opening OP1 (or the area on the plane). The width of the second opening OP2 (or the area on the plane) is formed larger than the width of the first opening OP1 (or the area on the plane), and thereby, even when the same etching solution is sprayed at the same time, a distance etched in the thickness direction of the base material M may be adjusted. (See FIG. 20C) In other words, in this case, a thickness at which the base material M is etched by the etching solution passing through the second opening OP2 may be greater than a thickness at which the base material M is etched by the etching solution passing through the first opening OP1.

In the above case, a second protruding portion PH2-*a* is not arranged inside the second pattern hole PH2, while a first protruding portion PH1-*a* may be arranged inside the first pattern hole PH1. That is, the second protruding portion PH2-*a* may be arranged at the end of the second pattern hole PH2, and the first protruding portion PH1-*a* may protrude into the first pattern hole PH1.

In this case, a first distance L1 between the first surface M1 and the first protruding portion PH1-*a* may be different from a second distance L2 between the second surface M2 and the first protruding portion PH1-*a*. The first distance L1 between the first surface M1 and the first protruding portion PH1-*a* may be greater than the second distance L2 between the second surface M2 and the first protruding portion PH1-*a*. In this case, the first surface M1 may be a surface facing the substrate 100 when the mask sheet 22 is arranged on the apparatus for manufacturing the display device (1) shown in FIG. 8.

Therefore, in the method of manufacturing the display device, it is possible that the second protruding portion is not formed in the second pattern hole PH2 portion used when forming an intermediate layer of the first display area. In addition, in the manufacturing method of the display device, it is possible to form an intermediate layer having a precise pattern during manufacturing of the display panel, and by forming a section in which the thickness of the intermediate layer is variable, the intermediate layer may be deposited to have an area of an intermediate layer almost equal to the design value.

Figure 21:
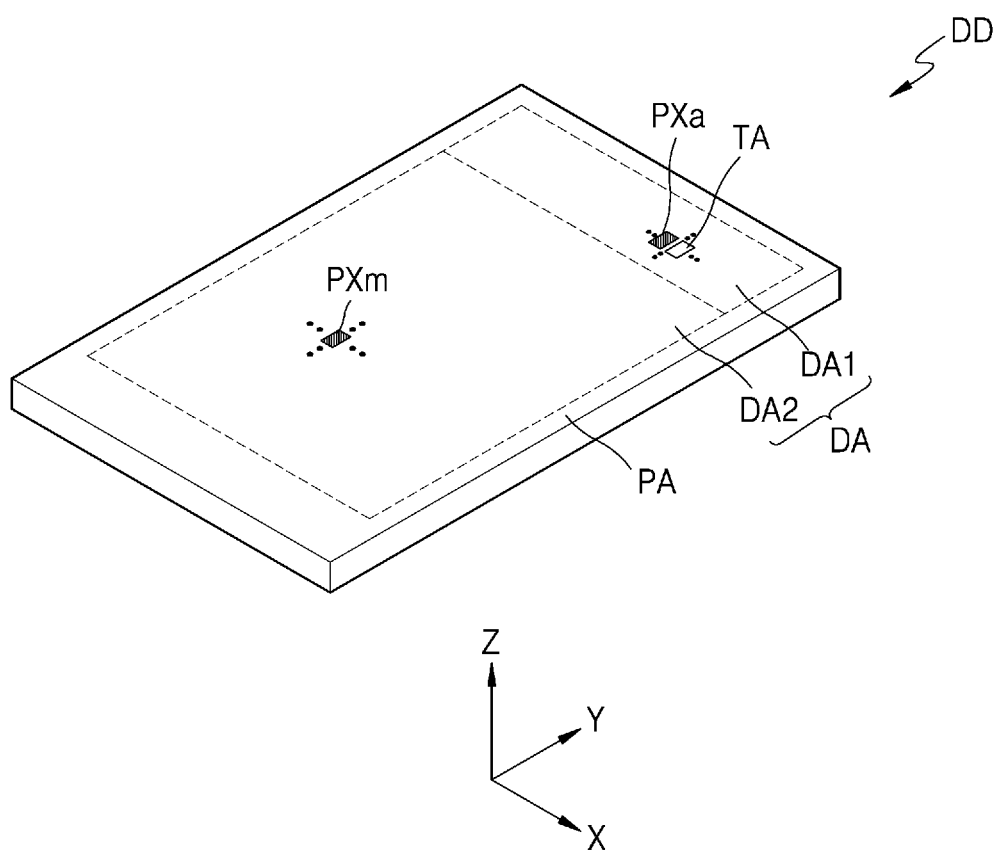
FIG. 21 is a perspective view of a display device, according to some example embodiments.

FIG. 21 is a perspective view illustrating a display device, according to some example embodiments.

Referring to FIG. 21, the display device DD may be similar to that shown in FIG. 1. At this time, the display device DD may include a first display area DA1, a second display area DA2, and a peripheral area PA.

The first display area DA1 may be a constant area of the display device DD, unlike in FIG. 1. At this time, the first display area DA1 may have a shape similar to that of the second display area DA2. For example, the first display area DA1 may be formed long in the X-axis direction. The light transmittance of the first display area DA1 may be higher than that of the second display area DA2, and the resolution of the first display area DA1 may be lower than that of the second display area DA2. An auxiliary pixel PXa may be arranged in the first display area DA1 as described above, and a main pixel PXm may be arranged in the second display area DA2. In addition, the first display area DA1 may include a transmission area TA in which no auxiliary pixels PXa are arranged.

Components may be arranged in various positions in the first display area DA1 as described above. At this time, at least one component may be arranged in the first display area DA1.

The auxiliary pixel PXa and the transmission area TA may be arranged in the first display area DA1 as described above. At this time, at least one auxiliary pixel PXa may be provided to form one pixel area, and the pixel area may be arranged to be spaced apart from each other in the first display area DA1. In this case, the transmission area TA may be arranged between pixel areas spaced apart from each other. For example, the pixel areas may be arranged in a lattice form, and the transmission area TA may be arranged between the pixel areas.

The second display area DA2 may not have a separate transparent area, unlike in the first display area DA1. At this time, a plurality of main pixels PXm may be arranged in the second display area DA2.

In the display device according to the embodiments of the present disclosure, it is possible to implement a precise image.

In the mask assembly, the apparatus for manufacturing the display device, and the method for manufacturing the display device according to the embodiments of the present disclosure, a deposition material may be deposited in a precise pattern on a substrate.

In addition, in the mask assembly, the apparatus for manufacturing the display device, and the method for manufacturing the display device according to the embodiments of the present disclosure, it is possible to manufacture a display device including display areas having different resolutions.

In the method of manufacturing the mask assembly according to embodiments of the present disclosure, it is possible to form pattern holes having different sizes and shapes on one mask sheet.

The method of manufacturing the mask assembly according to the embodiments of the present disclosure, deformation of the mask sheet may be reduced even when pattern holes having different sizes and shapes are formed on one mask sheet, and the shape of each pattern hole may be precisely manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
   a substrate comprising a first display area and a second display area, the first display area comprising a transparent area and the second display area being arranged to surround at least a portion of the first display area;
   a first pixel in the first display area and comprising a first pixel electrode, a first intermediate layer, and a first opposite electrode; and
   a second pixel in the second display area and comprising a second pixel electrode, a second intermediate layer, and a second opposite electrode,
   wherein the first intermediate layer comprises a first section having a portion where a thickness is constant and a second section where a thickness is variable, and
   the second intermediate layer comprises a first section having a portion where a thickness is constant and a second section where a thickness is variable,
   and a first length of one of the second section of the first intermediate layer where the thickness of the first intermediate layer is variable or the second section of the second intermediate layer where the thickness of the second intermediate layer is variable is different from a second length of the other of the second section of the first intermediate layer where the thickness of the first intermediate layer is variable or the second section where the thickness of the second intermediate layer is variable.

2. The display device of claim 1, wherein one of the first length or the second length is less than the other one of the first length or the second length.

3. The display device of claim 1, wherein a resolution of an image provided by the first display area is different from a resolution of an image provided by the second display area.

4. The display device of claim 1, further comprising a component on one surface of the substrate to correspond to the first display area and comprising an electronic element that emits or receives light.

5. The display device of claim 1, wherein a light transmittance of the first display area is different from a light transmittance of the second display area.

6. The display device of claim 1, wherein a size of a plane shape of the first intermediate layer is greater than or equal to a size of a plane shape of the second intermediate layer.

7. A method of manufacturing a display device, the method comprising:
    forming a first intermediate layer on a first display area of a display substrate; and
    forming a second intermediate layer on a second display area of the display substrate,
    wherein the first intermediate layer comprises a first section having a portion where a thickness is constant and a second section where a thickness is variable, and
    the second intermediate layer comprises a first section having a portion where a thickness is constant and a second section where a thickness is variable, and
    a first length of one of the second section of the first intermediate layer where the thickness of the first intermediate layer is variable or the second section of the second intermediate layer where the thickness of the second intermediate layer is variable is different from a second length of the other of the second section of the first intermediate layer where the thickness of the first intermediate layer is variable or the second section where the thickness of the second intermediate layer is variable.

8. The method of claim 7, wherein one of the first length or the second length is less than the other one of the first length or the second length.

9. The method of claim 7, wherein a resolution of an image provided by the first display area is different from a resolution of an image provided by the second display area.

10. The method of claim 7, further comprising placing a component on one surface of the display substrate to correspond to the first display area and comprising an electronic element that emits or receives light.

11. The method of claim 7, wherein a light transmittance of the first display area is different from a light transmittance of the second display area.

12. The method of claim 7, wherein a size of a plane shape of the first intermediate layer is greater than or equal to a size of a plane shape of the second intermediate layer.

13. The method of claim 12, wherein the thickness of the portion of the first section of the first intermediate layer and the thickness of the portion of the first section of the second intermediate layer are equal to each other.

* * * * *